(12) United States Patent
Sugioka et al.

(10) Patent No.: US 8,637,376 B2
(45) Date of Patent: Jan. 28, 2014

(54) METHOD OF MANUFACTURING SEMICONDUCTOR DEVICE

(76) Inventors: Shigeru Sugioka, Chuo-ku (JP);
Nobuyuki Sako, Chuo-ku (JP); Ryoichi Tanabe, Chou-ku (JP)

( * ) Notice: Subject to any disclaimer, the term of this patent is extended or adjusted under 35 U.S.C. 154(b) by 0 days.

(21) Appl. No.: 13/284,080

(22) Filed: Oct. 28, 2011

(65) Prior Publication Data
US 2013/0052784 A1 Feb. 28, 2013

(30) Foreign Application Priority Data
Aug. 29, 2011 (JP) ................. 2011-186373

(51) Int. Cl.
*H01L 21/20* (2006.01)
(52) U.S. Cl.
USPC ............. 438/381; 257/E21.646; 257/68
(58) Field of Classification Search
USPC ............................... 438/381
See application file for complete search history.

(56) References Cited

U.S. PATENT DOCUMENTS

2003/0211742 A1* 11/2003 Kubo et al. ............... 438/691
2006/0284232 A1 12/2006 Hong et al.

FOREIGN PATENT DOCUMENTS

JP 2011-108927 A 6/2011

* cited by examiner

*Primary Examiner* — Tony Tran
(74) *Attorney, Agent, or Firm* — Sughrue Mion, PLLC

(57) ABSTRACT

To reduce dent defects formed in interlayer CMP process on a capacitor array after forming an interlayer insulating film on the capacitor array thicker than the height of a capacitor, the interlayer insulating film on the capacitor array is subjected to a step height reduction etching to form an opening with etching depth $H_d$, while remaining a first region that is a distance Lr in a horizontal direction from a rising point of a projected portion of the interlayer insulating film periphery to the capacitor array onto a part of the capacitor array, wherein an aspect ratio ($H_d$/Lr) of the $H_d$ to the Lr is equal to or less than 0.6.

17 Claims, 47 Drawing Sheets

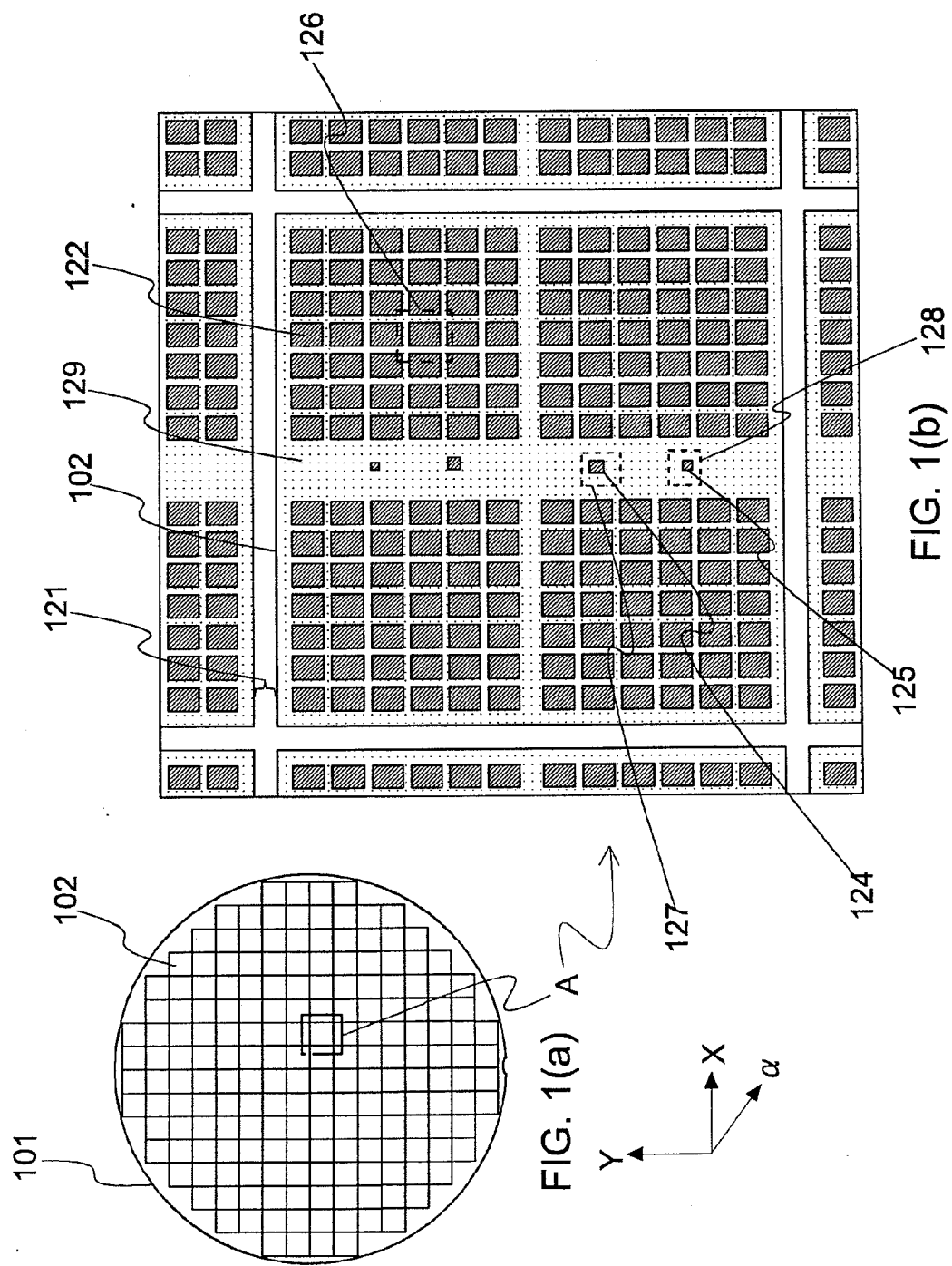

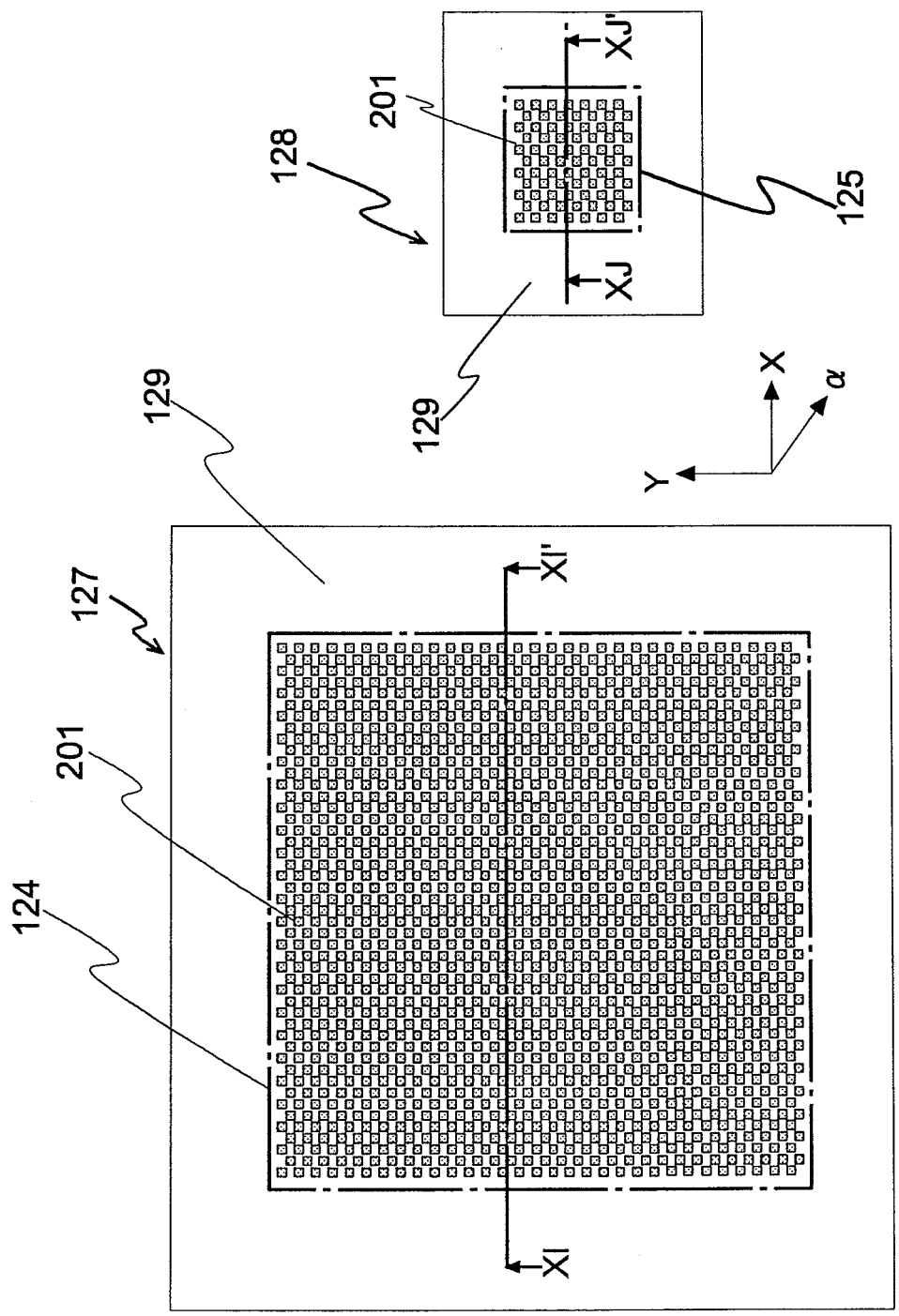

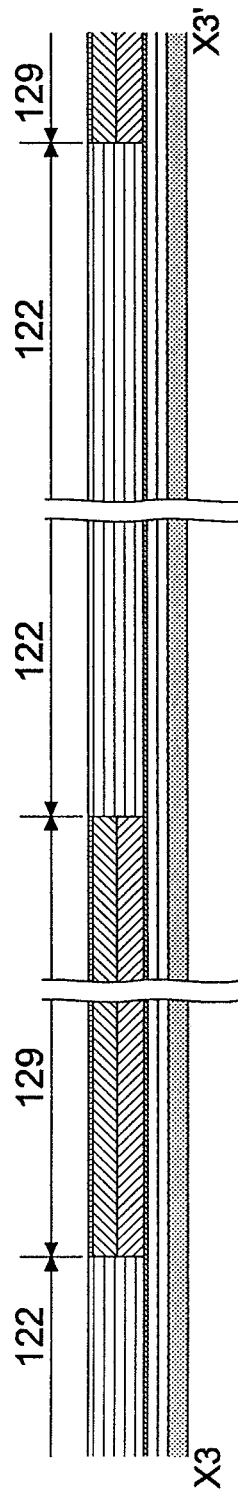
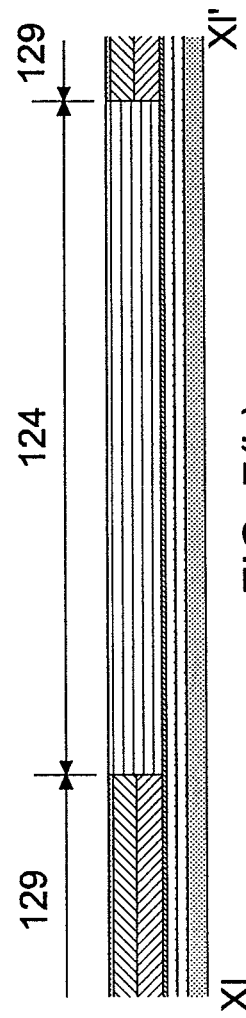
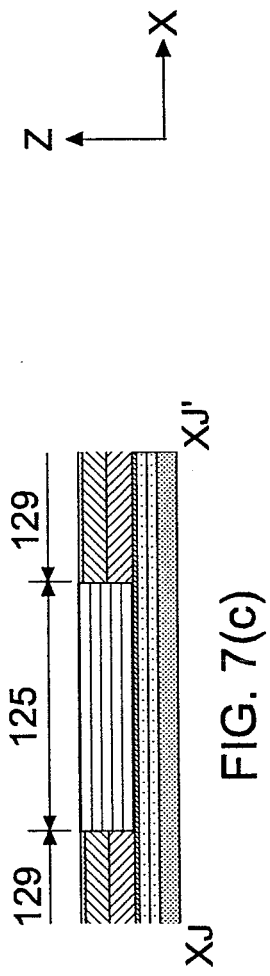
FIG. 7(a)
FIG. 7(b)
FIG. 7(c)

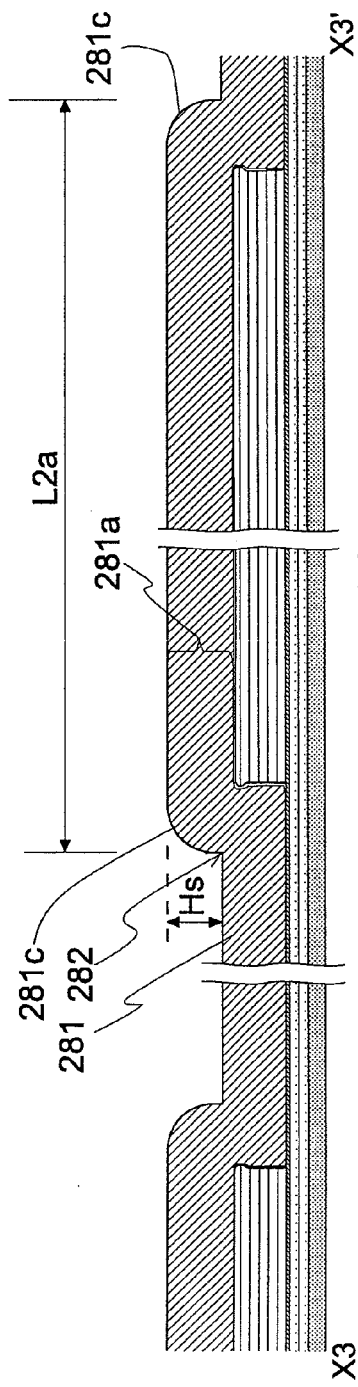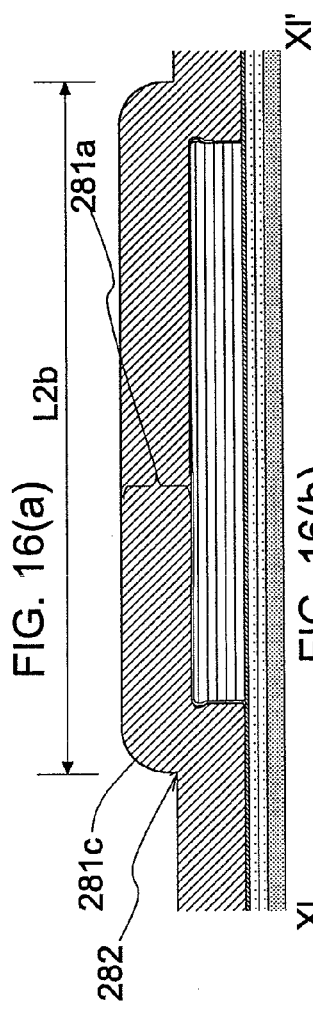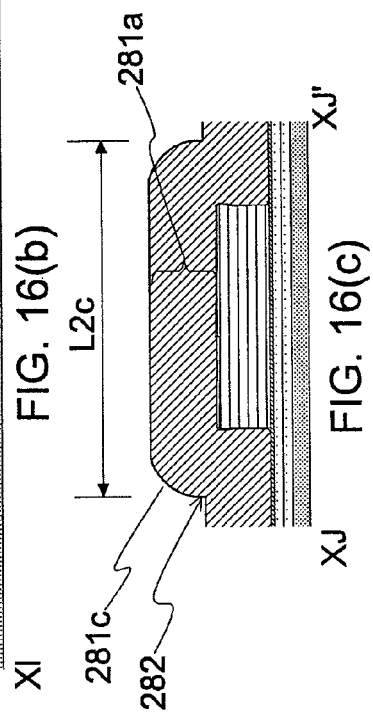

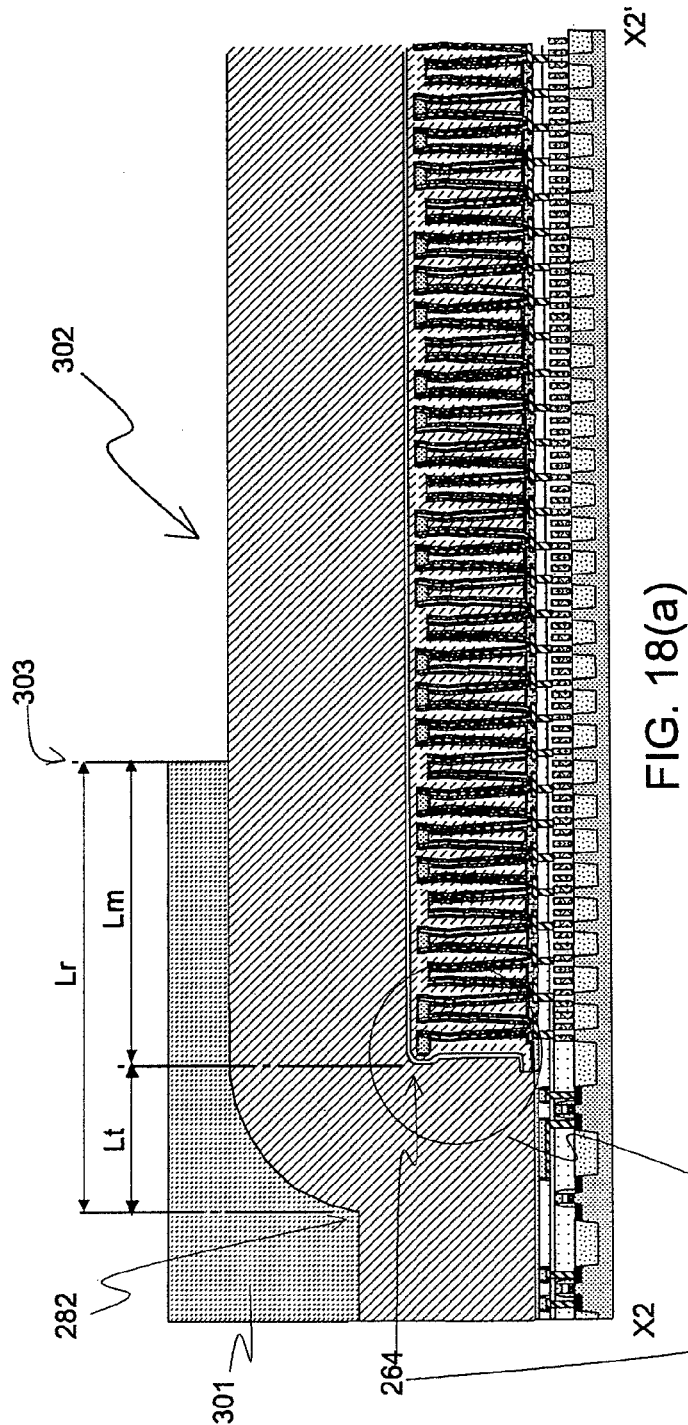
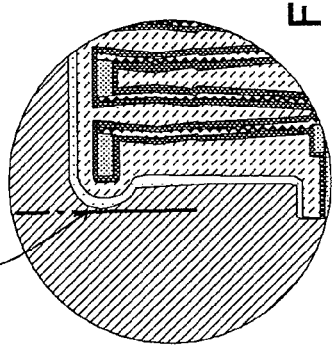
FIG. 18(a)
FIG. 18(b)

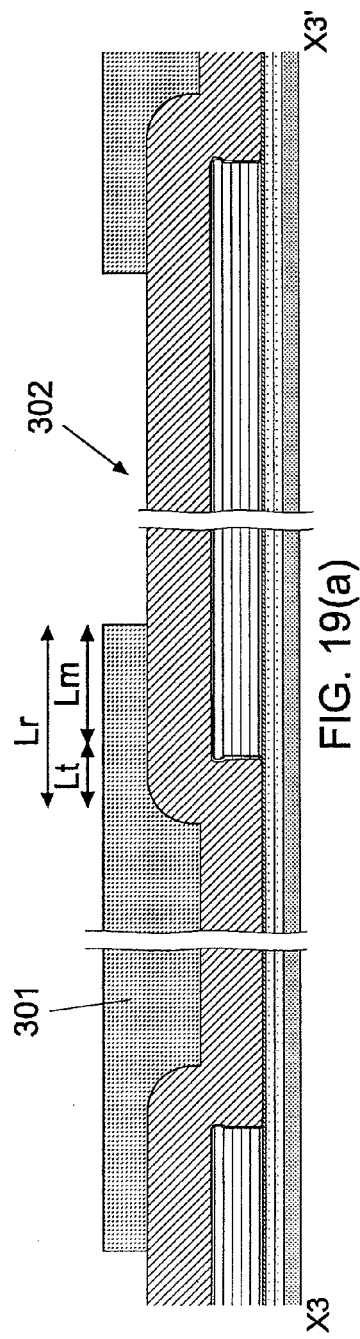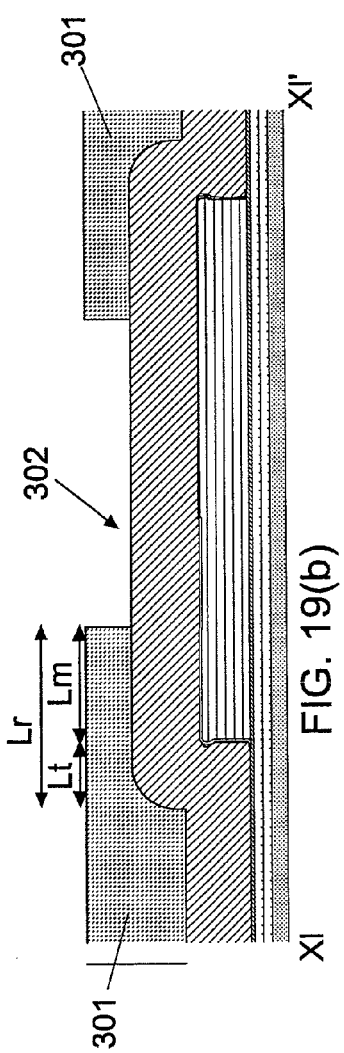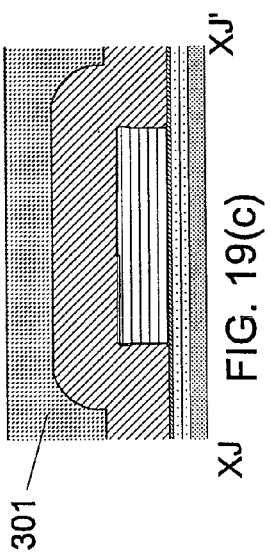
FIG. 19(a)
FIG. 19(b)
FIG. 19(c)

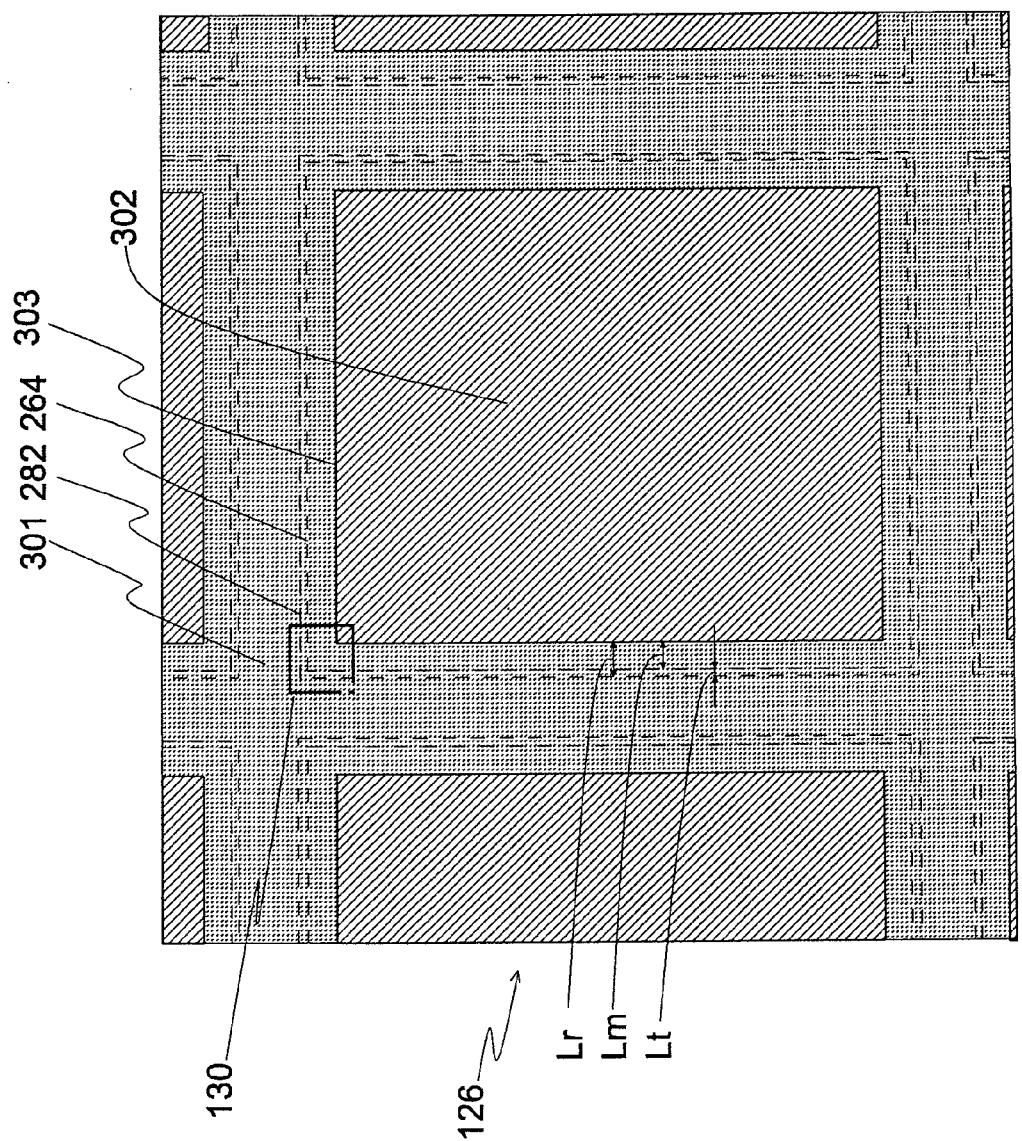

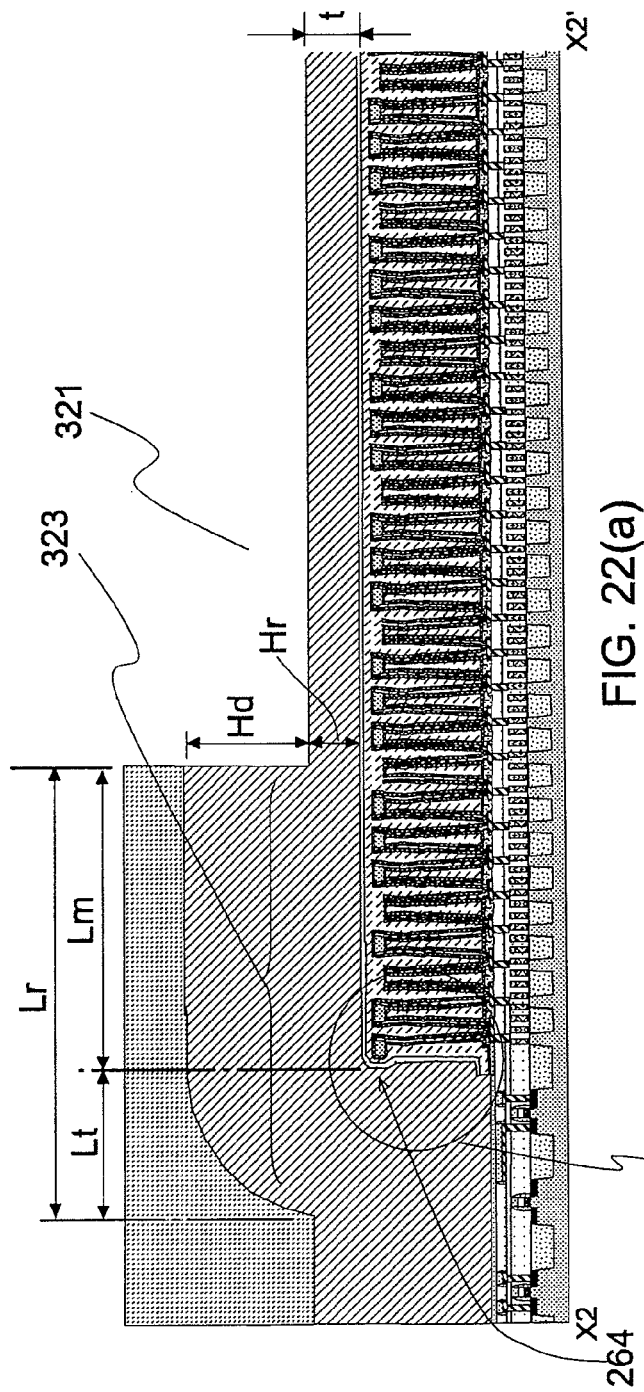
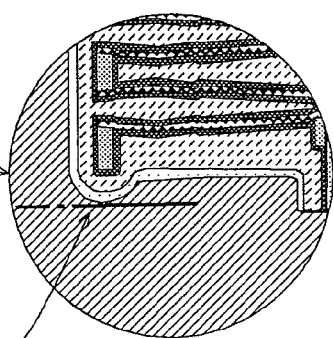
FIG. 22(a)
FIG. 22(b)

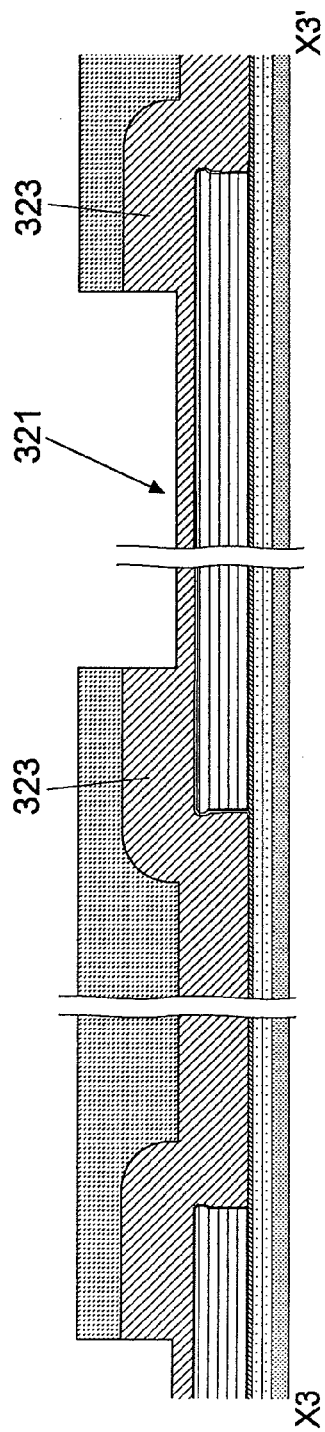
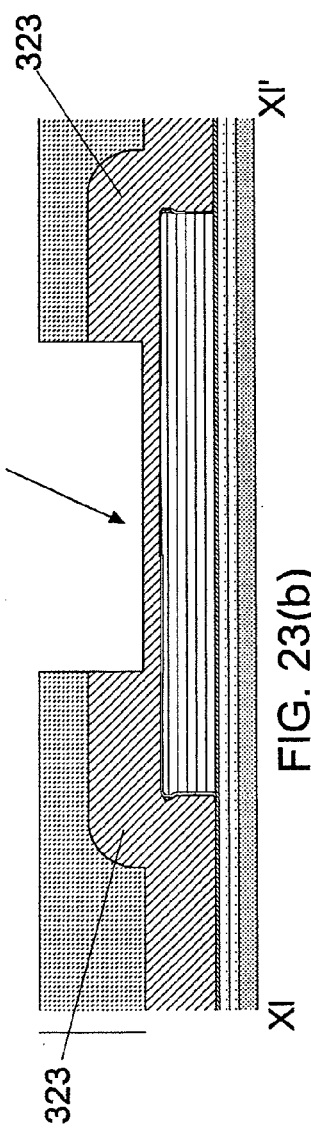
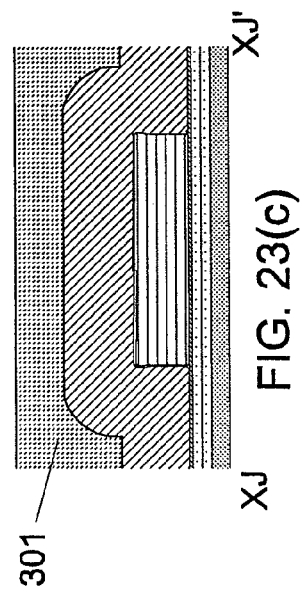
FIG. 23(a)
FIG. 23(b)
FIG. 23(c)

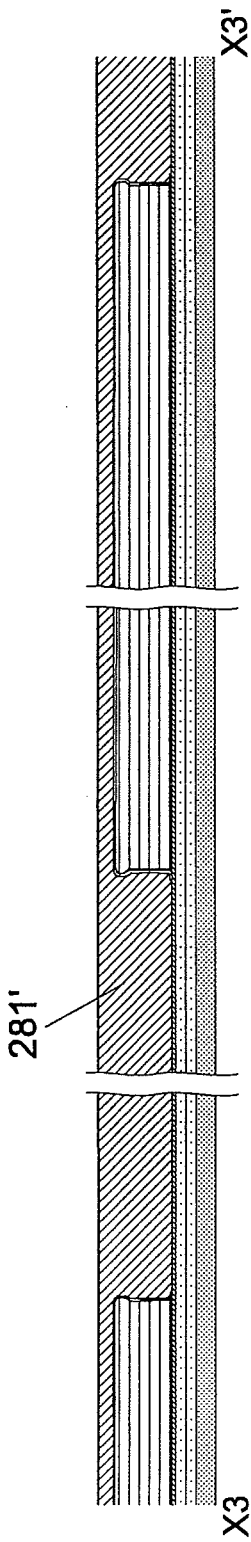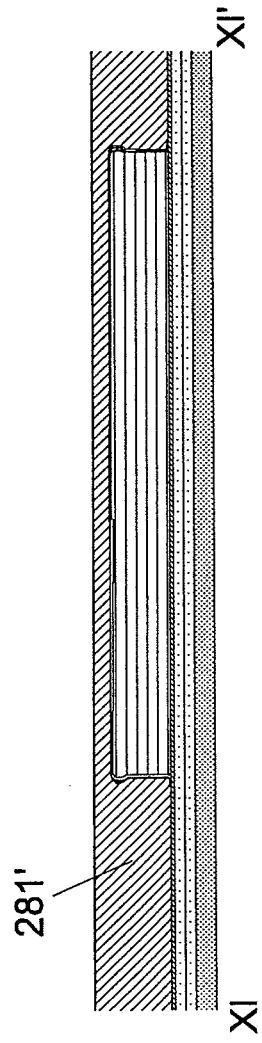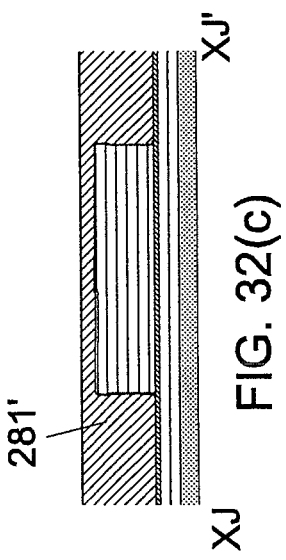

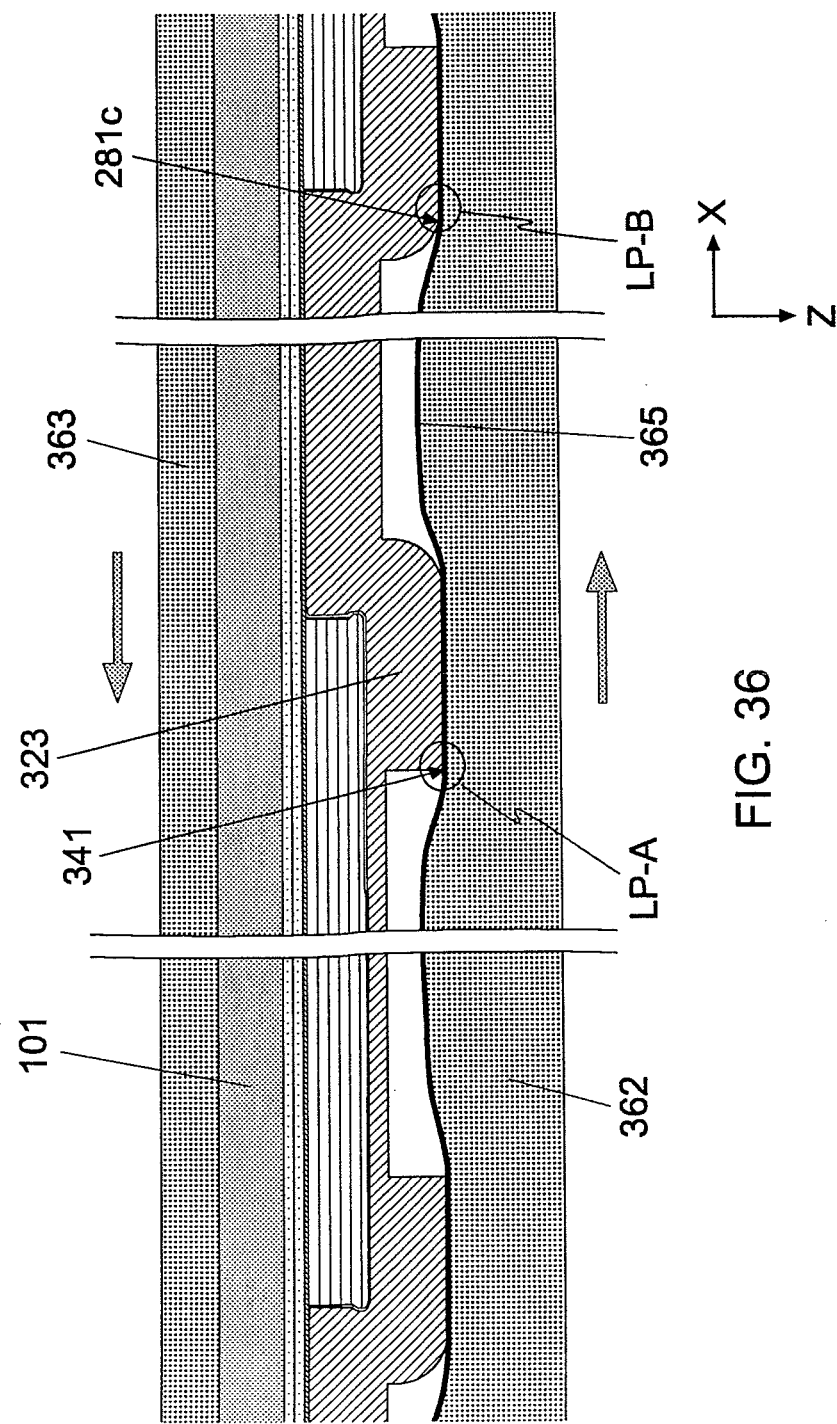

METHOD OF MANUFACTURING SEMICONDUCTOR DEVICE

BACKGROUND OF THE INVENTION

1. Field of the Invention

The present invention relates to a method of manufacturing a semiconductor device, and more particularly to the flattening of an interlayer insulating film that covers a capacitor in a DRAM.

2. Description of the Related Art

With the miniaturization of a DRAM (Dynamic Random Access Memory), sizes of all components become smaller. Even capacitors, which are important components of the DRAM, are no exception, and although the exclusive area of the DRAM tends to be reduced, the DRAM requires constant capacitance values in order to ensure the operation of a DRAM circuit. In order to earn the capacitance values, high-aspect-ratio capacitors having an increasing capacitor height, and particularly, crown type capacitors that use both outer and inner walls of cup-shaped capacitor lower electrodes have been used.

Since such high-aspect-ratio capacitors exist in a memory cell region on which storage cells are formed in the DRAM, the memory cell region has a height that is higher than that of a peripheral circuit region. Further, even in the peripheral circuit region, capacitors having the same shape as the capacitors formed in the memory cell region may be installed for the purpose of compensation capacitance and the like. An interlayer insulating film on a region on which capacitors are formed and on a region on which capacitors are not formed is formed to be higher than the capacitor, and is flattened by chemical mechanical polishing (CMP) for improvement of workability of wirings and the like thereon (JP2011-108927 A). In order to prevent the non-uniformity of flattening and to reduce a CMP load, the interlayer insulating film on a part of the capacitor is removed in advance by etching, and flattening is performed by the CMP (US2006/0284232 A).

US2006/0284232A discloses that a dummy pattern is put on the peripheral circuit region, and the interlayer insulating film on a region on which capacitors are formed is removed in part before the flattening. It has been revealed by a study by the present inventors that the interlayer insulating film on the region that remains through the etching causes the occurrence of cracks at the boundary between the region on which the capacitors are formed and the region on which the capacitors are not formed, and peels off through the CMP to cause a dent in part. A wiring material to be formed thereafter remains in the dent to cause a short-circuit problem.

SUMMARY

According to the present invention, a region on which a capacitor is formed (hereinafter referred to as a "capacitor region") and a region on which a capacitor is not formed (hereinafter referred to as a "non-capacitor region") are covered with an interlayer insulating film with a thickness that is higher than the height of the capacitor, and in order to flatten the interlayer insulating film that is formed between the capacitor region and the non-capacitor region through removing of the step height of the interlayer insulating film, the interlayer insulating film on the capacitor region is removed except for a first region that leaves an insulating film with a predetermined width and shape from a rising portion to an upper side of the capacitor region on the non-capacitor region. By leaving the first region with the predetermined width and shape as described above, it has been found that this portion peels off through flattening by the next CMP and thus the occurrence of dent defects can be suppressed.

According to one embodiment of the present invention, there is provided a method of manufacturing a semiconductor device comprising a capacitor region on which at least a capacitor is formed and a non-capacitor region on which no capacitor is formed on one plane, wherein the method comprises:

prescribing the capacitor region and the non-capacitor region by forming a capacitor with a predetermined height on a semiconductor substrate of which the surface is substantially flat;

covering the capacitor region and the non-capacitor region with an interlayer insulating film with a thickness that is thicker than the height of the capacitor;

etching the interlayer insulating film on the capacitor region with an etching depth $H_d$, starting from a rising point of a projected portion of the interlayer insulating film of the non-capacitor region onto a part of the capacitor region, while remaining a first region that is a distance Lr in a horizontal direction from the rising point; and removing the interlayer insulating film of at least the first region up to the height of the interlayer insulating film on the non-capacitor region, and flattening the surface of the interlayer insulating film on the capacitor region and the non-capacitor region to the extent that the capacitor is not exposed, and wherein an aspect ratio ($H_d$/Lr) of the $H_d$ to the Lr is equal to or less than 0.6.

According to another embodiment of the present invention, there is provided a method of manufacturing a semiconductor device comprising a first region and a second region, wherein the method comprises:

forming a first structure on a first region;

covering the first region and the second region with an interlayer insulating film, a thickness of the interlayer insulating film being thicker than a height of the first structure;

etching the interlayer insulating film on the first region with an etching depth $H_d$ such that the insulating film on a third region is remained, the third region being defined from a rising point of a projected portion of the interlayer insulating film of the second region to an etching edge of the first region, a length of the third region in a horizontal direction being Lr; and removing the interlayer insulating film of at least the third region up to the height of the interlayer insulating film, and flattening the surface of the interlayer insulating film on the first region and the second region to the extent that the first structure is not exposed, wherein an aspect ratio ($H_d$/Lr) of the $H_d$ to the Lr is equal to or less than 0.6

By etching the insulating film on the capacitor region so that the first region remains with the predetermined width and shape from the rising portion of the projected portion to a portion on the capacitor region and then performing flattening by CMP or the like, the occurrence of defect that is formed due to the peeling off of the insulating film that remains in the first region during the CMP.

BRIEF DESCRIPTION OF THE DRAWINGS

The above features and advantages of the present invention will be more apparent from the following description of certain preferred embodiments taken in conjunction with the accompanying drawings, in which:

FIG. 1(a) is a top view of a semiconductor wafer; FIG. 1(b) is an enlarged view of a region A that includes a semiconductor chip; FIG. 1(e) is an enlarged view of a region C that includes a first peripheral capacitor region 124; and FIG. 1(f) is an enlarged view of a region D that includes a second peripheral capacitor region 125.

FIG. 3 is a view illustrating a first process of Example 1, in which

FIG. 7 is a view illustrating the fourth process of Example 1, in which FIG. 7(a) is a cross-sectional view taken along a line X3-X3' of FIG. 1(c), FIG. 7(b) is a cross-sectional view taken along a line XI-XI' of FIG. 1(e), and FIG. 7(c) is a cross-sectional view taken along a line XJ-XJ' of FIG. 1(f).

FIG. 14 is a view illustrating the seventh process of Example 1, in which FIG. 14(a) is a cross-sectional view taken along a line X3-X3' of FIG. 1(c), FIG. 14(b) is a cross-sectional view taken along a line XI-XI' of FIG. 1(e), and FIG. 14(c) is a cross-sectional view taken along a line XJ-XJ' of FIG. 1(f).

FIG. 16 is a view illustrating the eighth process of Example 1, in which FIG. 16(a) is a cross-sectional view taken along a line X3-X3' of FIG. 1(c), FIG. 16(b) is a cross-sectional view taken along a line XI-XI' of FIG. 1(e), and FIG. 16(c) is a cross-sectional view taken along a line XJ-XJ' of FIG. 1(f).

FIGS. 18(a) and 18(b) are views illustrating a ninth process of Example 1, in which FIG. 18(a) is a cross-sectional view taken along a line X2-X2' of FIG. 1(c) and FIG. 18(b) is a partial enlarged view thereof.

FIG. 19 is a view illustrating the ninth process of Example 1, in which FIG. 19(a) is a cross-sectional view taken along a line X3-X3' of FIG. 1(c), FIG. 19(b) is a cross-sectional view taken along a line XI-XI' of FIG. 1(e), and FIG. 19(c) is a cross-sectional view taken along a line XJ-XJ' of FIG. 1(f).

FIG. 20 is a plan view of a region B in the ninth process of Example 1.

FIGS. 22(a) and 22(b) are views illustrating a tenth process of Example 1, in which FIG. 22(a) is a cross-sectional view taken along a line X2-X2' of FIG. 1(c) and FIG. 22(b) is a partial enlarged view thereof.

FIG. 23 is a view illustrating the tenth process of Example 1, in which FIG. 23(a) is a cross-sectional view taken along a line X3-X3' of FIG. 1(c), FIG. 23(b) is a cross-sectional view taken along a line XI-XI' of FIG. 1(e), and FIG. 23(c) is a cross-sectional view taken along a line XJ-XJ' of FIG. 1(f).

FIG. 25 is a view illustrating the eleventh process of Example 1, in which

FIG. 32(a) is a cross-section view taken along a line X3-X3' of FIG. 1(c) after the twelfth process of Example 1. FIG. 32(b) is a cross-sectional view taken along a line XI-XI' of FIG. 1(e), and FIG. 32(c) is a cross-sectional view taken along a line XJ-XJ' of FIG. 1(f).

FIGS. 34(a) and 34(b) are views illustrating the thirteenth process of Example 1, in which FIG. 34(a) is a cross-sectional view taken along a line A1-A1' and FIG. 34(b) is a cross-sectional view taken along a line A2-A2' of FIG. 1(c).

FIG. 36 is a schematic view illustrating a contact state of a polishing pad and a semiconductor wafer in the twelfth process of the method of manufacturing a semiconductor device according to an embodiment of the present invention.

DETAILED DESCRIPTION OF THE REFERRED EMBODIMENTS

Figure 1C:
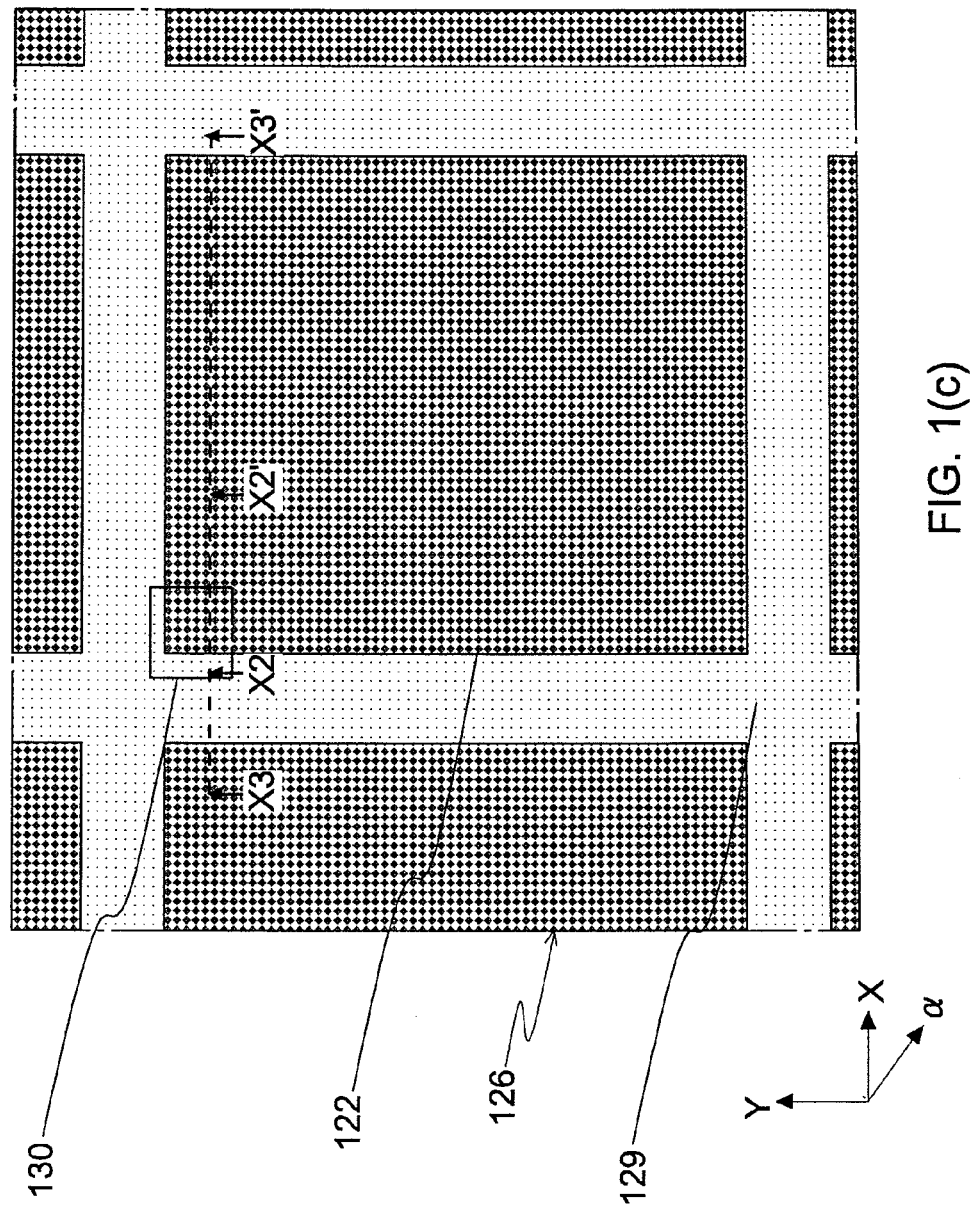
FIG. 1(c) is an enlarged view of a region B in which a memory cell region is formed.

The invention will be now described herein with reference to illustrative embodiments. Those skilled in the art will recognize that many alternative embodiments can be accomplished using the teachings of the present invention and that the invention is not limited to the embodiments illustrated for explanatory purpose.

EXAMPLE 1

FIGS. 1(*a*) to 1(*f*) are top views in a capacitor lower electrode forming step according to this example. In the drawings, it is defined that a left/right direction is an X-axis direction, and an upward/downward direction is a Y-axis direction. An α direction that is inclined to the X-axis and Y-axis is defined. The α direction corresponds to a direction in which an active region of a memory cell is extended. On the front side of the vertical space of the top views, a Z-axis is taken.

FIG. 1(*a*) is a top view of a semiconductor wafer 101. Plural semiconductor chips 102 are formed on the semiconductor wafer 101.

FIG. 1(*b*) is an enlarged view of a region A shown in FIG. 1(*a*) that includes a semiconductor chip 102. Between neighboring semiconductor chips 102 that are arranged in parallel in the X direction and the Y direction, a scribe line 121 is formed.

On the semiconductor chip 102, memory cells of a DRAM are formed. A memory cell includes a capacitor that stores information, and a cell transistor for selecting the capacitor. The memory cells are arranged at high density to form an array. The memory cells function as main storage elements of the DRAM, and capacitors formed in an array shape are called memory capacitors. A region in which the memory capacitors are formed is called a memory cell region 122. A region of the semiconductor chip 102 except for the memory cell region 122 is called a peripheral circuit region 123.

In the memory cell region 122, a word line extending in the Y direction and a bit line extending in the X direction are formed. Plural word lines are installed in the X direction, and plural bit lines are installed in the Y direction. At intersection points of the word lines and the bit lines, respective memory cells are arranged.

FIG. 1(*c*) is an enlarged view of a region B (126) shown in FIG. 1(*b*) in which a memory cell region 122 is formed. In the peripheral circuit region 123 between the neighboring memory cell regions 122, a peripheral circuit for driving a memory cell is formed.

FIG. 1(*d*) is an enlarged view of a region E (130) shown in FIG. 1(*c*) that includes one corner of the memory cell region 122 and a region 129 in which no capacitor is formed as the neighboring peripheral circuit region 123. One surface thereof is covered with a capacitor support film, and in the memory cell region 122, capacitor lower electrodes are arranged at high density.

The capacitor, which is formed as a memory capacitor, can also be formed in the peripheral circuit region 123 as a capacitor having compensation capacitance or an electric fuse. In this example, the compensation capacitance is formed in the region C (127) and the region D (128). Further, as for the capacitor having the compensation capacitance, plural capacitors are connected in series or in parallel to function as one large capacitive element. Accordingly, unlike the capacitors in the memory cell region, plural capacitor lower electrodes are connected to one or plural pads, and are connected in parallel through upper electrodes or in series through the upper electrodes and the pads.

The compensation capacitance formed in the region C (127) is called a first peripheral capacitor, and an array region that is made by the first peripheral capacitor is called a first peripheral capacitor region 124. The compensation capacitance formed in the region D (128) is called a second peripheral capacitor, and an array region that is made by the second peripheral capacitor is called a second peripheral capacitor region 125.

In the description, a region in which no capacitor is formed is called a non-capacitor region 129.

In the currently developed DRAM, the size of the cell array portion, for example, is the size to the extent that about 500 word lines and about 500 bit lines are formed therein. In this example, the minimum featuring size (F value) of 50 nm is used in the process, and the size of the memory cell region 122, which is in a substantially rectangular shape, is about 50 μm in the X direction and 60 μm in the Y direction.

On the other hand, in this example, the size of the first peripheral capacitor region 124 and the second peripheral capacitor region 125 is small in comparison to the area of the memory cell region 122. The first peripheral capacitor region 124 is formed in a substantially rectangular shape of about 16 μm square, and the second peripheral capacitor region is formed in a substantially rectangular shape of about 6 μm square. Here, the size of the capacitor region is defined in FIG. 14 to be described later, and it is assumed that the size of the capacitor region is defined as a width between both upper end shoulders 264 of the capacitor upper electrode.

Further, the first peripheral capacitor and the second peripheral capacitor are not necessarily formed on the semiconductor chip 102.

Example 1 will be described using cross-sectional views cut along lines X1-X1', A1-A1' and A2-A2' of FIG. 1(*d*), cross-sectional views cut along a lines X3-X3' and X2-X2' of FIG. 1(*c*), a cross-sectional view cut along a line XI -XI' of FIG. 1(*e*), and a cross-sectional view cut along a line XJ-XJ' of FIG. 1(*f*), in addition to the above-described drawings.

(First Process)

Figure 1D:
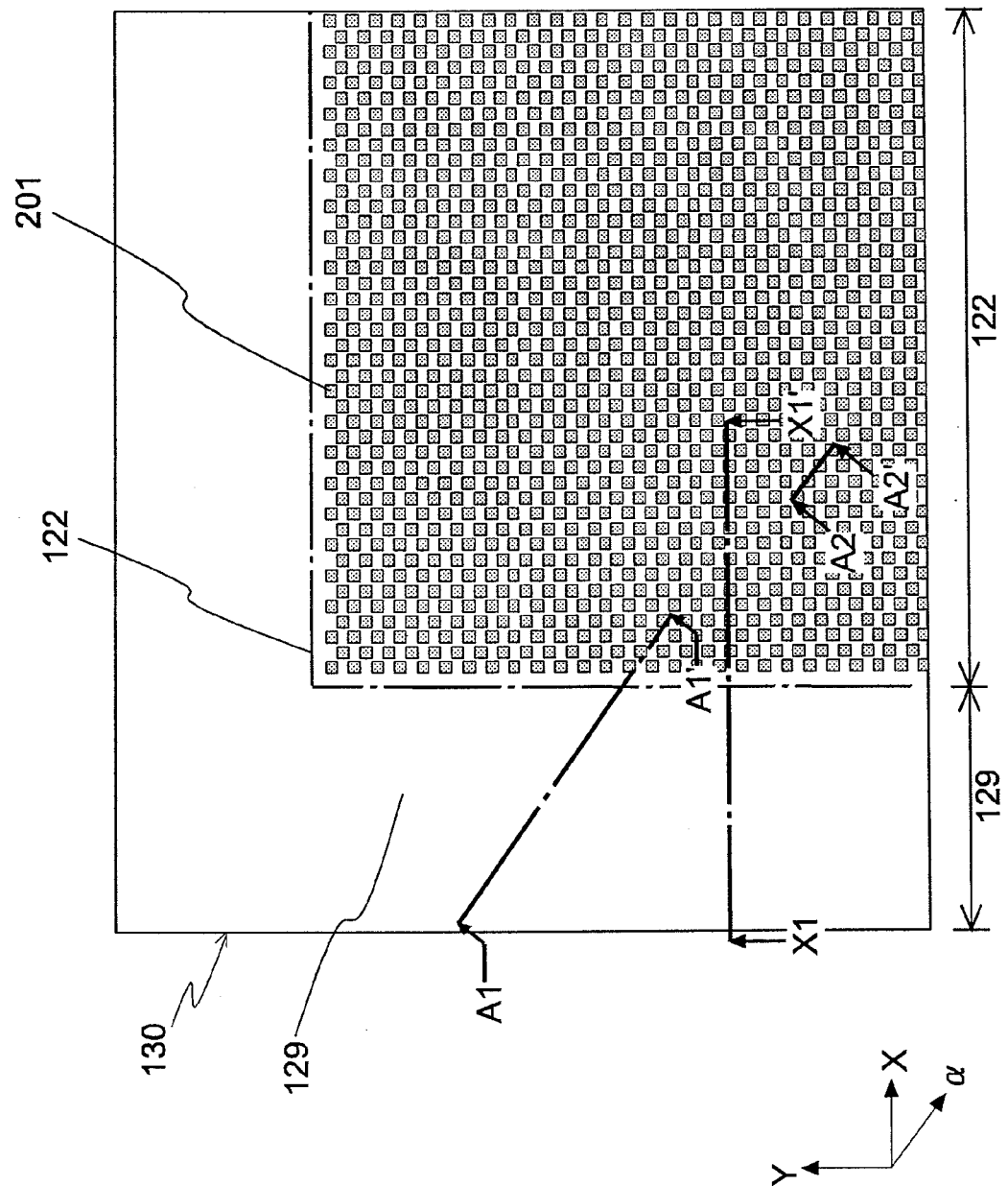
FIG. 1(d) is an enlarged view of a region E that includes one corner of a memory cell region.
Figure 2:
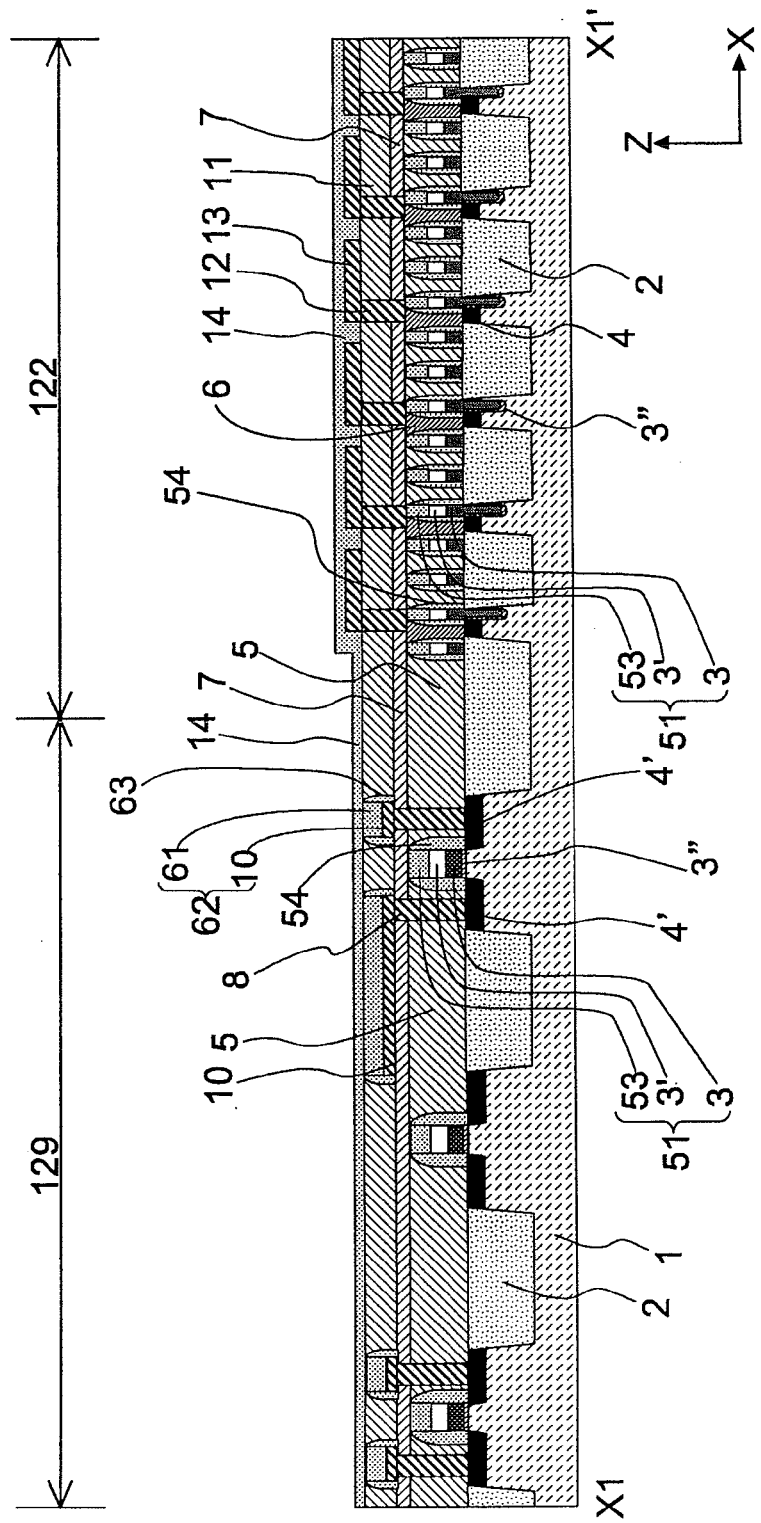
FIG. 2 is a cross-sectional view taken along a line X1-X1' of FIG. 1(d), illustrating a first process of Example 1.
Figures 3A, 3B:
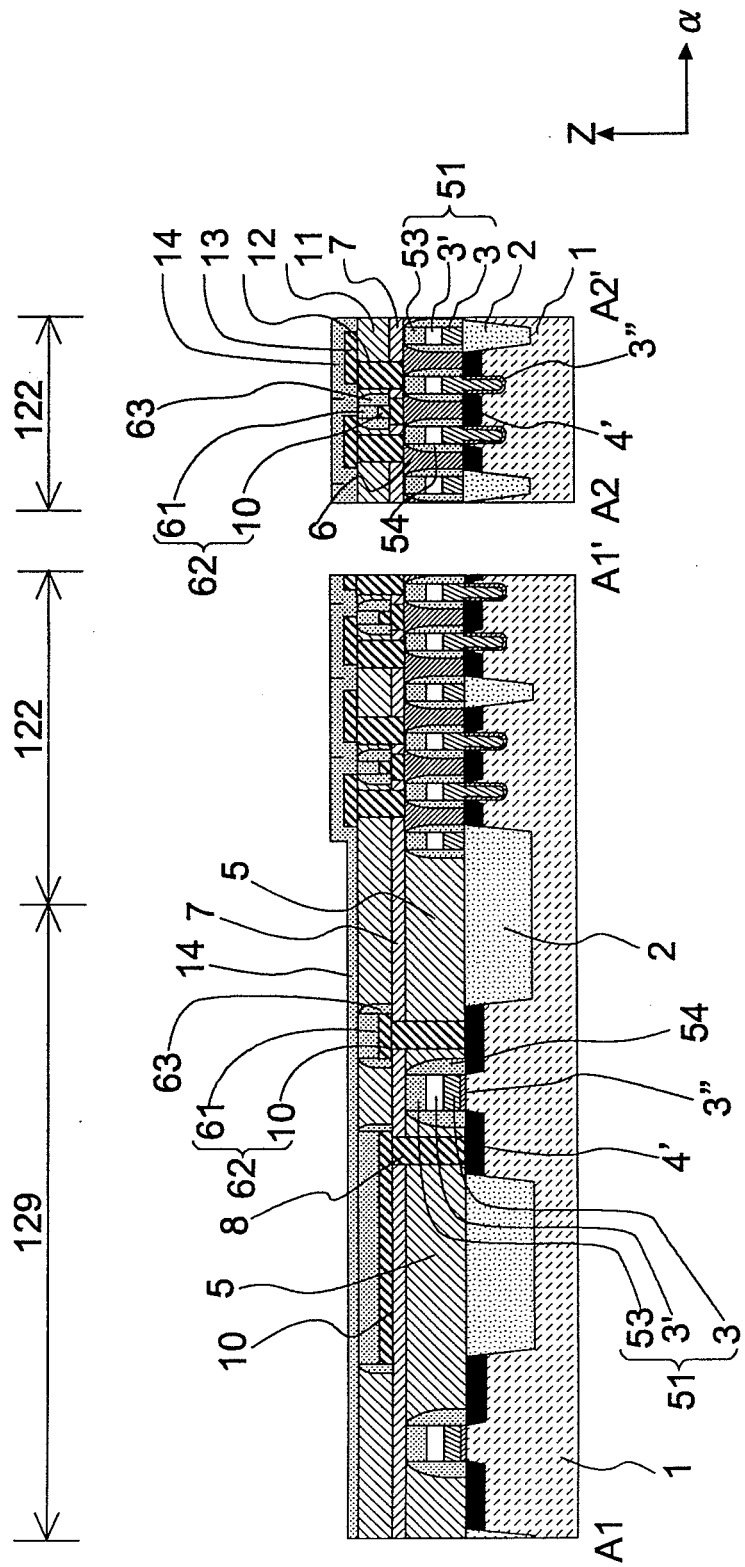
FIG. 3(a) is a cross-sectional view taken along a line A1-A1' and FIG. 3(b) is a cross-sectional view taken along a line A2-A2' of FIG. 1(d).

FIGS. 2 and 3 are cross-sectional views of the semiconductor device according to the present invention in a stage where up to a capacitor stopper film is formed. FIG. 2 is a cross-sectional view taken along a line X1-X1' of FIG. 1(*d*), and FIG. 3 corresponds to cross-sectional views taken along a line A1-A1' and taken along a line A2-A2' of FIG. 1(*d*).

FIG. 2 shows a region from the peripheral circuit region 123 (non-capacitor region 129) to the end portion of the memory cell region 122, and FIG. 3 shows a region (A1-A1') from the non-capacitor region 129 to the end portion of the memory cell region 122 and a region (A2-A2') existing inside the memory cell region 122.

Processes up to these drawings are as follows.

Element isolation 2 is formed on a semiconductor substrate 1. An element forming region is partitioned by the element isolation 2.

A gate insulating film 3", a gate conductive film 3, a gate refractory metal film 3', and a gate cap film 53 are formed in order, and then are patterned to form a gate electrode 51 that is composed of the gate cap film 53, the gate refractory metal film 3', and the gate conductive film 3.

Impurities are introduced into the element forming region with the gate electrode 51 as a mask, a peripheral source/drain diffusion layer 4' is formed on the peripheral circuit region, and a cell source/drain diffusion layer 4 is formed on the memory cell region.

On a side wall of the gate electrode 51, a gate side wall 54 is formed.

A gate interlayer 5 is formed. A cell contact plug 6 that is connected to the cell source/drain diffusion layer 4 is formed through the gate interlayer 5.

On the cell contact plug 6, a bit line contact plug interlayer 7 is formed.

In the bit line contact plug interlayer 7, a bit line contact plug 9 is formed which is connected onto the cell contact plug 6 on the side of connecting to the bit line.

A first peripheral contact plug 8 that is connected to the peripheral source/drain diffusion layer 4' of the peripheral circuit region 123 is formed through the bit line contact plug interlayer 7 and the gate interlayer 5.

By forming and patterning a first wiring film 10 and a first wiring cap film 61, a first wiring 62 that is composed of the first wiring cap film 61 and the first wiring film 10 is formed. The first wiring 62 is connected to the bit line contact plug 9 and the first peripheral contact plug 8. The first wiring 62 that is formed in the memory cell region 122 functions as a bit line.

A first wiring side wall 63 is formed on the first wiring 62.

A bit line interlayer 11 is formed on the first wiring 62.

A capacitor contact plug 12 that is connected to the cell contact plug 6 on the side of connecting to the cell capacitor is formed through the bit line interlayer 11.

A capacitor pad 13 is formed on the capacitor contact plug 12.

On the capacitor pad 13, a capacitor stopper film 14 that operates as a stopper film of capacitor core etching in a sixth process is formed. A material that can take an etching selection ratio may be used, and in this example, a silicon nitride film was used.

(Second Process)

Figure 4:
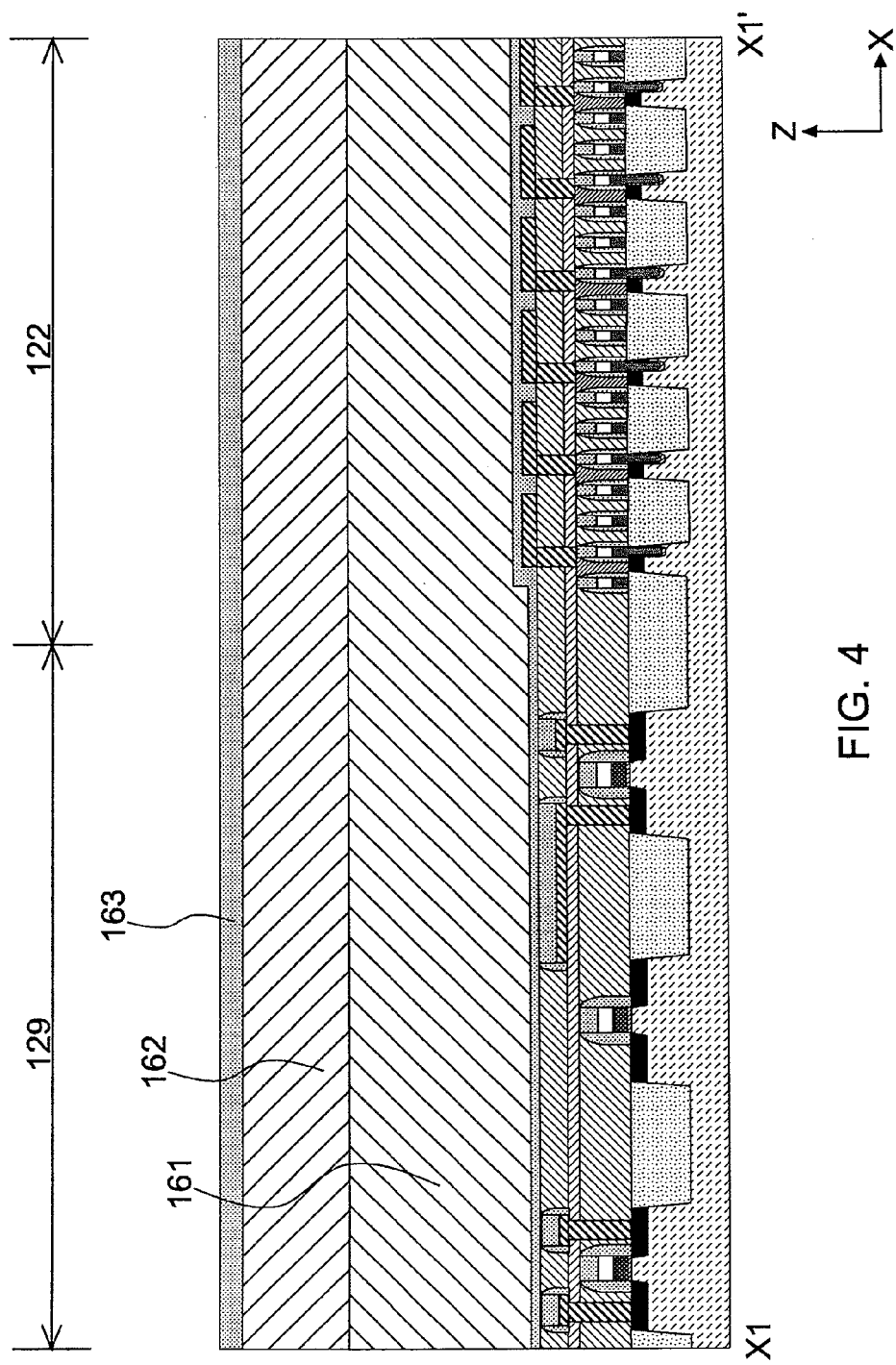
FIG. 4 is a cross-sectional view taken along a line X1-X1' of FIG. 1(d), illustrating a second process of Example 1.

Next, as illustrated in FIG. 4, on the capacitor stopper film 14, a first capacitor core film 161, a second capacitor core film 162, and a capacitor support film 163 are sequentially formed. As materials, a BPSG film was used as the first capacitor core film 161, a silicon oxide film was used as the second capacitor core film 162, and a silicon nitride film was used as the capacitor support film 163. The material of the capacitor support film 163 is not limited to the silicon nitride film, but a material that can take a selection ratio of capacitor core etching can be used as the material of the capacitor support film 163.

The thicknesses of the first and second capacitor core films 161 and 162 were 600 nm, respectively, and the thickness of the capacitor support film 163 was 100 nm. The total thickness of the first and second capacitor core films 162 and 163 and the capacitor support film 163 was set to 1.3 μm. This 1.3 μm approximately corresponds to the height He of the capacitor lower electrode to be formed later. This height was determined to satisfy the capacitance value of the capacitor. In order to satisfy about 20 fF or more of the capacitance of the capacitor that is necessary for reliability, the height was set to have a margin of 0.1 μm based on the fact that about 1.2 μm is required, using a capacitor dielectric film having 1 nm of an equivalent oxide film thickness, in a crown capacitor structure (structure using the inner side and the outer side of the capacitor lower electrode) of the DRAM using a process of F=50 nm.

(Third Process)

Figure 5:
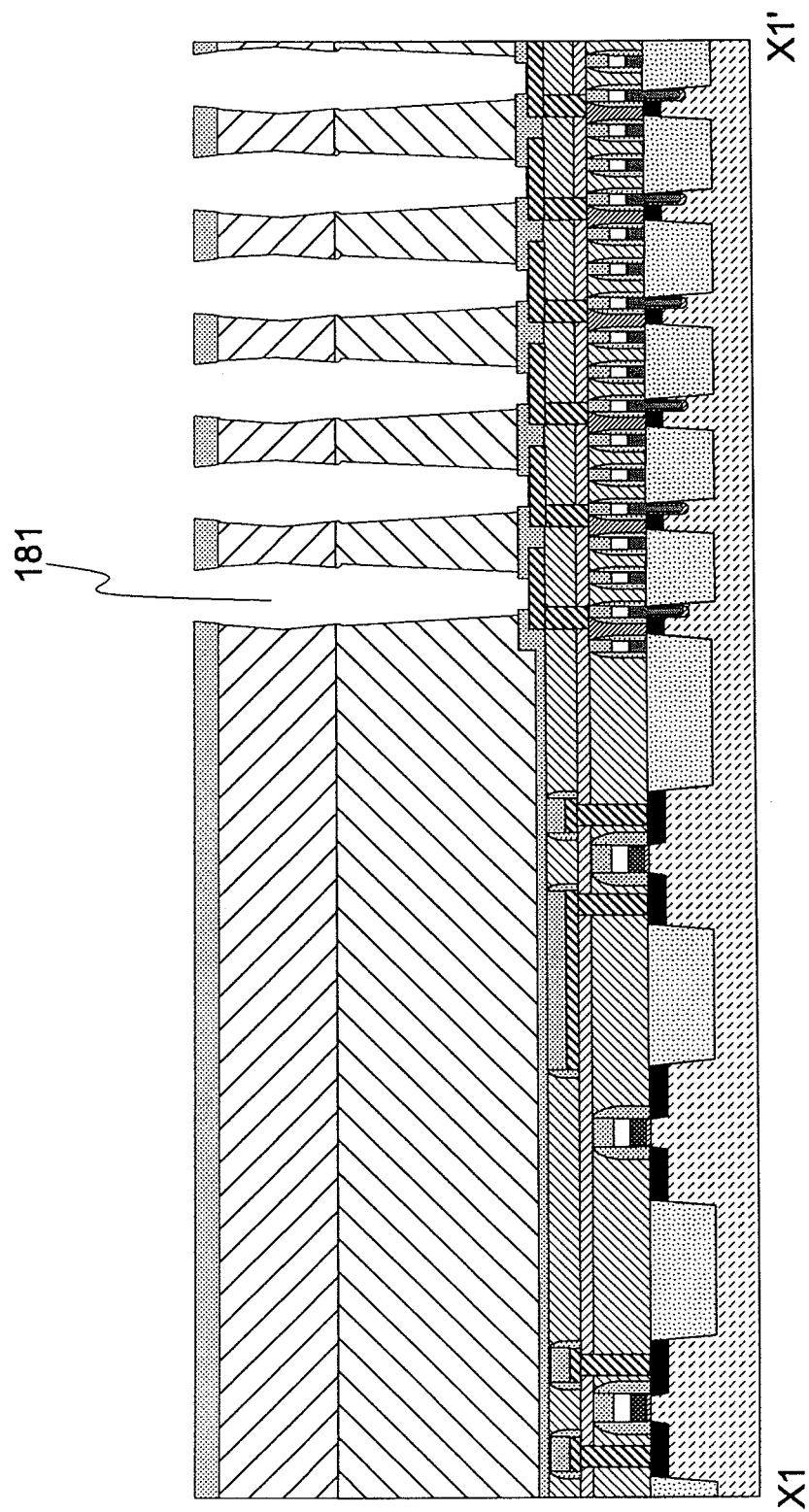
FIG. 5 is a cross-sectional view taken along a line X1-X1' of FIG. 1(d), illustrating a third process of Example 1.

Then, as illustrated in FIG. 5, a capacitor hole 181 for exposing the capacitor pad 13 is formed through the capacitor support film 163, the second capacitor core film 162, the first capacitor core film 161, and the capacitor stopper film 14 using a lithography technology and a dry etching technology. The capacitor hole 181 was formed such that an opening formed on the capacitor support film 163 was in a substantially circular shape and the diameter thereof was about 80 nm. In forming a high-aspect hole used in this example, the etching shape is easily formed in a Boeing shape. If a capacitor hole bottom portion is formed to have a small diameter, the capacitor hole bottom portion is embedded in the lower electrode, and thus the surface area of the inner wall of the lower electrode becomes small to lower the capacitance. In this example, in order to suppress the problem in that the diameter of the capacitor hole bottom portion becomes small, the capacitor hole 181 was opened by dry etching, and then an isotropic etching process was performed on condition that the etching speed of the first capacitor core film 161 (BPSG film) became higher than the etching speed of the second capacitor core film 162 (silicon oxide film) to widen the side wall of the BPSG film forming the lower portion of the capacitor hole 181 of which the diameter was liable to be formed small. As the isotropic etching, a wet etching process using a chemical solution (diluted hydrofluoric acid solution) including HF and $H_2O$ can be used.

This capacitor hole 181 is formed on the memory cell region 122, the first peripheral capacitor region 124, and the second peripheral capacitor region 125.

(Fourth Process)

Figure 6:
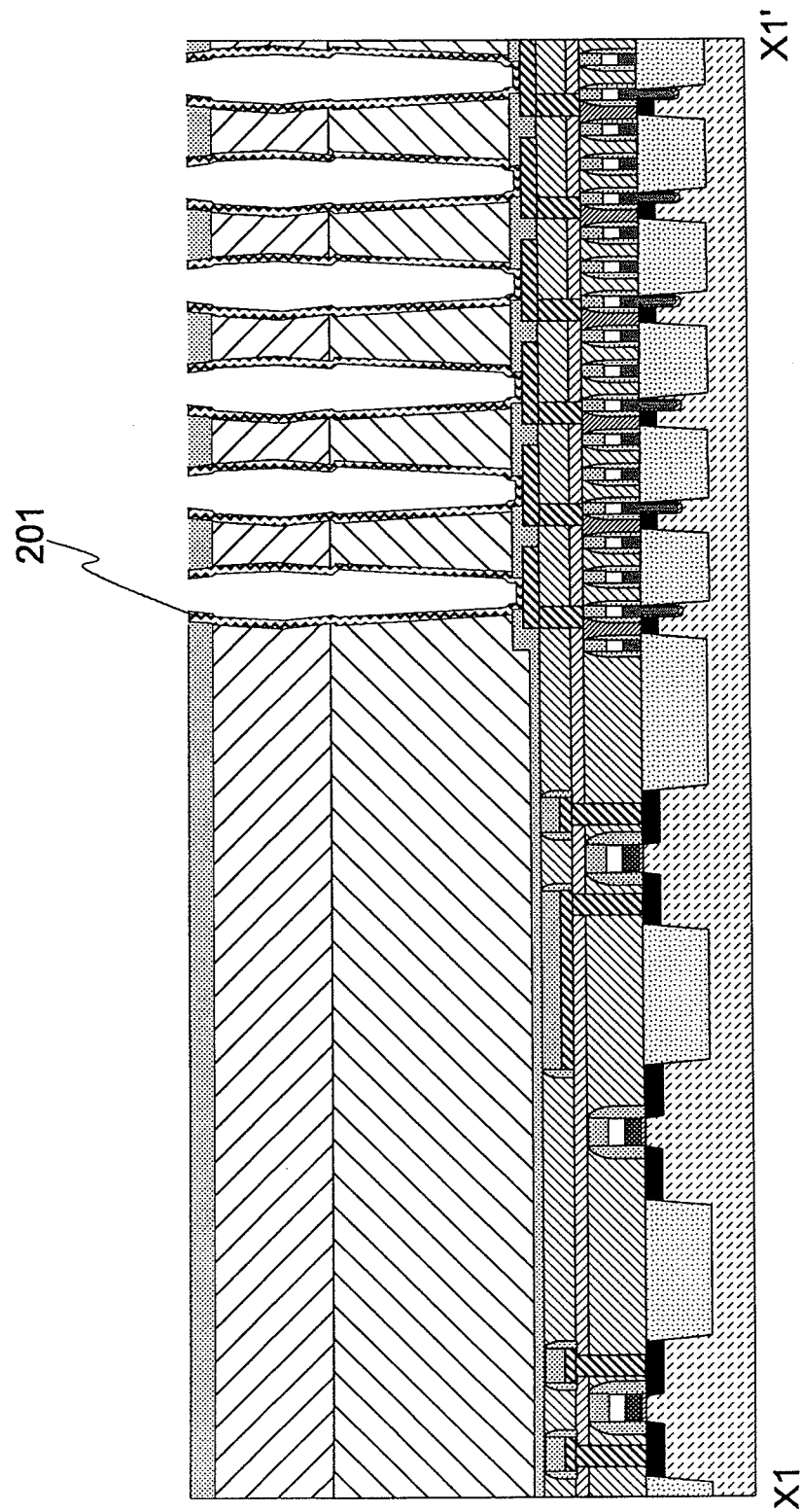
FIG. 6 is a cross-sectional view taken along a line X1-X1' of FIG. 1(d), illustrating a fourth process of Example 1.

As illustrated in FIG. 6, a capacitor lower electrode 201 is formed which covers the bottom surface, starting from the side surface in the capacitor hole 181. As the material thereof, a laminated film with the total thickness of 15 nm including 5 nm of a titanium film and 10 nm of a titanium nitride film was used. The material is not limited thereto, but a single layer film of the titanium nitride film, a refractory metal film, a doped silicon film, or their laminated film can be used.

FIGS. 1(c) and 1(d) are top views of the memory capacitor region that has passed through the above-described process, FIG. 6 is a cross-sectional view taken along a line X1-X1', FIG. 7(a) is a cross-sectional view taken along a line X3-X3', FIG. 1(e) is a top view of the first peripheral capacitor region, FIG. 7(b) is a cross-sectional view taken along a line X1-X1', FIG. 1(f) is a top view of the second peripheral capacitor region, and FIG. 7(c) is a cross-sectional view taken along a line XJ-XJ'. Further, in FIG. 7, the semiconductor device or the like was omitted, and the capacitor lower electrode 201 was simplified.

(Fifth Process)

Figure 8:
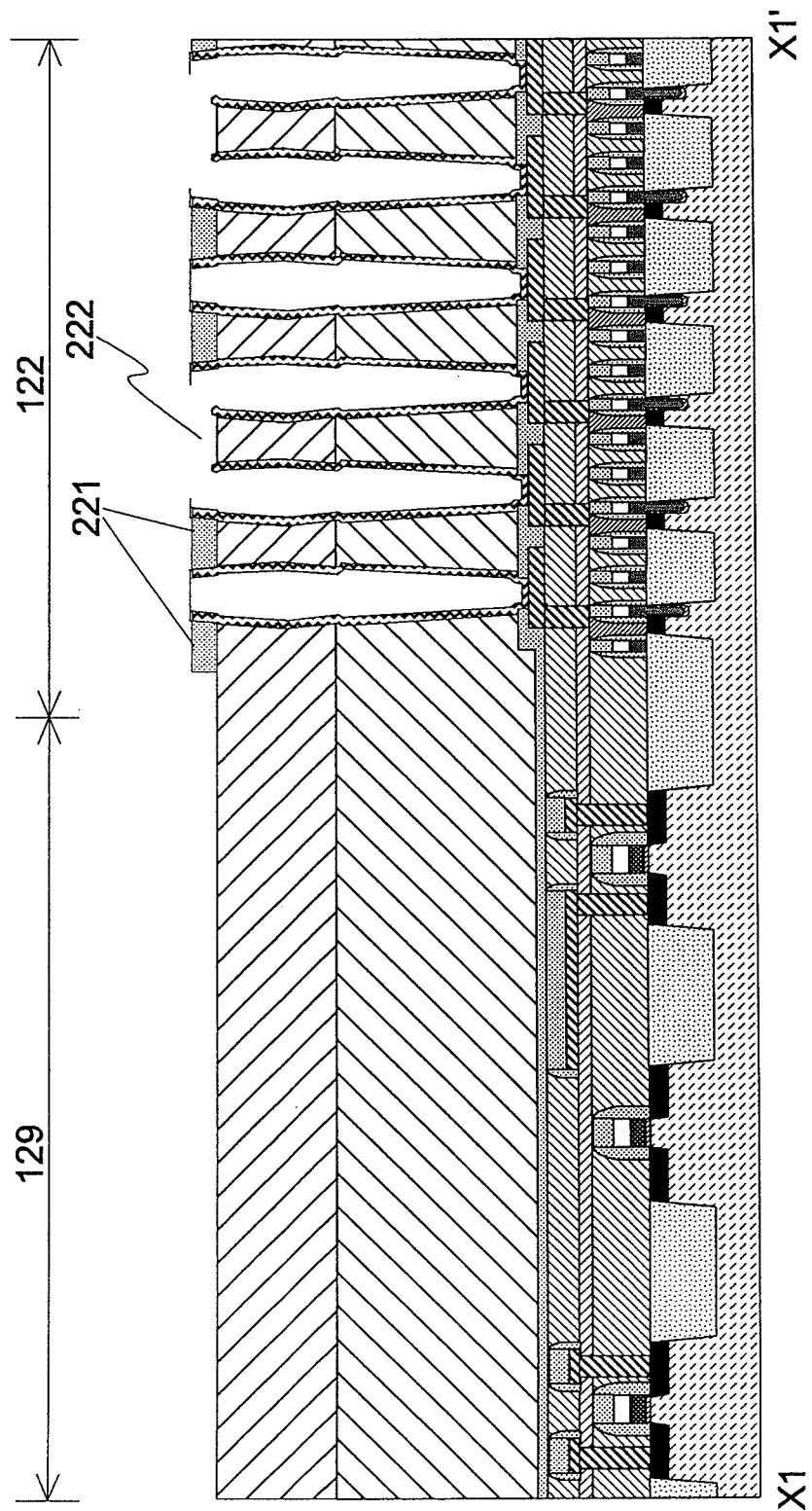
FIG. 8 is a cross-sectional view taken along a line X1-X1' of FIG. 1(d), illustrating a fifth process of Example 1.

As illustrated in FIG. 8, a capacitor support 221 is formed by patterning the capacitor support film 163 using the lithography technology and the etching technology. The capacitor support 221 is formed to be connected between the neighboring capacitor lower electrodes 201, and supports the neighboring capacitor lower electrodes 201 to heighten the mechanical strength against the collapse of the capacitor lower electrode 201.

Figure 9:
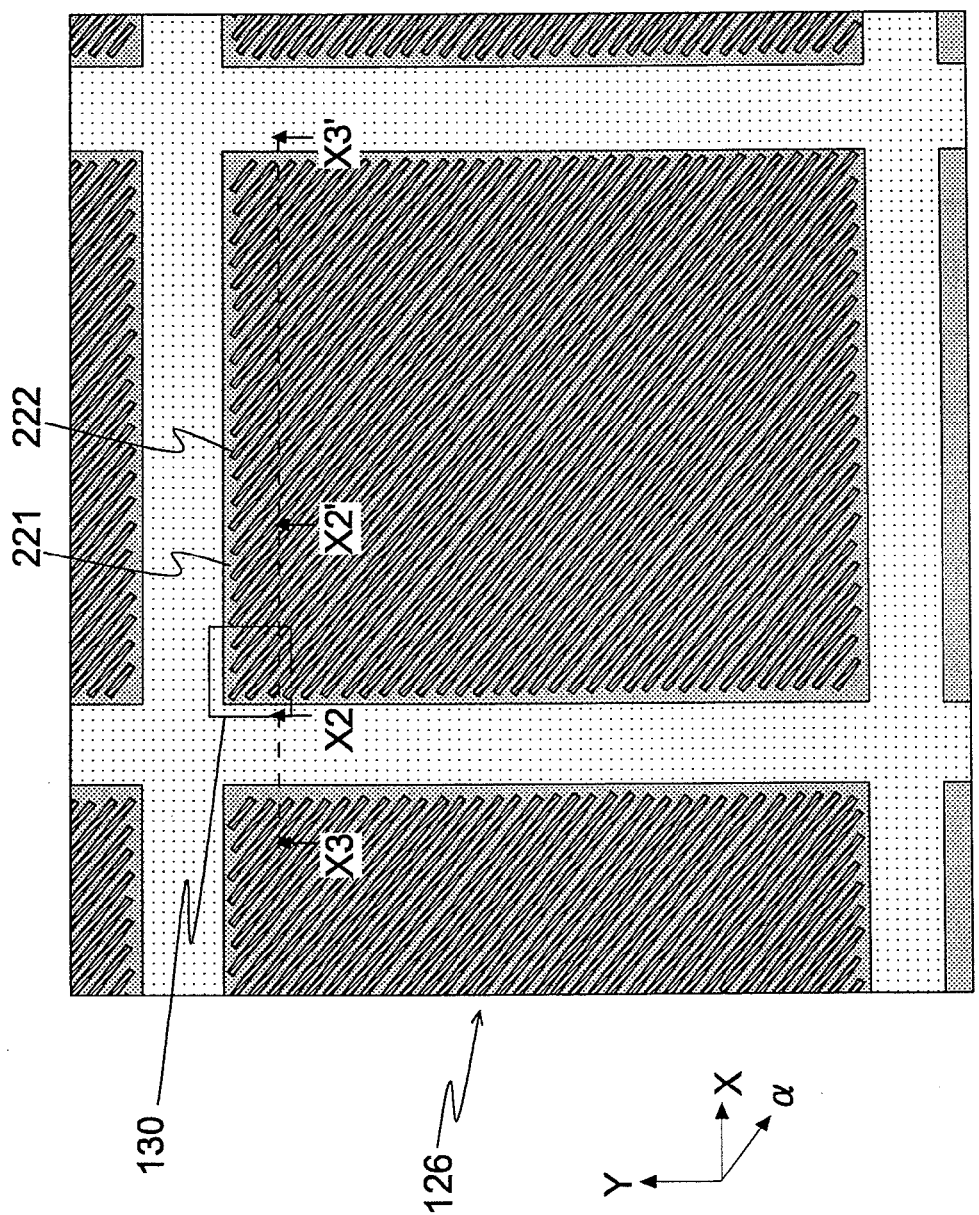
FIG. 9 is a plan view of the region B in the fifth process of Example 1.

FIG. 9 is a top view of a region B (126) in this process. The pattern of the capacitor support 221 used in this example is formed to planarly cover the region of the array made by the capacitor lower electrode 201. Plural openings 222 are formed on the capacitor support 221 formed to be spread in a planar shape as seen from the plane. The openings 222 functions as a distribution gateway of an etchant in a capacitor core etching process of subsequent processes and as a distribution gateway of a film forming gas in a capacitor capacitance insulating film forming and capacitor upper electrode film forming process.

Figure 10:
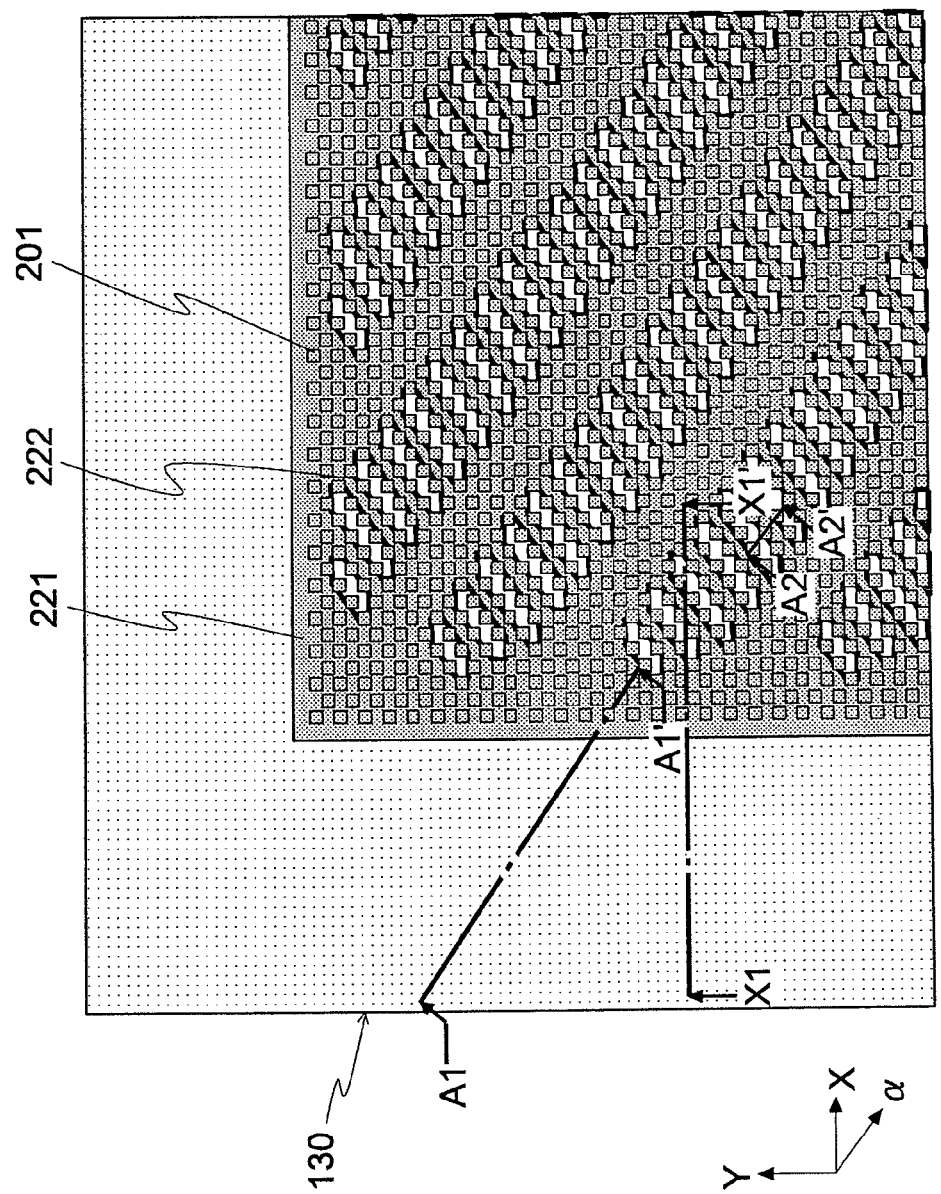
FIG. 10 is a plan view of the region E in the fifth process of Example 1.

FIG. 10 is an enlarged view of a region E (130) of FIG. 9. The pattern of the openings 222 is formed in an island-like disconnected pattern. Plural openings 22 are installed in α direction to form an opening 222 array, and plural opening 222 arrays are formed in a direction perpendicular to the α direction. Further, the pattern of the openings 222 is not limited to the pattern illustrated herein, but a pattern that extends in a linear form.

The outer edge of the pattern of the flat type capacitor support 221 that is used in this example is formed outward from the capacitor lower electrode 201 positioned on the outermost circumference by taking the margin.

The patterns of the capacitor support 221 are formed on the memory cell region 122, the first peripheral capacitor region 124, and the second peripheral capacitor region 125.

(Sixth Process)

Figure 11:
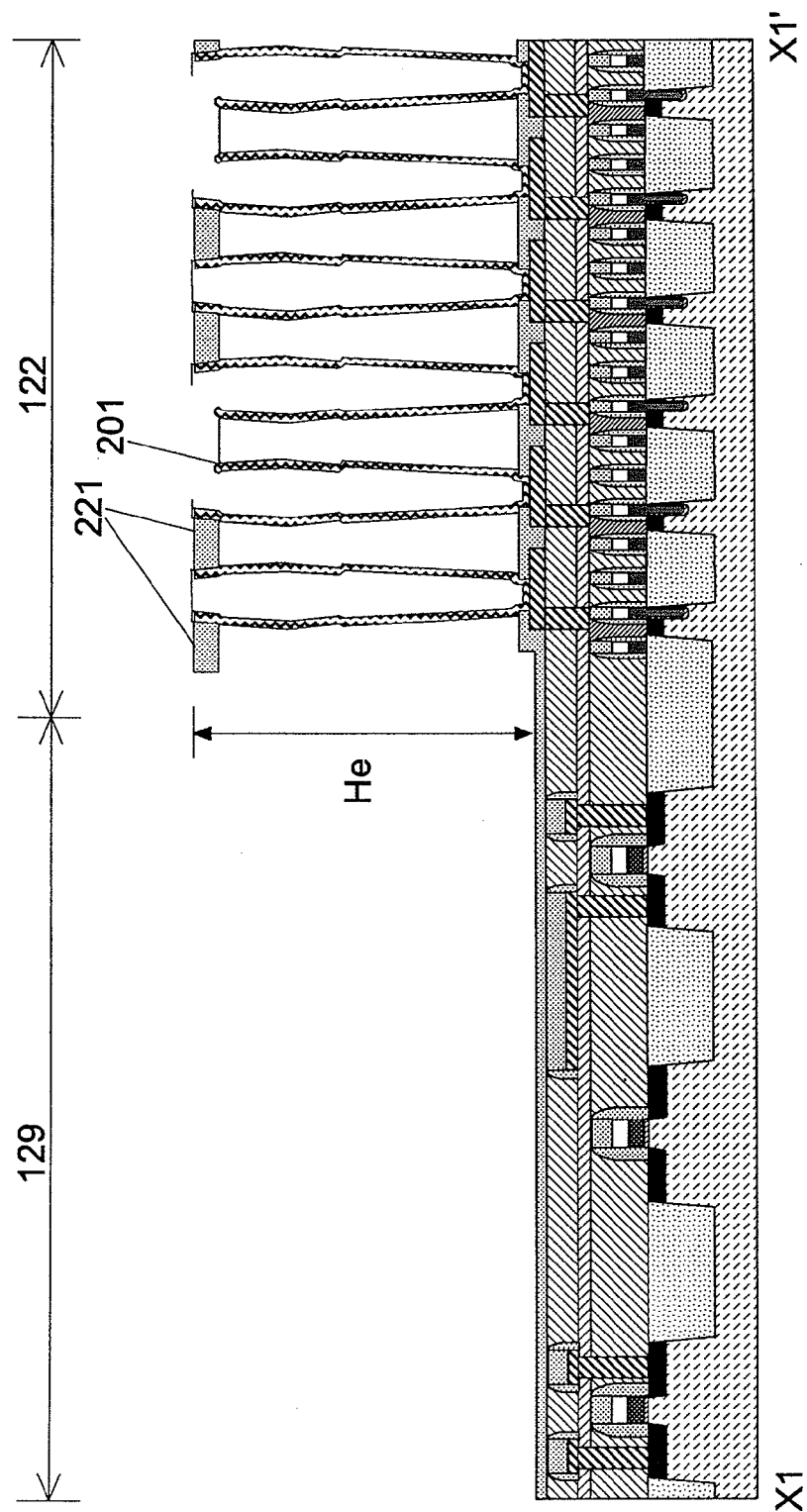
FIG. 11 is a cross-sectional view taken along a line X1-X1' of FIG. 1(d), illustrating a sixth process of Example 1.

As illustrated in FIG. 11, the first and second capacitor core films 161 and 162 are selectively removed by etching while leaving the capacitor stopper film 14, the capacitor support 221, and the capacitor lower electrode 201 (capacitor core etching). The capacitor core etching was performed by wet etching using hydrofluoric acid for a chemical solution. By this etching, the outer surface of the capacitor lower electrode 201 is exposed. On an upper portion of the capacitor lower electrode 201, the capacitor support 221 is formed, and the neighboring capacitor lower electrodes 201 support each other. The etching is not limited to the wet etching using the hydrofluoric acid, but an etching method having the characteristics that the etching speed for the capacitor stopper film 14, the capacitor support 221, and the capacitor lower electrode 201 is low and the etching speed for the first and second capacitor core films 161 and 162 is high can be used.

The height of the capacitor lower electrode 201 is called a lower electrode height, and is indicated by $H_e$. $H_e$ is the total thickness of the first and second capacitor core films 162 and 163 and the capacitor support film 163, and is approximately 1.3 µm.

(Seventh Process)

Figure 12:
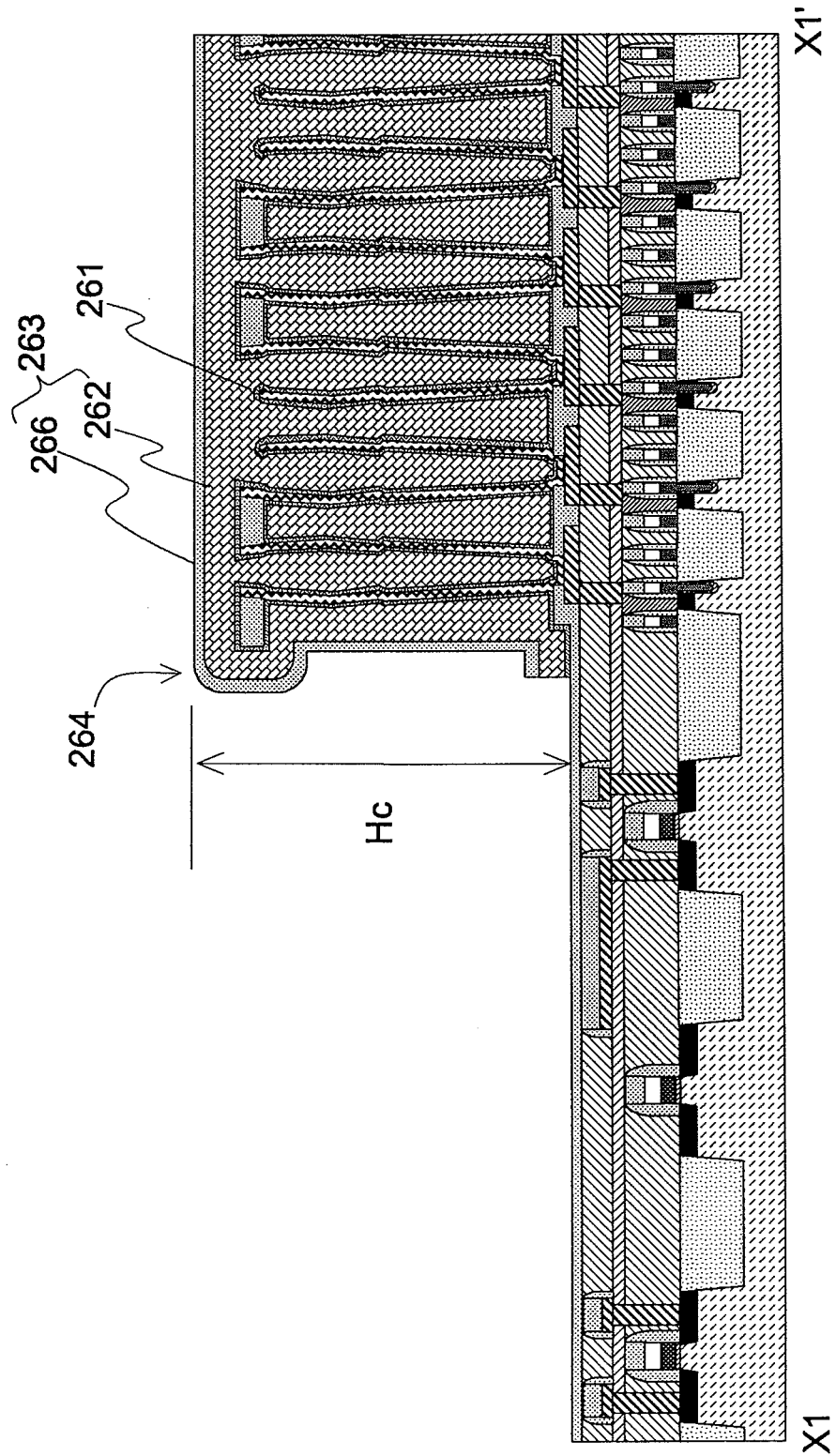
FIG. 12 is a cross-sectional view taken along a line X1-X1' of FIG. 1(d), illustrating a seventh process of Example 1.

Next, as illustrated in FIG. 12, a capacitor dielectric film 261 is formed to cover the surfaces of the inner and outer walls of the capacitor lower electrode 201. As the material thereof, a zirconium oxide film was formed in an ALD method. The thickness thereof was 10 nm.

Then, a capacitor upper electrode conductive film 262 is formed on the capacitor dielectric film 261. As the material thereof, a laminated film of a titanium nitride film and an impurity doped silicon film was used, and the thicknesses thereof were 10 nm and 140 nm, respectively. The film forming was performed in the CVD method.

On the capacitor upper electrode conductive film 262, a capacitor upper electrode cap film 266 is formed as a hard mask during etching. As the material thereof, a silicon oxide film was used, and the thickness thereof was 100 nm. The film forming was performed in the CVD method.

Using the lithography technology, a resist mask having a pattern of a capacitor upper electrode formation planned region is formed. The capacitor upper electrode formation planned region is formed to cover the region of the array that is made by the capacitor lower electrode 201 on a plane.

The capacitor upper electrode cap film 266 and the capacitor upper electrode conductive film 262 are patterned by sequentially etching the capacitor upper electrode cap film 266 and the capacitor upper electrode conductive film 262 using the resist mask (capacitor upper electrode etching). The capacitor upper electrode conductive film 262 and the capacitor upper electrode cap film 266 are called a capacitor upper electrode 263.

After patterning, the resist mask is removed using a stripping solution.

Figure 13:
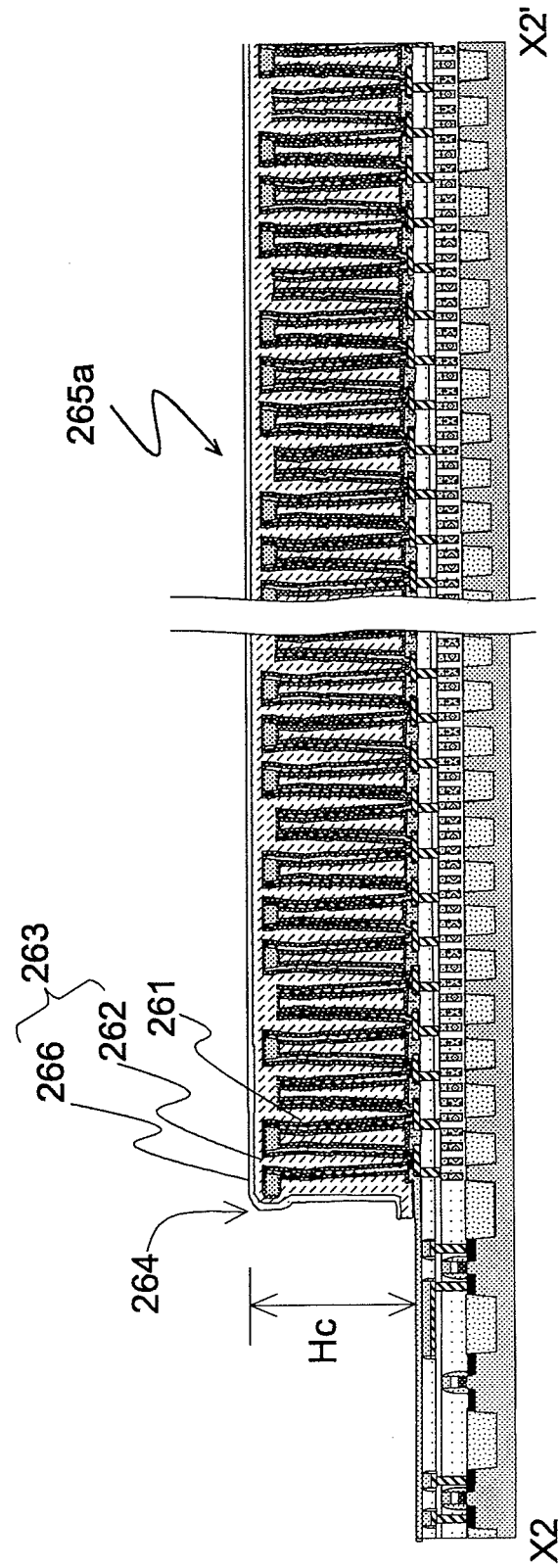
FIG. 13 is a cross-sectional view taken along a line X1-X1' of FIG. 1(d), illustrating the seventh process of Example 1.
Figure 14:
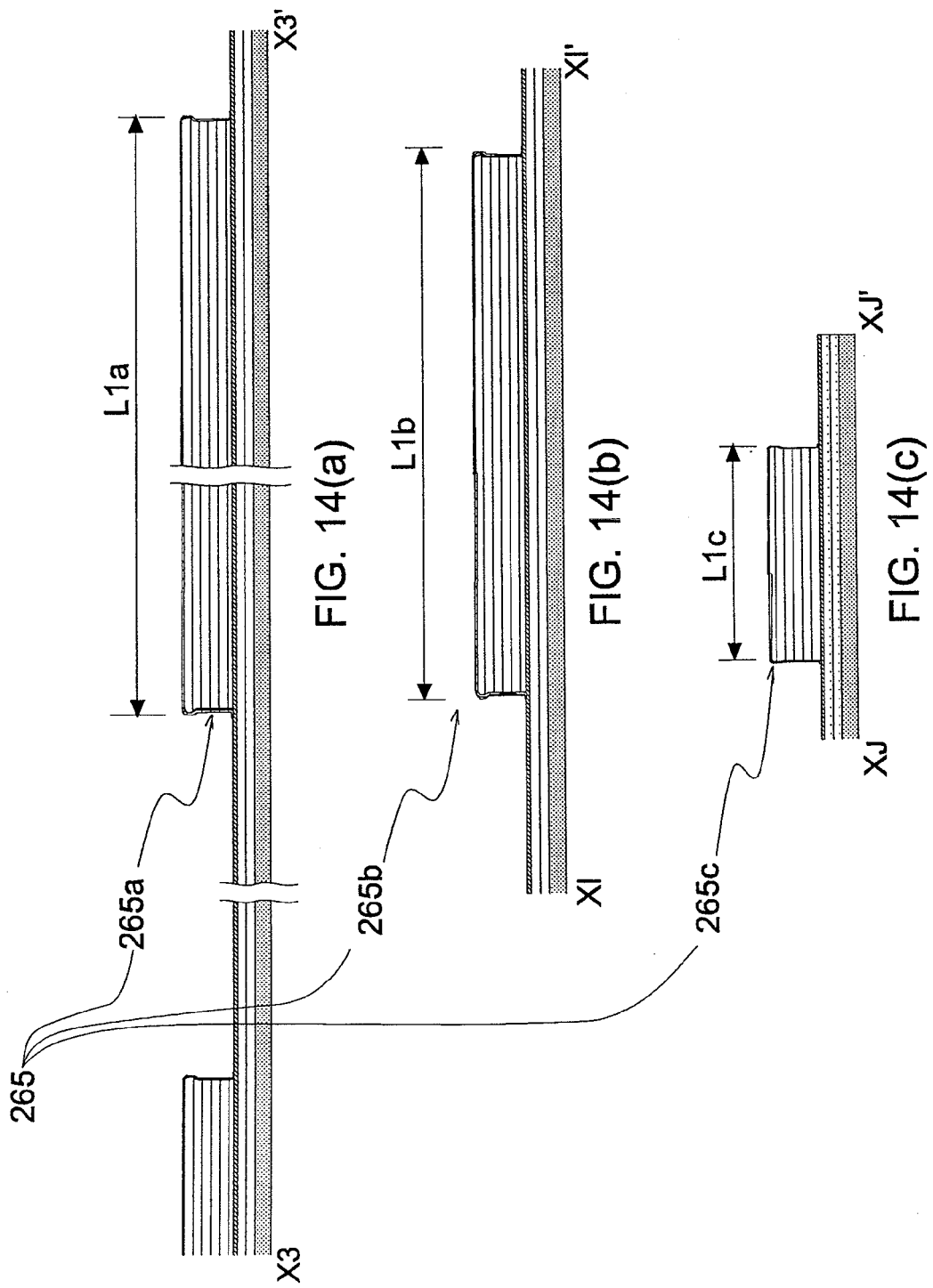
Figure 15:
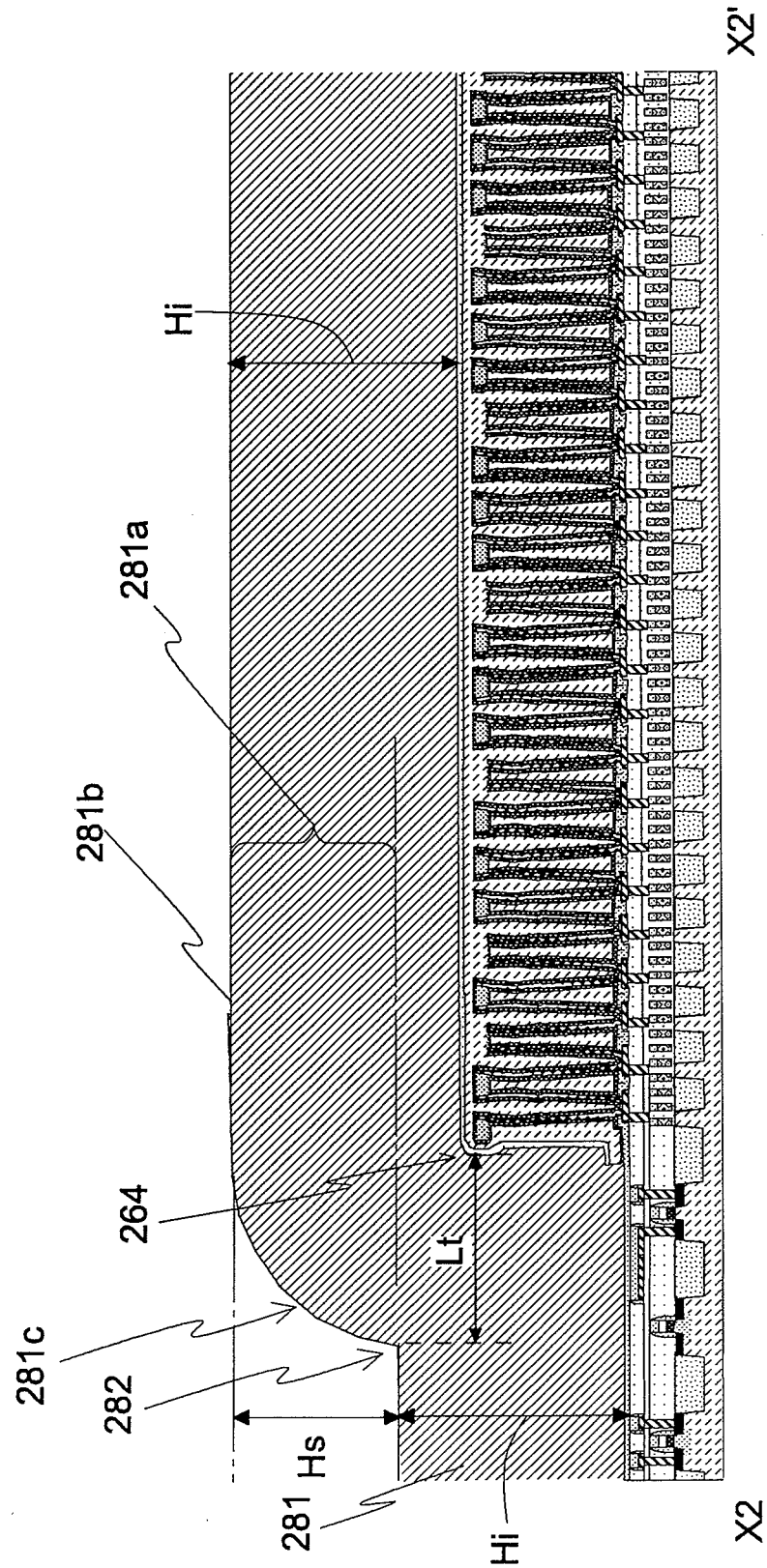
FIG. 15 is a cross-sectional view taken along a line X2-X2' of FIG. 1(c), illustrating an eighth process of Example 1.

FIG. 12 is a cross-sectional view taken along a line X1-X1', and FIG. 13 is a cross-sectional view taken along a line X1-X1'. FIG. 14(a) is a cross-sectional view taken along a line X3-X3', FIG. 14(b) is a cross-sectional view taken along a line XI-XI', and FIG. 14(c) is a cross-sectional view taken along a line XJ-XJ'. Further, in FIG. 14, the semiconductor device or the like was omitted, and the capacitor lower electrode 201 was simplified. This simplification is also used in the same cross-sections in latter cases.

Since the capacitor lower electrode 201 has a high step height, the resist mask formed thereon becomes thinner in the stripped end of the array that is made by the capacitor lower electrode 201, and during the etching of the capacitor upper electrode conductive film 262, the resist becomes unable to endure, and thus the shoulders of the capacitor upper electrode conductive film 262 are etched. To prevent this, in this example, the capacitor upper electrode cap film 266 is formed on the capacitor upper electrode conductive film 262, and the capacitor upper electrode conductive film 262 is etched using the formed capacitor upper electrode cap film as a hard mask. Further, if the shoulders have no etching problem, the capacitor upper electrode cap film 266 may be omitted. In such a case, the capacitor upper electrode 263 is composed of the capacitor upper electrode conductive film 262.

Through this process, a capacitor that is composed of the capacitor lower electrode 201, the capacitor dielectric film 261, and the capacitor upper electrode 263 is formed. The capacitors are formed in an array form, and this array is called the capacitor array 265. The upper surface of the capacitor upper electrode 263 forms a plate electrode that is substantially flat in the horizontal direction, and the upper surface of the capacitor array 265 is substantially flat, so that the capacitor array is formed to project from the substrate with a height in the vertical direction.

The capacitor arrays 265 are formed on the memory cell region 122, the first peripheral capacitor region 124, and the second peripheral capacitor region 125, respectively, and are called a memory capacitor array 265a, a first peripheral capacitor array 265b, and a second peripheral capacitor array 265c.

The height from the upper surface of the capacitor upper electrode 263 of the capacitor array 265 to the upper surface of the capacitor stopper film 14 is called a capacitor height, and is indicated by $H_c$. $H_c$ corresponds to a height that is obtained by adding the heights of the capacitor dielectric film 261 and the capacitor upper electrode 263 to the height $H_e$ of the capacitor lower electrode, and in this example, it is 1.5 µm.

The position of the upper shoulder end of the capacitor array 265 is called a capacitor array end 264. The capacitor array end 264 corresponds to the edge of the capacitor upper electrode 263 that is formed along the edge of the capacitor support 221.

The horizontal width of the capacitor array 265 is defined on the basis of the position of the capacitor array end 264, and the horizontal width of the capacitor array is called a capacitor array width, which is indicated by L1. As illustrated in FIG. 14, the horizontal width L1a of the memory capacitor array 265a is 50 μm in the X direction and 60 μm in the Y direction, the horizontal width L1b of the first peripheral capacitor array 265b is 16 μm, and the horizontal width L1c of the second peripheral capacitor array 265c is 6 μm.

(Eighth Process)

A capacitor interlayer 281 is formed on the capacitor arrays 265. The thickness of the capacitor interlayer 281 is indicated by $H_i$. The thickness $H_i$ becomes thicker than the capacitor height $H_c$. Since the capacitor height $H_c$ forms a high step height that exceeds 1 μm, it is necessary to form $H_i$ up to a thickness of 3 μm with exceeding $H_c$. In order to form such a thick film, it is preferable that the material thereof is an insulating film having a relatively small stress, and a silicon oxide film was used as the material. The film forming was performed using a plasma CVD method having excellent productivity and relatively excellent step height coverage. In this example, in the capacitor interlayer CMP to be performed later, the $H_i$ was formed with a thickness of 2.3 μm using the thickness that can ensure a remaining film on the capacitor upper electrode 263 after polishing. The capacitor interlayer 281 was formed such that both the height of the capacitor interlayer 281 formed on the non-capacitor region 129 and the height of the capacitor interlayer 281 formed on the capacitor array 256 are $H_i$.

The capacitor interlayer 281 is formed to protrude in the vertical direction of the substrate by reflecting the shape in which the capacitor array 265 is formed. On the basis of the height of the surface of the capacitor interlayer 281 on the non-capacitor region 129, a portion of the capacitor interlayer 281 that protrudes in the vertical direction of the substrate on the capacitor region is called a capacitor interlayer projected portion 281a. In this example, the capacitor upper electrode has a substantially rectangular outer edge as seen from the plane, and the outer edge of the projected portion that is prescribed as the rising point 282 of the capacitor interlayer 281 has a substantially rectangular circumference that follows the outer edge of the capacitor upper electrode. The height of the capacitor interlayer projected portion 281a (height of the projected portion) that is protruded from the non-capacitor region 129 is indicated by $H_s$. $H_s$ is substantially the same as the capacitor height $H_c$. In this example, $H_s$ is 1.5 μm.

The capacitor interlayer projected portion 281a is formed to rise in substantially vertical direction of the substrate from a distance that is apart for about the thickness of the capacitor interlayer 281 from the capacitor array end 264, and has an arc-shaped slope form centered upon the capacitor array end 264. In the portion on the capacitor array 265, the upper surface of the capacitor interlayer projected portion 281a is flat. The portion having the arc-shaped slope is called a capacitor interlayer protrusion arc-shaped portion 281c, and the flat portion on the capacitor array 265 is called a capacitor interlayer protrusion flat portion 281b.

The point of the capacitor interlayer projected portion 281a that rises in the substantially vertical direction from the substrate is called a rising point 282. The distance between the rising point 282 and the capacitor array end 264 is indicated by Lt. Lt corresponds to the horizontal width of the capacitor interlayer protrusion arc-shaped portion 281c. The size of Lt depends upon the step height coverage in the side wall portion of the capacitor array 265 of the capacitor interlayer 281, and has a length that is about 100% to 60% of the film forming thickness $H_i$ of the capacitor interlayer 281. In this example, Lt is substantially 1.5 μm.

The horizontal width of the capacitor interlayer projected portion 281a is defined on the basis of the rising point 282, and the horizontal width is called a capacitor interlayer protrusion width, which is indicated by L2. L2 is the same as L1+2×Lt. As illustrated in FIG. 16, L2a of the memory capacitor array 265a was set to 53 μm in the X direction and 63 μm in the Y direction, L2b of the first peripheral capacitor array 265b was set to 19 μm, and L2c of the second peripheral capacitor array 265c was set to 9 μm.

Figure 17:
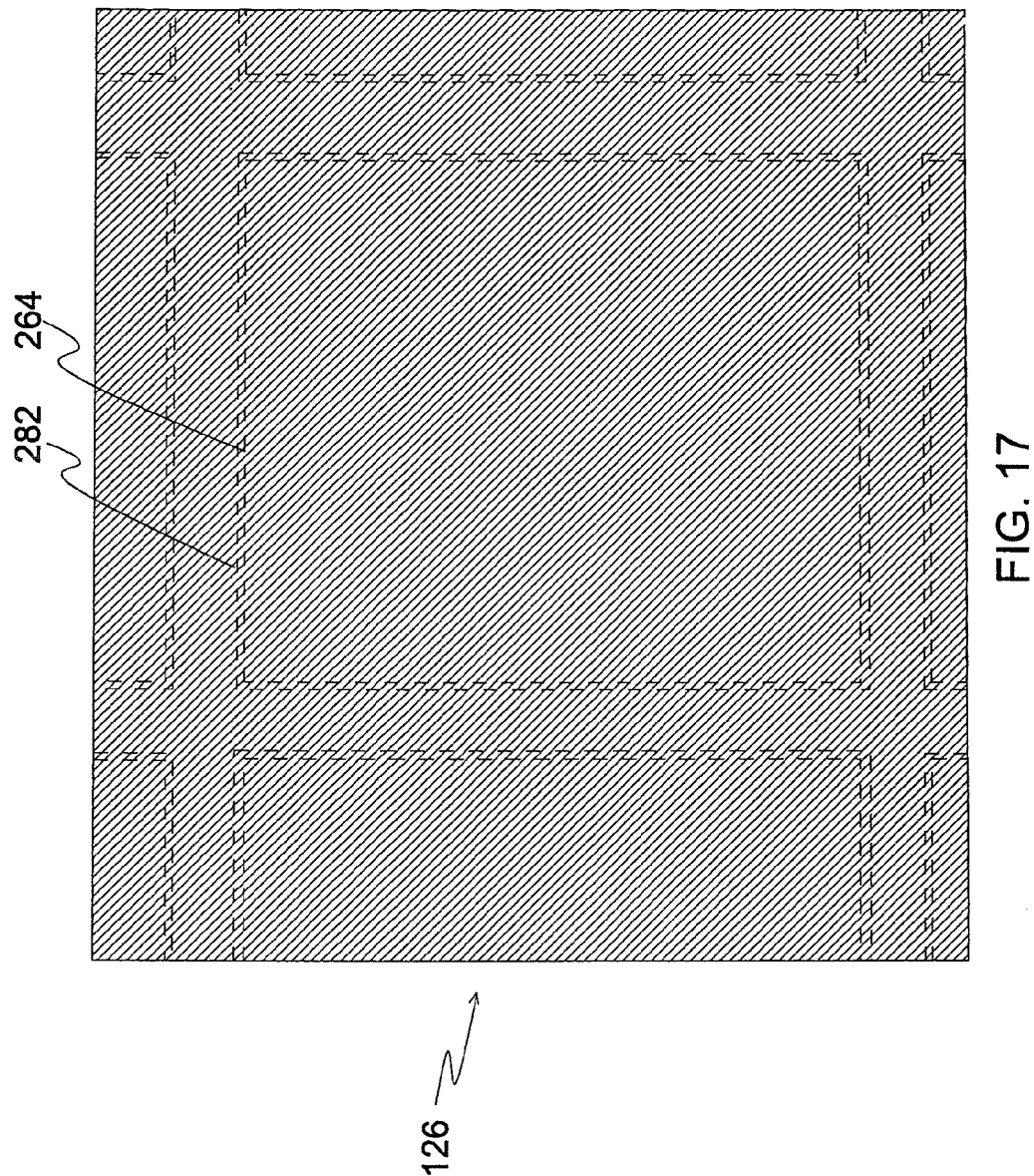
FIG. 17 is a plan view of the region B in the eighth process of Example 1.

FIG. 17 is a plan view of a region B (126) after forming the capacitor interlayer 281.

On the capacitor interlayer 281, a peripheral circuit wiring is formed from the region of the capacitor array 265 to the peripheral circuit region 123 (non-capacitor region 129) in a later wiring forming process. As in this example, if the capacitor interlayer projected portion 281a is formed with a height that exceeds 1 μm, it becomes difficult to form a resist pattern of the peripheral circuit wiring thereon using the lithography technology. Accordingly, it is required to globally flatten the capacitor interlayer 281 from the region of the capacitor array 265 to the peripheral circuit region 123 (non-capacitor region 129).

As a method of globally flattening the interlayer, a CMP method that performs the flattening by selectively removing the capacitor interlayer projected portion 281a, which is the protruded portion of the capacitor interlayer 281, is effective. However, the capacitor interlayer projected portion 281a has a height as high as 1.5 μm, and is a pattern which is a wide planar shape formed with the width L2 (L2a and L2b) of several tens micrometers or more. In order to flatten the projected portion having a wide planar area and a high step height in the CMP method, a lot of polishing with the polishing amount of several micrometers. If the polishing amount is large, the unevenness of the film thickness in the wafer plane becomes large. If the polishing amount is further larger, polishing is excessively performed (over-polishing) at the edge of the semiconductor wafer 101, and this causes the problem in that semiconductor chips 102 taken out from the end of the semiconductor wafer 101 become defective.

In order to solve the problem, according to the present invention, a resist pattern for forming openings on the capacitor interlayer projected portion 281a is formed, and the capacitor interlayer 281 is etched with a depth (etching amount) of about $H_s$ using the resist mask, so that the height of the upper surface of the capacitor interlayer 281 on the capacitor array 265 becomes substantially the same as the height of the upper surface of the capacitor interlayer 281 on the non-capacitor region 129. In this case, the capacitor interlayer protrusion arc-shaped portion 281c is protected from being etched by the resist pattern and remains as a first region after the etching. After removing the resist mask, thus formed first region is removed by polishing using the CMP method to flatten the interlayer on the wafer having a smooth surface. The first region formed to have a relatively small width can be regarded as a fine pattern, and thus it can be removed in the small amount of polishing. As a result, the thickness variation of the interlayer can be reduced, and thus the over-polishing at the wafer end can be suppressed.

Hereinafter, a flattening method according to the present invention will be described with reference to the drawings.

(Ninth Process)

As illustrated in FIG. 18, a step height reduction resist mask 301, of which the step height reduction etching planned region is open, is formed on the capacitor array 256 of the capacitor interlayer projected portion 281a (that is, capacitor interlayer protrusion flattened portion 281b) using the lithography technology. This opening of the resist mask is called a step height reduction resist mask opening 302. The opening end of the inside of the step height reduction resist mask opening 302 is called a step height reduction resist mask opening end 303.

The step height reduction resist mask 301 is formed to cover at least a part of the capacitor interlayer protrusion arc-shaped portion 281c. This is because, when the capacitor interlayer protrusion arc-shaped portion 281c is etched, the corresponding portion remains as a groove portion after the CMP of the capacitor interlayer, and thus the flatness after the CMP may be impaired.

Further, the step height reduction resister mask 301 is formed so that the distance from the rising point 282 to the step height reduction resist mask opening end 303 is indicated by Lr and Lr secures a predetermined value. In this example, Lr is formed to secure 6 μm. The details of the length of Lr will be described later. As described above, the step height reduction resist mask 301 is formed to cover the capacitor interlayer protrusion arc-shaped portion 281c and to cover a part of the capacitor interlayer protrusion flat portion 281b.

The distance between the capacitor array end 264 and the step height reduction resist mask opening end 303 is indicated by Lm. Lm is a length subtracted Lt from Lr. Here, Lt is 1.5 μm, and Lm is 4.5 μm.

Since the step height reduction resist mask opening 302 is formed to secure the width of length Lr from the rising point 282, the step height reduction resist mask opening 302 is open in the capacitor interlayer projected portion 281a in which the horizontal width L2 of the capacitor interlayer projected portion 281a is larger than 2×Lr, and the resist mask opening is not formed in the capacitor interlayer projected portion 281a in which L2 is equal to or smaller than 2×Lr.

In this example, as illustrated in FIG. 19, the step height reduction resist mask opening 302 is formed on the memory capacitor array 265a and the first peripheral capacitor array 265b (FIGS. 19(a) and 19(b)), but the step height reduction resist mask opening 302 is not formed on the second peripheral capacitor array 265c (FIG. 19(c)).

Figure 21:
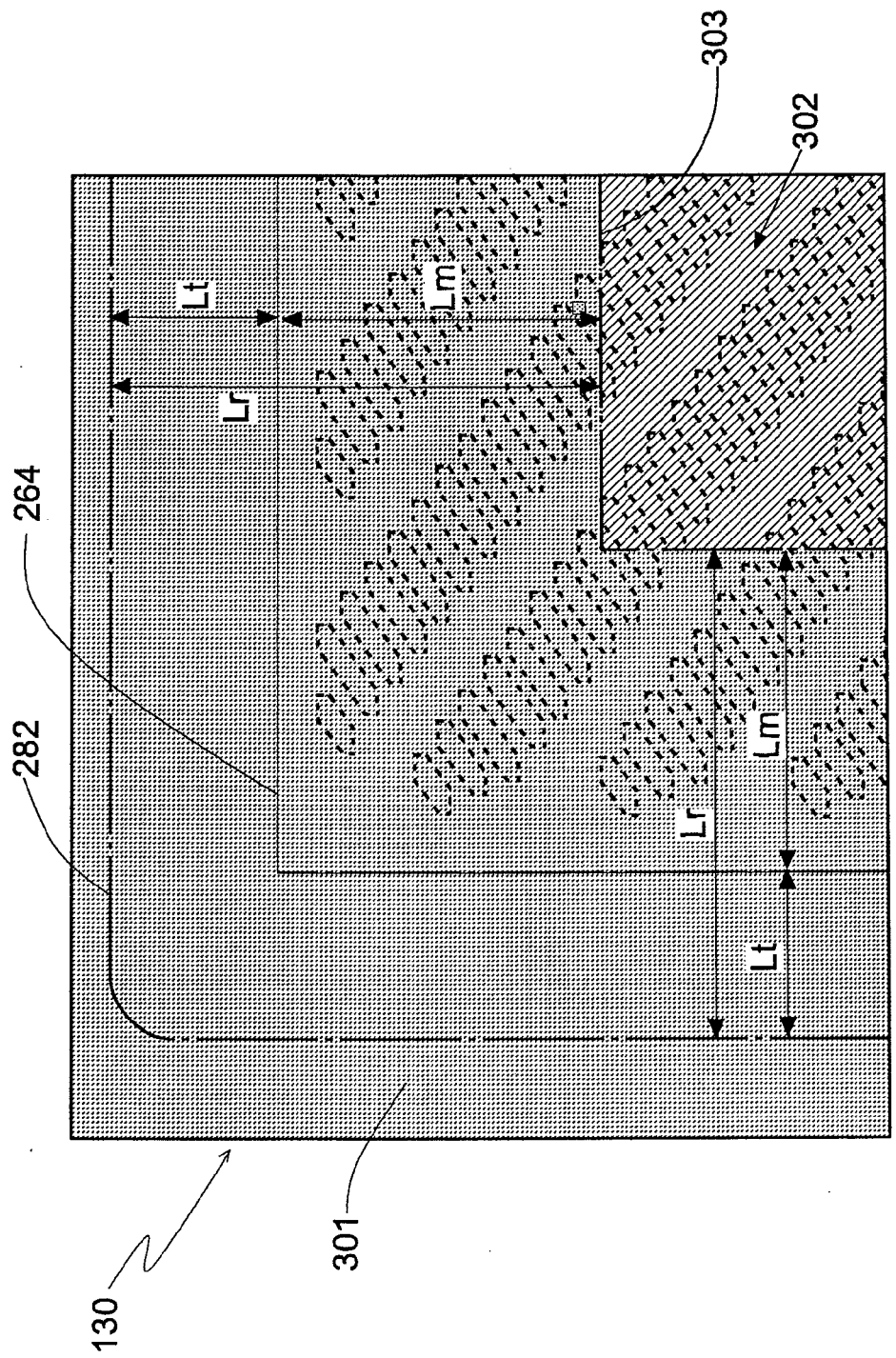
FIG. 21 is a plan view of a region B in the ninth process of Example 1.

FIG. 20 shows a plan view of the region 126 and FIG. 21 shows a plan view of the region 130 after forming the step height reduction resist mask.

(Tenth Process)

As illustrated in FIG. 22, the capacitor interlayer projected portion 281a that is exposed to the step height reduction resist mask opening 303 is etched (step height reduction etching) using the step height reduction resist mask 301. The etched opening formed on the capacitor interlayer projected portion 281a is called a step height reduction etched opening 321. The etching amount (depth) is indicated by $H_d$. If the thickness of the remaining film of the capacitor interlayer 281 that remains on the bottom of the step height reduction etched opening 321 is indicated by $H_r$, $H_r$ is equal to $(H_i-H_d)$.

Here, on the capacitor upper electrode conductive film 262, the capacitor upper electrode cap film 266 is formed. The thickness of the insulating film on the capacitor upper electrode conductive film 262 becomes the total of the thickness of the capacitor upper electrode cap film 266 (in this example, 100 nm) and the thickness $H_r$ of the capacitor interlayer 281. This total thickness is indicated by t. In the actual manufacturing, the management of the thickness of the insulating film on the capacitor upper electrode conductive film 262 is performed by measuring the thickness t.

In order to perform the high-precision patterning, the etching is performed by an anisotropic dry etching that has excellent controllabilities of width dimension and processed shape.

A portion that is covered by the step height reduction resist mask 301 of the capacitor interlayer projected portion 281a is not etched, but remains in the neighborhood of the step height reduction etched opening 321 as the first region that has a side surface height (hereinafter also indicated by a height $H_d$) that corresponds to the etching amount $H_d$. The first region is called a capacitor interlayer protrusion portion 323. The capacitor interlayer protrusion portion 323 has a horizontal width Lr, and is formed in an annular shape to follow the outer edge of the capacitor array end 264 (substantially parallel to the outer edge) as seen from the plane. The exterior of the capacitor interlayer protrusion portion is formed in a bank-like shape.

The etching is performed so that the etching amount $H_d$ becomes substantially equal to the height $H_s$ of the protrusion portion. By doing this, the height of the upper surface of the capacitor interlayer remaining portion 322 that is formed on the capacitor array 265 becomes substantially equal to the height of the upper surface of the capacitor interlayer 281 of the non-capacitor region 129, and in the capacitor interlayer CMP performed thereafter, global flattening can be easily performed from the peripheral circuit region 123 to the capacitor array region 265. In this example, $H_s$ was 1.5 μm, and $H_d$ was about 1.5 μm. $H_i$ was 2.3 μm and $H_r$ was 800 nm. The thickness t of the insulating film on the capacitor upper electrode conductive film 262 corresponds to the sum of 100 nm of the capacitor upper electrode cap film 266 and $H_r$=800 nm of the capacitor interlayer 281, that is, t was 900 nm.

(Eleventh Process)

Figure 24:
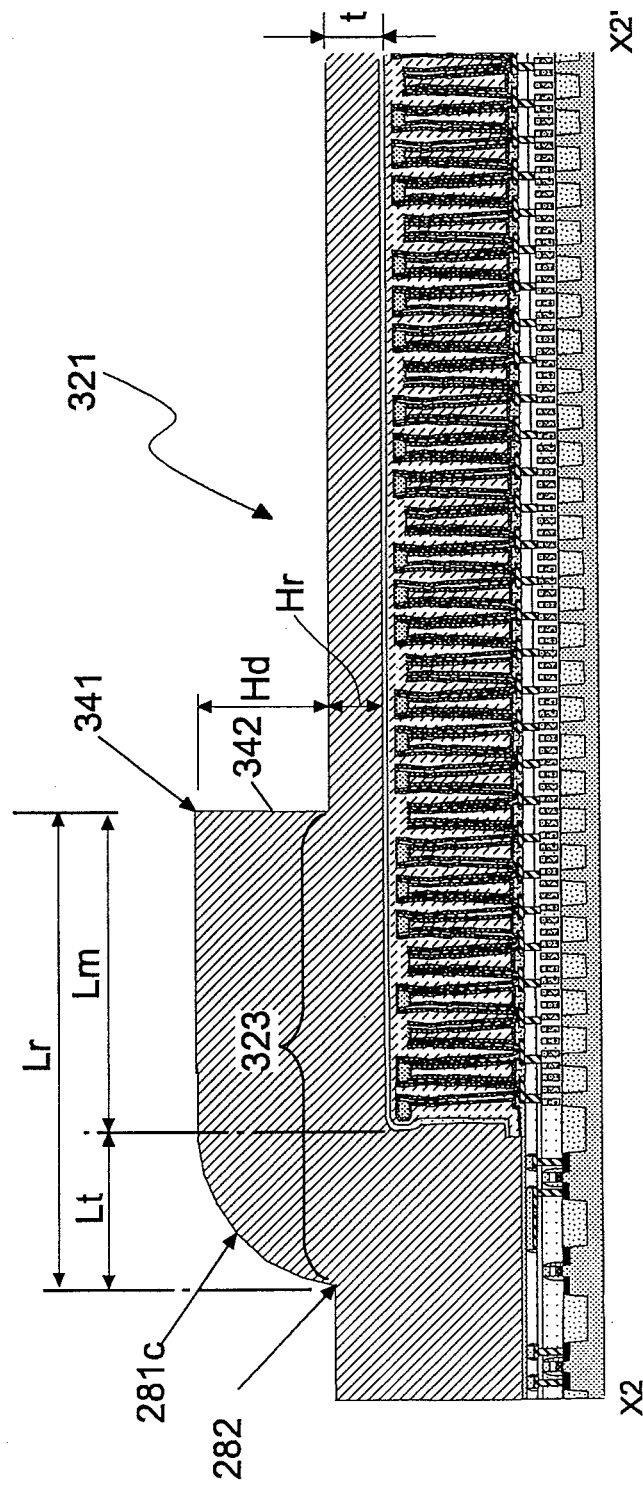
FIG. 24 is a cross-sectional view taken along a line X2-X2' of FIG. 1(c), illustrating an eleventh process of Example 1.

As illustrated in FIG. 24, the resist mask is removed.

The capacitor interlayer protrusion portion 323 has a cross-sectional shape in which an etched side surface 343 that is substantially in a steep vertical form is formed by anisotropic dry etching, and a corner portion made by the etched side surface 342 and the capacitor interlayer protrusion portion 323 has a substantially right-angled edge 341. On the other hand, the surface of the outer portion of the capacitor array 265 of the capacitor interlayer protrusion portion 323 maintains the shape during deposition of the capacitor interlayer 281, and includes the capacitor interlayer protrusion arc-shaped portion 281c having a slow slope variation. The capacitor interlayer protrusion portion 323 is formed to have a height $H_d$ of 1.5 μm and the width Lr of 6 μm.

Figure 25A:
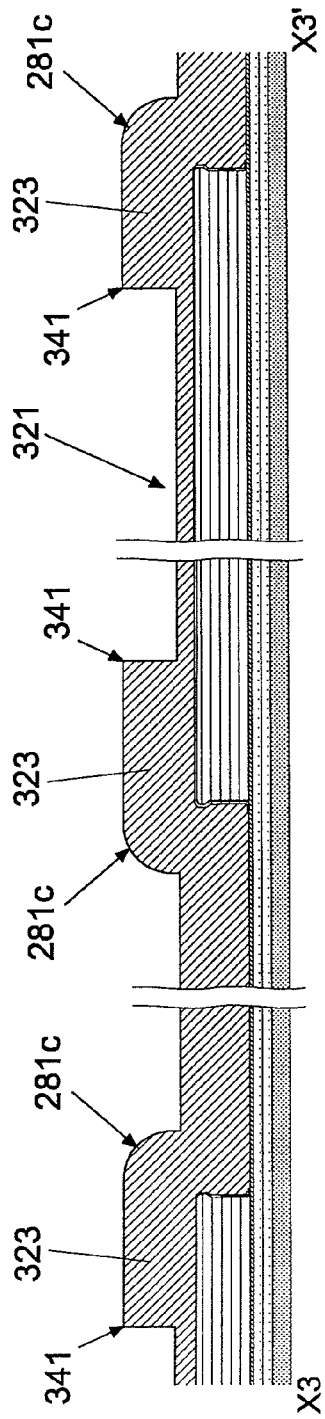
FIG. 25(a) is a cross-sectional view taken along a line X3-X3' of FIG. 1(c)
Figure 25B:
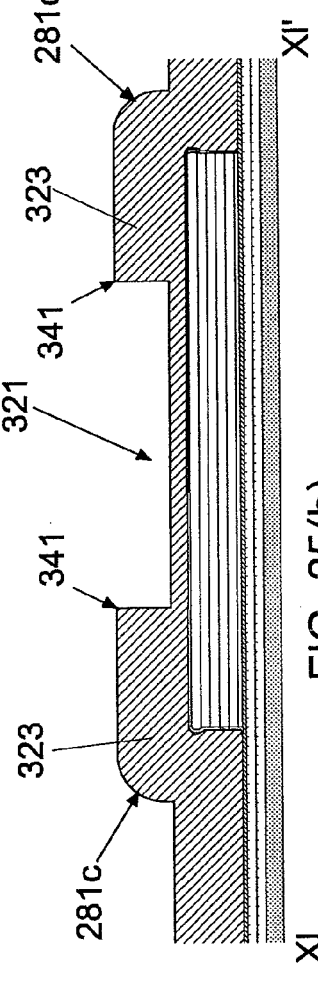
FIG. 25(b) is a cross-sectional view taken along a line XI-XI' of FIG. 1(e)
Figure 25C:
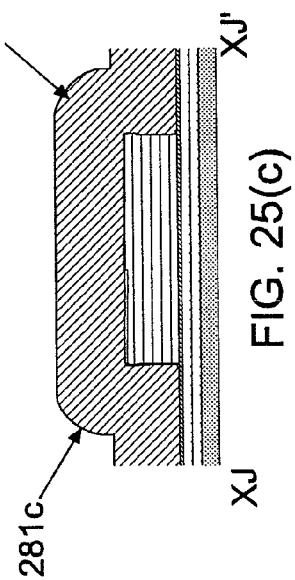
FIG. 25(c) is a cross-sectional view taken along a line XJ-XJ' of FIG. 1(f).

The step height reduction etched opening 321 and the capacitor interlayer protrusion portion 323 are formed on the memory capacitor array 265a and the first peripheral capacitor array 265b (FIGS. 25(a) and 25(b)), but are not formed on the second peripheral capacitor array 265c (FIG. 25(c)). In the second peripheral capacitor array 265c, the capacitor interlayer projected portion 281a, on which the capacitor interlayer 281 is formed in the eighth process, maintains its shape, and is formed as the projected portion that protrudes by 1.5 μm in the height direction. The side portion has the capacitor interlayer protrusion arc-shaped portion 281c having a slow slope and the flattened portion 281b.

In the large-area capacitor interlayer projected portion 281a having the width L2 that is larger than 2×Lr (in this example, 12 μm), the opening 321 having a depth that corresponds to the height of the non-capacitor region 129 is formed in the inner region, and the capacitor interlayer protrusion portion 323 is formed outside the opening 321 (FIGS. 25(a)

and 25(b)). In the small-area capacitor interlayer projected portion 281a having the width L2c (9 μm) that is equal to or smaller than 2×Lr, the opening is not formed, but the capacitor interlayer 281 is formed with the protruded state maintained (FIG. 25(c)). The capacitor region in which the opening is not formed is called "an unetched-capacitor region".

Figure 26:
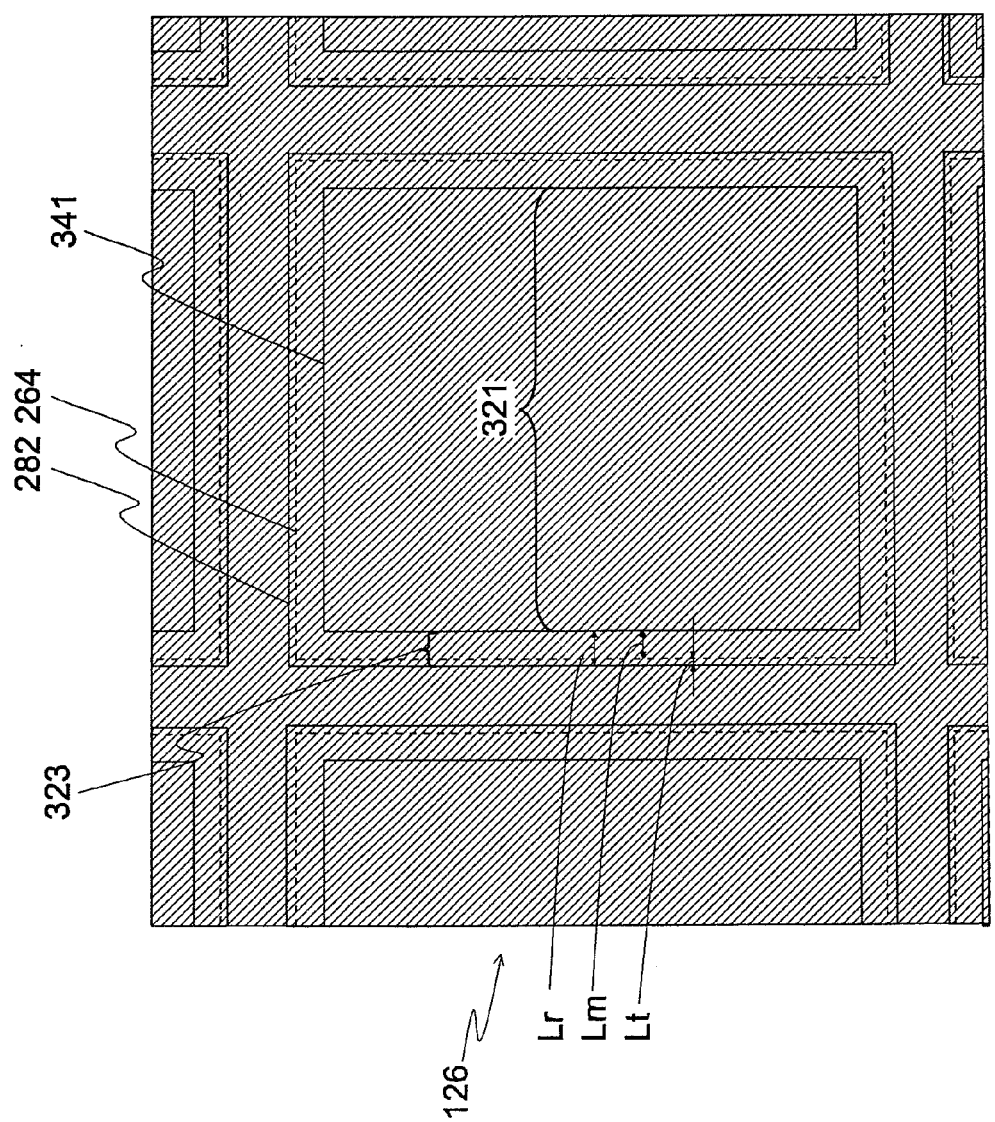
FIG. 26 is a plan view of a region B in the eleventh process of Example 1.

FIG. 26 is a plan view of the region 126.

(Twelfth Process)

With respect to the substrate having the surface state formed in the eleventh process, surface flattening is performed using the CMP (Chemical Mechanical Polishing) method (capacitor interlayer CMP process).

Figure 27:
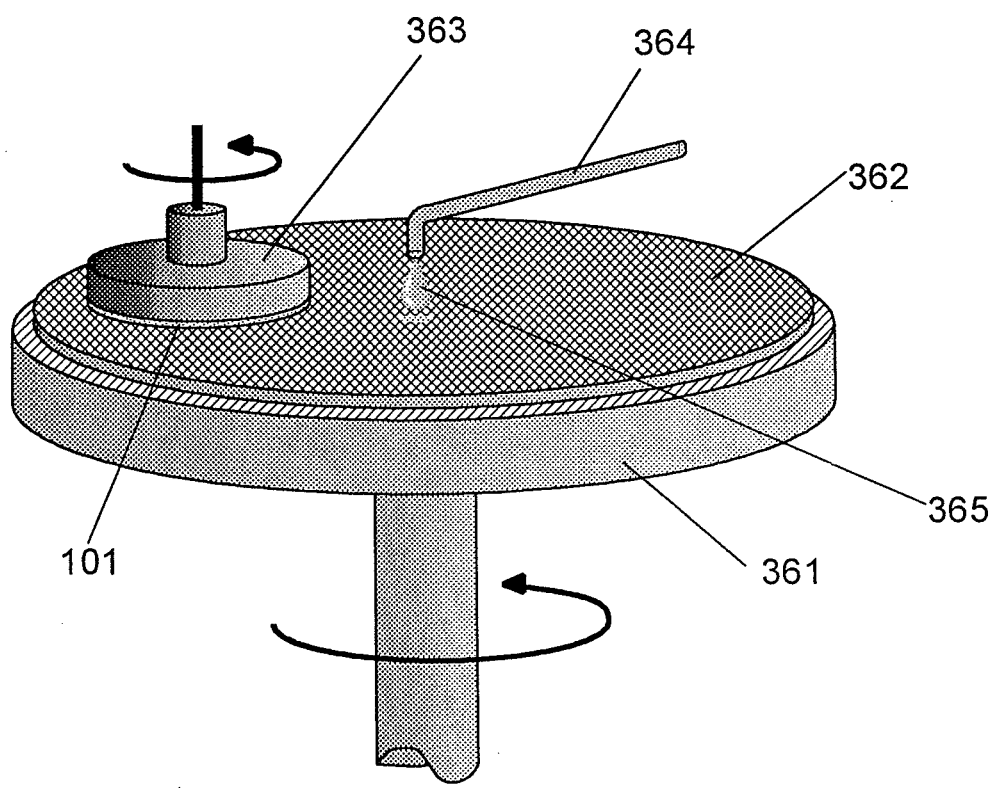
FIG. 27 is a conceptual view schematically illustrating a twelfth process (flattening by a CMP method) of a method of manufacturing a semiconductor device according to an embodiment of the present invention.

FIG. 27 is a conceptual view of the CMP method. A polishing pad 362 is installed on a platen 361. A slurry supply pipe 364 supplying slurry 365 is installed on the polishing pad. The semiconductor wafer 101 is installed on the lower surface of a head 363 so that the surface of the semiconductor wafer 101 faces down.

In this example, the polishing conditions in the main polishing are listed below. Further, in this example, a wafer having a diameter of 300 mm was used as the semiconductor wafer 101.

Polishing pad: Polyurethane foam pad
Slurry: Silica slurry
Polishing load: 4 psi (further, 1 psi=$6.89476 \times 10^3$ Pa)
Platen rotating speed: 60 rpm
Head rotating speed: 61 rpm
Polishing amount: 600 nm (on the non-capacitor region 129)

Figure 28:
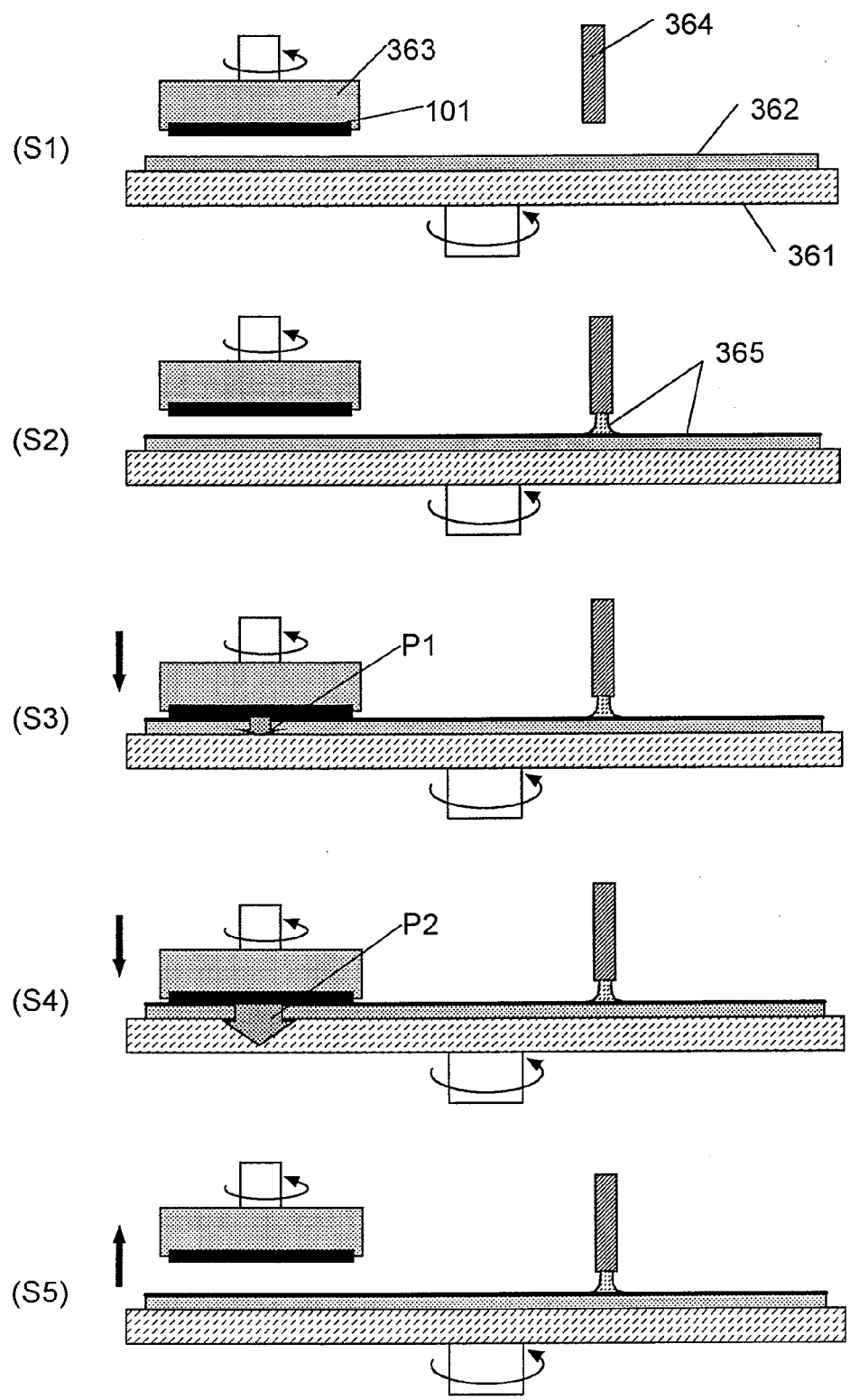
FIG. 28 is a schematic cross-sectional view illustrating respective steps of the twelfth process of the method of manufacturing a semiconductor device according to an embodiment of the present invention.
Figure 29:
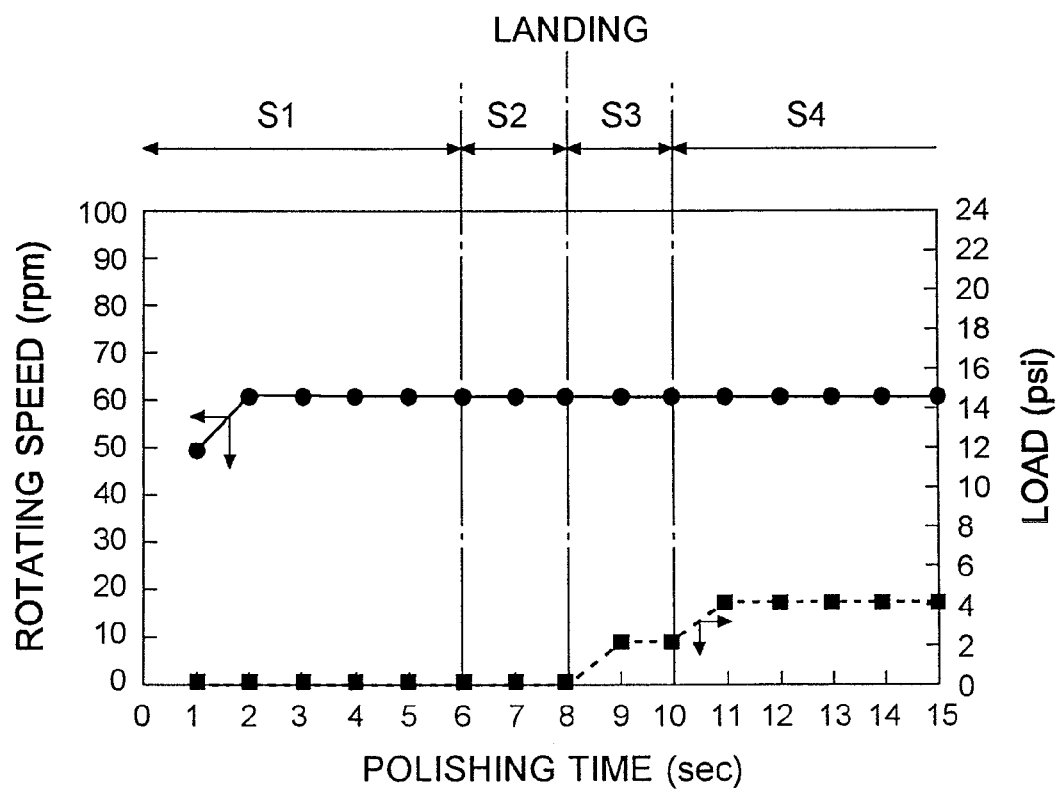
FIG. 29 is a view illustrating an example (condition 1) of a time sequence of the twelfth process of Example 1.

FIG. 28 is a conceptual view of the CMP process, and FIG. 29 illustrates time sequence. In FIG. 29, the left vertical axis represents a platen rotating speed, the right vertical axis represents polishing load, and the horizontal axis represents time. The CMP process in the present invention is performed as below.

(S1): The head 363 on which the semiconductor wafer 101 is mounted and the platen 361 are rotated (In this stage, the polishing pad 362 and the semiconductor wafer 101 are not landed). In this example, the rotating speed of the head 363 and the rotating speed of the platen 361 are set to the same rotating speed through step S1 to step S4 of the main polishing. The rotating speed of the head 363 and the rotating speed of the platen 361 were set on polishing conditions in step S4 of the main polishing. Regarding the rotating speeds, the rotating speed of the head 363 and the rotating speed of the platen 361 were set to be substantially the same rotating speed. By setting the rotating speeds to substantially the same rotating speed, time integration of the relative speed of the polishing pad and the semiconductor wafer becomes uniform and the polishing amount in the semiconductor wafer surface becomes uniform at an arbitrary point in the surface of the semiconductor wafer 101. Here, if there is an uneven portion of the polishing speed in the surface of the polishing pad in a state where the rotating speed of the head 363 and the rotating speed of the platen 361 are set to completely the same rotating speed, a specified region of the semiconductor wafer is frequently cut by the uneven portion of the polishing speed of the polishing pad, and thus the uniformity in the surface of the semiconductor wafer becomes worse. Accordingly, in this example, in order to prevent the occurrence of such problems, the rotating speed of the head 363 and the rotating speed of the platen 361 are set to have a slight difference, and respective regions of the semiconductor wafer become in uniform contact with the polishing pad surface. Specifically, the rotating speed of the platen 361 was set to 60 rpm and the rotating speed of the head 363 was set to 61 rpm, so that there was a difference of 1 rpm between the rotating speed of the head 363 and the rotating speed of the platen 361. Further, if the difference between the rotating speed of the platen 361 and the rotating speed of the head 363 becomes excessively large, the time integration of the relative speeds of the polishing pad and the semiconductor wafer at an arbitrary point in the surface of the semiconductor wafer 101 becomes non-uniform as described above, and thus it is preferable that the difference between the rotating speed of the platen 361 and the rotating speed of the head 363 is within ±20%.

Here, in this example, the distance between the center of the polishing pad and the center of the semiconductor wafer is 17.8 cm, and in the case of the above-described rotating speed, the relative speed of the polishing pad and the semiconductor wafer is obtained to be 1.13 m/sec.

(S2): Supplying of slurry 365 from the slurry supply pipe 364 to the polishing pad 362 starts while the platen 361 and the head 363 are rotated at the above-described rotating speed.

(S3): The semiconductor wafer 101 is landed to the polishing pad 362 by lowering the head 363 while rotating the platen 361 and the head 363 at the above-described rotating speeds. The semiconductor wafer 101 is pressed to the polishing pad 362 with a first load P1 (in this example, 2 psi). This step S3 is called "a landing step".

(S4): The polishing load is increased from P1 to a second load P2 (in this example, 4 psi) and the main polishing is performed while rotating the platen 361 and the head 363 at the above-described rotating speeds. This step S4 is called "a main polishing step".

(S5): The head 363 is lifted upward to separate the semiconductor wafer 101 from the polishing pad 362, and the polishing is finished.

The polishing load P2 of the main polishing in step S4 is not limited to 4 psi, but about 3 to 5 psi can be used. In a region having a small load, the polishing rate becomes excessively late to lengthen the processing time, and there occurs a problem in productivity. Accordingly, about 3 psi or more is preferable. On the other hand, in a region having a large load, the polished interlayer surface is easily damaged. Accordingly, about 5 psi or less is preferable. Based on these, about 3 to 5 psi was used.

Further, the platen rotating speed and the head rotating speed through step S1 to step S4 are not limited to 60 rpm, but 40 to 100 rpm can be used. In a region having a small load, the polishing rate becomes excessively late to lengthen the processing time, and there occurs a problem in productivity. Further, the spread of the slurry on the polishing pad becomes non-uniform, and thus the polishing uniformity is lowered. Accordingly, about 40 rpm or more is preferable. On the other hand, on the side where the rotating speed is high, the polishing rate tended to be saturated when the rotating speed is equal to or more than 100 rpm. Accordingly, it is preferable that the rotating speed is equal to or less than 100 rpm. Based on these, about 40 to 100 rpm was used as the rotating speed. Here, the rotating speed of 40 to 100 rpm becomes 0.75 to 1.88 m/sec if the rotating speed is expressed in terms of the relative speed of the polishing pad and the semiconductor wafer.

In the CMP, since higher pressure is applied to the projected portion in comparison to the flat portion, the polishing speed in the projected portion becomes higher in comparison to the polishing speed in the flat portion. As a result, the projected portion is easily removed with a smaller amount of polishing in comparison to the flat portion. In this example, the polishing is performed so that the polishing amount of the capacitor interlayer 281 in the portion of the non-capacitor region 129 becomes 600 nm. By this polishing, all the capacitor interlayer protrusion portions 323 having a height of about 1.5 μm in the memory capacitor array 265a and the first peripheral capacitor array 265b were removed through polishing, and global flattening was performed from the region of the capacitor array 265 (capacitor region) to the non-capacitor region 129 through cutting of 600 nm.

Although the step height reduction etching was not performed in the second peripheral capacitor array 265c, the capacitor interlayer projected portion 281c having the step height of 1.5 μm was removed by polishing, and the global flattening was performed from the capacitor region to the non-capacitor region 129 through cutting of 600 nm. According to the study of the inventors, if the width of the protrusion portion and the projected portion of the capacitor interlayer 281 is equal to or smaller than 10 μm, it could be considered as a fine pattern, and thus it could be easily removed with a small amount of polishing of about 600 nm to achieve the global flattening.

Figure 30:
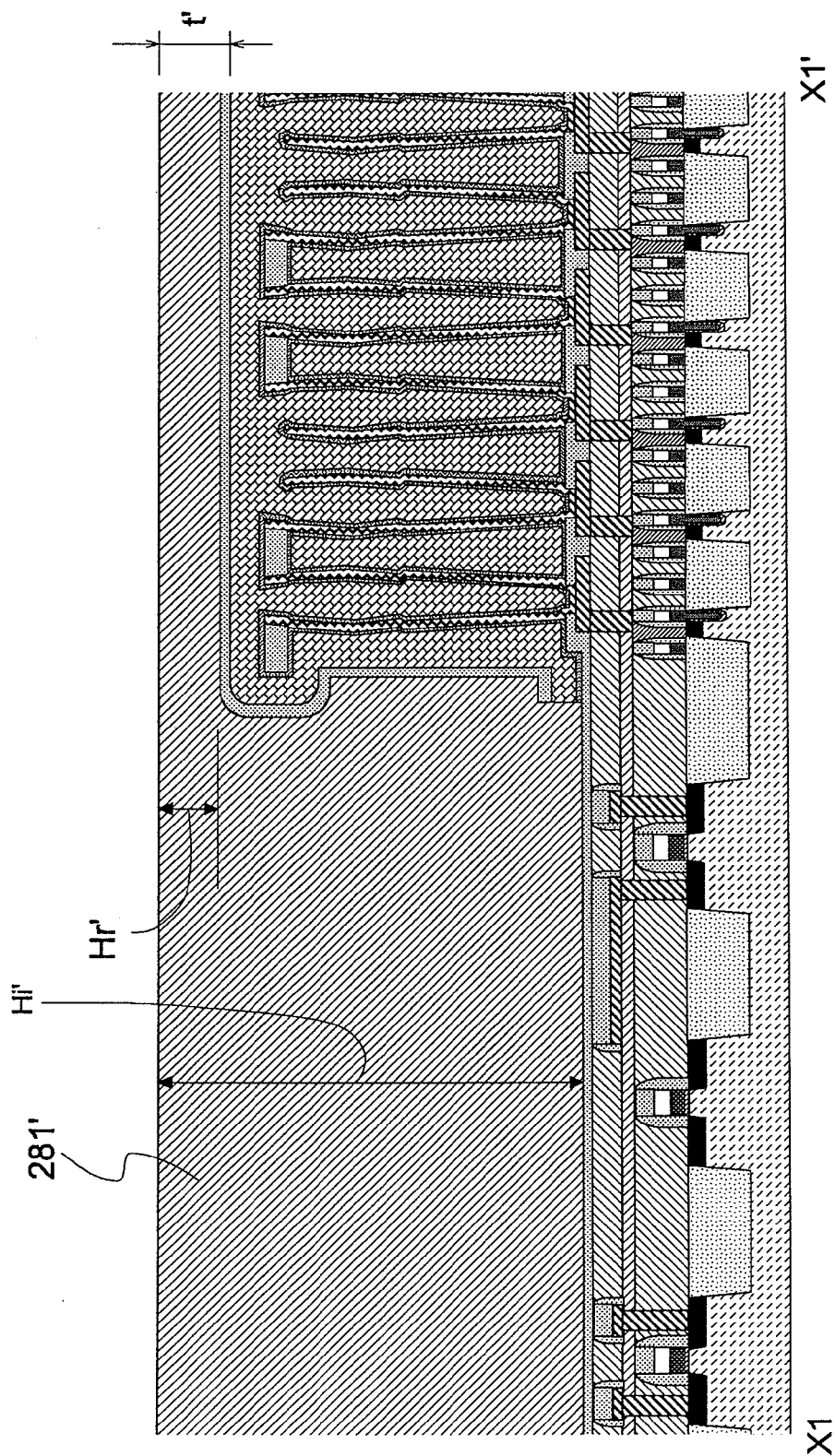
FIG. 30 is a cross-section view taken along a line X1-X1' of FIG. 1(d) after the twelfth process of Example 1.
Figure 31:
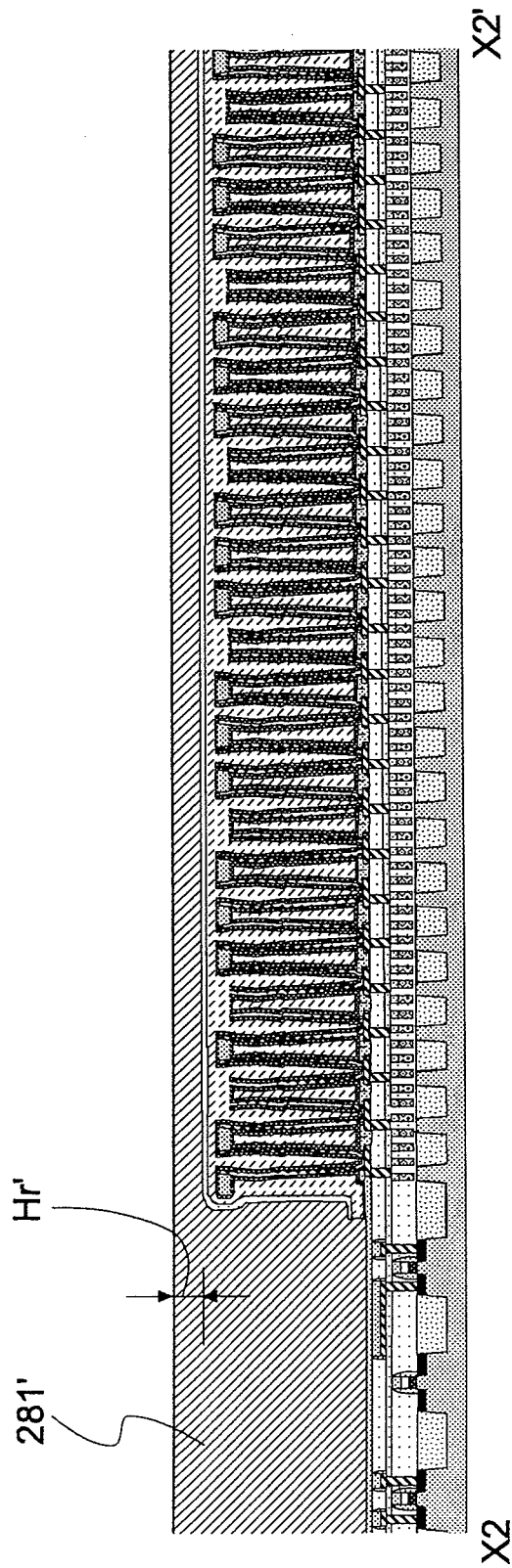
FIG. 31 is a cross-section view taken along a line X2-X2' of FIG. 1(d) after the twelfth process of Example 1.

FIGS. 30 to 32 illustrate the state after the CMP of the capacitor interlayer. FIG. 30 is a cross-section view taken along a line X1-X1' of FIG. 1(d), and FIG. 31 is a cross-section view taken along a line X2-X2' of FIG. 1(d). FIG. 32(a) is a cross-section view taken along a line X3-X3' of FIG. 1(c), FIG. 32(b) is a cross-sectional view taken along a line XI-XI' of FIG. 1(e), and FIG. 32(c) is a cross-sectional view taken along a line XJ-XJ' of FIG. 1(f).

After the CMP of the capacitor interlayer, the thickness of the remaining film of the capacitor interlayer 281 that remains on the capacitor array 265 is indicated by $H_{r'}$. $H_{r'}$ was about 200 nm in the memory capacitor array 265a, the first peripheral capacitor array 265b, and the second peripheral capacitor array 265c. Here, if the thickness of the insulating film on the capacitor upper electrode conductive film 262 is indicated by t', t' becomes the total thickness of the capacitor upper electrode cap film 266 having a thickness of 100 nm and the capacitor interlayer 281 having the thickness ($H_{r'}$=200 nm), that is, t'=300 nm. In view of manufacturing convenience, t' was managed to be at least 200 to 400 nm.

Further, the thickness of the capacitor interlayer 281 in the non-capacitor region 129 is indicated by $H_{l'}$. $H_{l'}$ was 1.7 μm through cutting of 0.6 μm from 2.3 μm.

Here, a defect observation was made with respect to the surface state of the semiconductor wafer after performing the CMP of the capacitor interlayer, and the inventors had found that a defect in which the capacitor interlayer was recessed (dent defect) occurred in a wide range. As a result of the inventors' studies, it was found that the occurrence of the dent defect could be suppressed by making the aspect ratio ($H_d$/Lr) that is made by the horizontal width Lr and the height $H_d$ of the capacitor interlayer protrusion portion 323 equal to or less than a predetermined value. This will be explained in detail in the experiments described later.

(Thirteenth Process)

Figure 33:
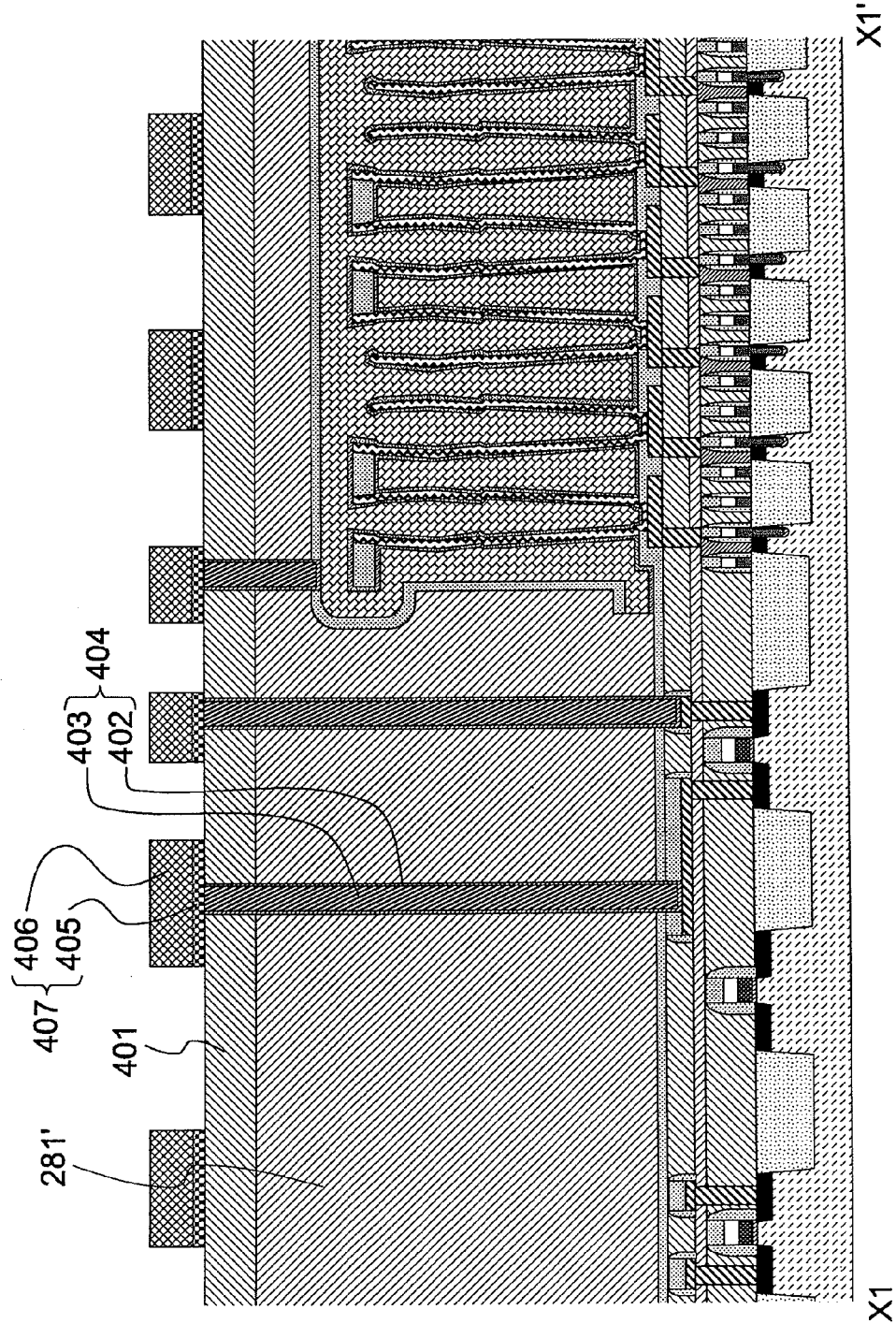
FIG. 33 is a cross-section view taken along a line X1-X1' of FIG. 1(d), illustrating a thirteenth process of Example 1.
Figure 34:
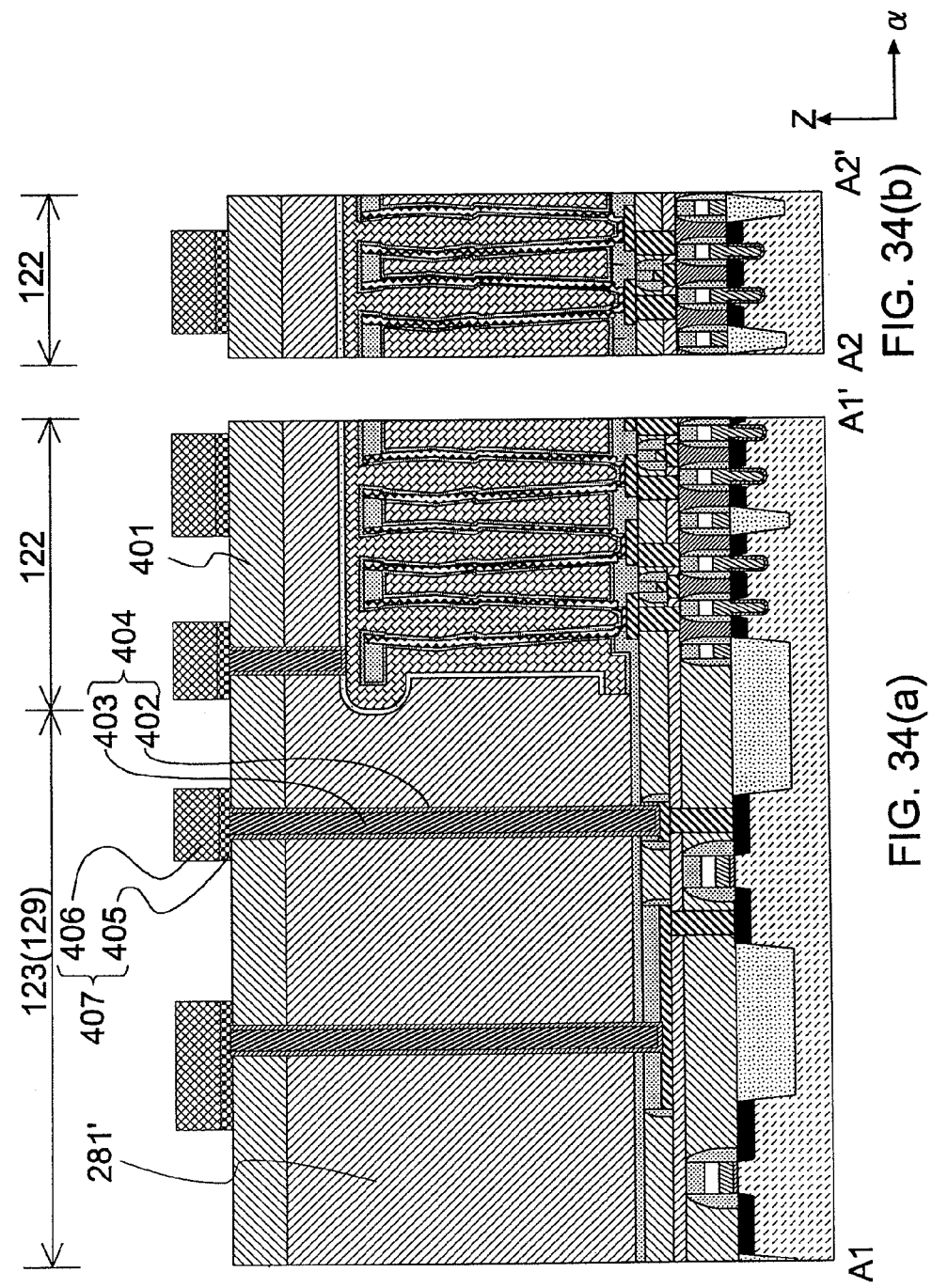

Next, as illustrated in FIGS. 33 and 34, an additional capacitor interlayer 401 is additionally grown on the capacitor interlayer 281' of which the CMP process has been performed. The additional capacitor interlayer 401 was formed to recover the defect through embedding of a portion in which a fine defect such as a scratch was formed in order to protect the portion in which the thin interlayer was partially formed on the capacitor upper electrode 263. A silicon oxide film was formed with a thickness of 200 nm by a plasma CVD method. The additional capacitor interlayer 401 can be omitted if it is not necessary.

An upper contact plug 404 that is connected to the capacitor upper electrode conductive film 262 and the first wiring 62 is formed from the upper surface of the additional capacitor interlayer 401. The upper contact plug 404 is composed of a barrier layer 402 and a plug layer 403.

On the upper contact plug 404, a second wiring 407 is formed as a peripheral circuit wiring. The second wiring 407 is composed of a wiring barrier layer 405 and a main wiring layer 406.

Thereafter, as needed, the interlayer insulating film, contact, wiring, passivation film are formed to complete a device.

Further, FIG. 33, which illustrates the thirteenth process, is a cross-sectional view taken along a line X1-X1' of FIG. 1(d), and FIGS. 34(a) and 34(b) are cross-sectional views taken along lines A1-A1' and A2-A2' of FIG. 1(d).

(Dent Defect Evaluation)

In the CMP of the capacitor interlayer, a defect observation was made with respect to the surface state of the semiconductor wafer after CMP, and it has been found in studies by the inventors that a defect in which the capacitor interlayer is recessed (dent defect) occurred in a wide range.

Figure 35:
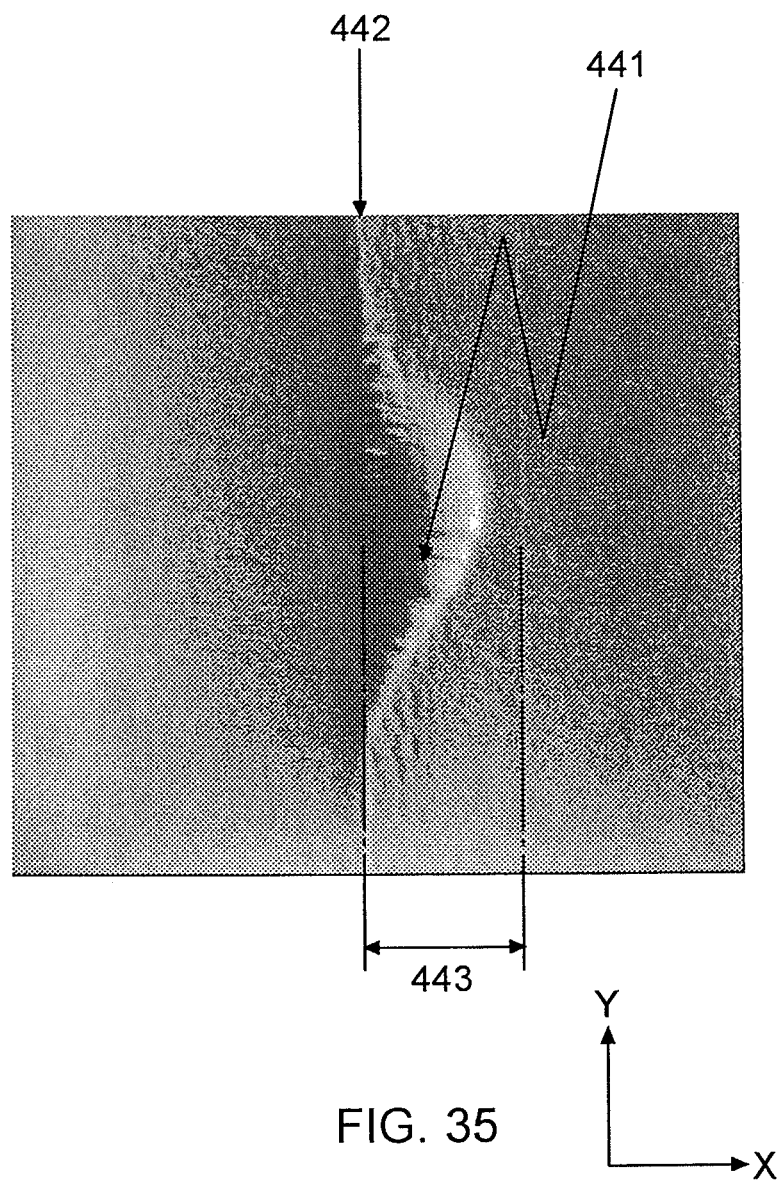
FIG. 35 shows an SEM image illustrating an example of dent defects.

An example of the observed dent defect 441 is shown in FIG. 35. FIG. 35 is an SEM image viewing from above after CMP. The Y direction indicated by an arrow 442 corresponds to the position of the etched side surface 342 of the capacitor interlayer protrusion portion 323. The right region 443 on the line of the arrow 442 corresponds to the portion in which the capacitor interlayer protrusion portion 323 was formed. The dent defect 441 has a planar shape which extends in a linear shape in the Y direction according to the arrow 422, and is bulged in a bow shape in the X direction. The X-direction width is substantially in the range of a region 443, and the Y-direction width is substantially two or three times the width of the region 443. The dent defect has a recessed shape that is sculpted in the substrate depth direction. From this shape, the capacitor interlayer protrusion portion 323 appears to be stripped in the right direction with the capacitor interlayer of the bottom of the protrusion portion 323.

In the portion in which such a large dent defect is formed, in the subsequent step, a peripheral contact and a peripheral circuit wiring are formed, too. In forming the peripheral contact, there was a problem that causes opening inferiority during the forming of the resist mask using the lithographic technology. Further, in forming the peripheral contact plug, when the contact hole is buried with the contact plug material through a CMP, the contact plug material that is embedded and formed in the dent defect was not removed, but remains therein, and thus the peripheral circuit wiring formed thereon is short-circuited through the contact plug material embedded in the dent defect. Further, in forming the peripheral circuit wiring, since the peripheral circuit wiring is formed in design dimensions of one-severalth to one-few tenths in comparison to the size of the dent defect, a lithographic pattern of the peripheral circuit wiring formation could not be formed in the dent defect portion, and the pattern inferiority such as wiring open and short circuit between neighboring wirings occurred. Further, it was difficult to remedy the defect formation of neighboring contact and peripheral circuit wiring, and such defect occurrence was directly linked to the defective product. Further, the dent defect not only stripped the interlayer off but also applied stress to the capacitor, and thus the increase of leakage and reliability inferiority of the capacitor occurred to cause the occurrence of inferiority in a large area in the unit of several thousand bits. It was difficult to remedy the inferior bits occurred in such a large area through redundancy cells, and was directly linked to the defective product. As described above, the occurrence of the dent defect is liable to be linked to the defective product, and causes a yield loss of one wafer.

Accordingly, it could be known that the occurrence of the dent defect should be suppressed to 100 defects per wafer, and preferably 0 defect.

Further, in the case where the dent defects are formed, a method of forming and embedding an insulating film that is thicker than the size of the dent defect, performing polishing in the CMP method, and then performing re-embedding may be considered. This method, for example, may be performed during growing of the additional capacitor interlayer 401 that is formed in the thirteenth process. However, according to this method, a process of growing a thick film over several μm or more and a process of CMP-polishing such a thick film are performed, and this causes significant cost increases. Further, even though the repair is performed in this method, the stress is applied to the below capacitor, and thus the defect that causes the damage cannot be repaired. Accordingly, it is required to suppress the occurrence of the dent defect itself.

The inventors estimated the causes of dent defects as follows.

The capacitor interlayer protrusion portion 323 has an etched side surface 342 that is substantially in a vertical shape and a front end that has an edge 341 of which the cross-sectional surface is substantially right-angled in the portion that is opened by the step height reduction etching (FIG. 24). Since the width Lr of the capacitor interlayer protrusion portion 323 is equal to or larger than the horizontal width Lt of the capacitor interlayer protrusion arc-shaped portion 281c, the capacitor interlayer protrusion portion 323 has about the thickness $H_t$ of the capacitor interlayer 281 and a large width that is equal or larger than 1 μm. The etching amount $H_d$ is equal to the height $H_c$ of the capacitor, which has a large value that is equal to or larger than 1 μm.

FIG. 36 is a view illustrating a polishing process (steps S3 and S4) of the semiconductor wafer 101 on which such a capacitor interlayer protrusion portion 323 is formed. FIG. 36 illustrates a situation that the semiconductor wafer 101 moves to the left side and the polishing pad 362 moves to the right side. The left end of the protrusion portion formed on the semiconductor wafer receives a stress from the polishing pad. The capacitor interlayer protrusion portion 323 has an asymmetric structure, and the portion that corresponds to the polishing pad 362 and the edge 341 is called a landing point A (LP-A) and the portion in which the polishing pad 362 and the capacitor interlayer protrusion arc-shaped portion 281c are grounded is called a landing point B (LP-B). Since the polishing is performed in a state where the polishing pad 362 is pushed to the semiconductor wafer 101, the edge 341 is in a substantially right-angled shape at the landing point A, and the polishing pad 362 is strongly caught in the edge 341. Further, since the etched side surface 342 has a height that is equal to or higher than 1 μm, the polishing is performed in a state where the polishing pad 362 is deeply covered on the capacitor interlayer protrusion portion 323. Accordingly, to the edge 341 and the side surface of the landing point A, a very large force is applied. Further, the platen and the head, which have different diameters, are rotated in the same direction. Although the force is not applied to the capacitor interlayer protrusion and projected portions always in a constant direction, the largest force is taken when the force is applied in a direction that is orthogonal to the etched side surface 342. Accordingly, by rotation, a stress load is applied to all edges 341 of four sides of the opening 321 as illustrated in FIG. 26.

Further, it is presumed that if the width of the capacitor interlayer protrusion portion 323 is narrow, the force makes the interlayer peel off from the base to be missing. In the missing portion, the dent defect, in which the surface of the capacitor interlayer 281 is recessed over a wide range, remains. The dent defect has a size of a horizontal width that is approximately same to the horizontal width of the capacitor interlayer protrusion portion 323 and a length of several μm in the extending direction of the capacitor interlayer protrusion portion 323. Further, the depth is about a half of the horizontal width of the capacitor interlayer projected portion, which is in the range of several hundred nm to several μm.

Further, at the landing point B, since the sloping surface is in a slow arc shape, the polishing pad 362 is hard to be caught, and thus it is considered that the dent defect scarcely occurs. Actually, in the defect observation, the dent defect seen to be caused by the landing point B was not found.

Accordingly, it was presumed that the dent defect was caused by the catching of the polishing pad 362 in the edge portion 341 of the capacitor protrusion portion 323. It was examined whether the dent defect occurred due to the above-described cause changed the size of the capacitor interlayer projected portion to change the frequency of occurrence.

EXPERIMENTAL EXAMPLE 1

In changing the size of the capacitor interlayer protrusion portion 323, wafers having a different width Lr were manufactured. In the ninth process, a reticle having a changed distance Lm between the capacitor array end 264 and the step height reduction resist mask opening end 303 was prepared, and the width Lr was changed using the reticle. Specifically, four kinds of reticles having changed distances Lm of 0.4 μm, 1.5 μm, 2.5 μm, and 4.5 μm were prepared, and the step height reduction etching was performed using the reticles to change the width Lr of the capacitor interlayer protrusion portion 323. In this Experimental Example, in the same manner as example 1, Lt was 1.5 μm, and Lr was formed to be 1.9 μm, 3 μm, 4 μm, and 6 μm to correspond to the four kinds of Lm. The height $H_d$ of the formed capacitor interlayer protrusion portion 323 was set to 1.5 μm.

Figure 37A:
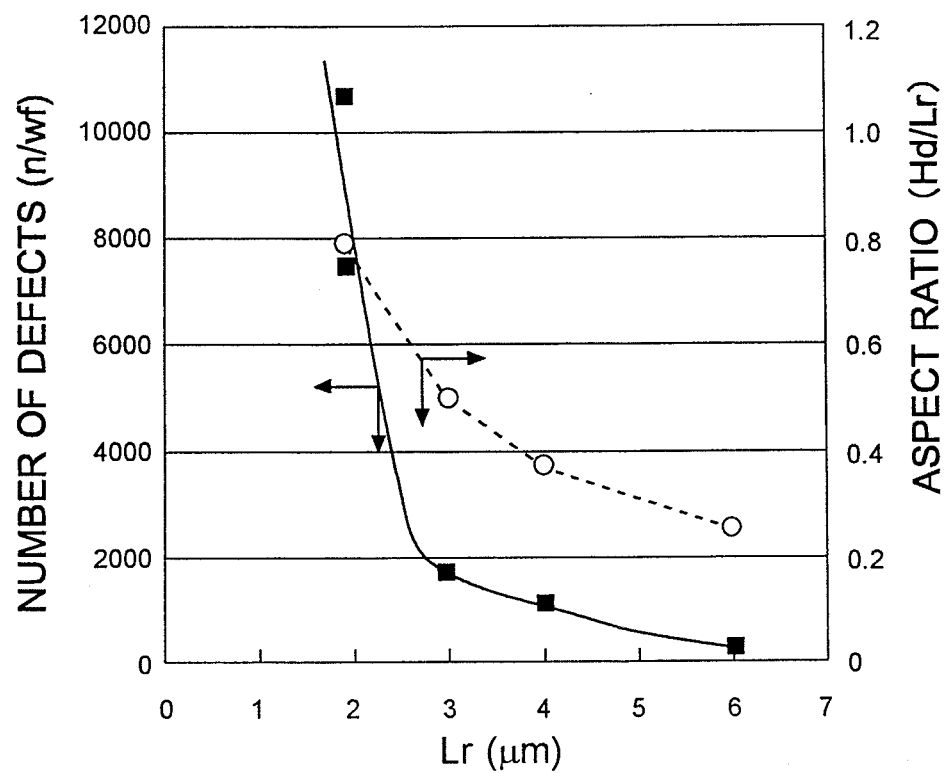
FIG. 37(a) is a graph illustrating a relationship between the width Lr of a capacitor interlayer insulating film obtained in Experimental Example 1 and dent defects and a relationship between the width and an aspect ratio.
Figure 37B:
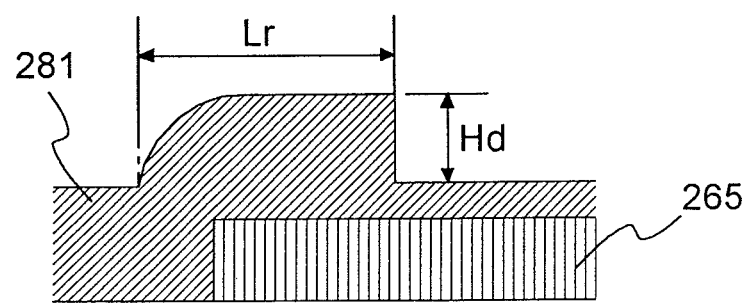
FIG. 37(b) is a conceptual view illustrating the aspect ratio ($H_d/Lr$).

The four kinds of wafers pass through the same processes as the tenth process and the eleventh process of Example 1, and in the same method as the twelfth process, the polishing was performed using the CMP method. The defects of the wafer surfaces of the four kinds of wafers were investigated using a defect detection device. The result of the investigation was shown in FIG. 37. FIG. 37(a) is a graph illustrating a relationship between the width Lr of the capacitor interlayer protrusion portion and the number of the dent defects and a relationship between the width and the aspect ratio, and FIG. 37(b) is a schematic view illustrating the aspect ratio ($H_d$/Lr).

In the graph of FIG. 37(a), a solid line (black square) indicates the number of dent defects per wafer with respect to Lr. In the case of Lr=1.9 μm, defects of 10,000 levels occurred. As Lr becomes longer, the number of defects becomes smaller, an inflection point is shown when the aspect ratio is 0.6. Further, in the case of Lr=3 μm, the number of defects was reduced to 2,000 or less, and in the case of Lr=4 μm, the defects of 1,000 levels were still observed. They are not usable levels. However, as illustrated in Experimental Example 3 to be described later, it is possible to reduce the levels to the usable levels by changing the polishing condition. By contrast, in the case of widening the width Lr up to 6 μm, the number of levels is reduced to 100 levels even on the condition in this experimental example (polishing condition in example 1), which is the level at which the products can be obtained.

As Lr becomes larger, the aspect ratio ($H_d$/Lr) of the capacitor interlayer protrusion portion 323 becomes smaller. A dashed line (white circle) indicates aspect ratios of the respective Lr (right axis). The capacitor interlayer protrusion portion 323 is in a pillar shape as seen from the cross-section, and a moment that acts on the protrusion portion is considered to depend upon the aspect ratio. That is, it can be considered that, by making the aspect ratio smaller, the moment that is applied to the protrusion portion becomes smaller, and the force that is applied to the bottom surface of the capacitor interlayer protrusion portion 323, which is a strength surface, becomes lower to suppress the occurrence of the dent defects. Lr=6 µm corresponds to the aspect ratio of 0.25, and in order to suppress the occurrence of the dent default down to the level at which the products can be obtained on the above-described polishing condition, it is preferable to make the aspect ratio 0.25 or less. Here, since $H_d$ is substantially equal to the height $H_s$ of the protrusion portion and the height $H_s$ of the protrusion portion is substantially equal to the capacitor height $H_c$, the width Lr of the capacitor interlayer protrusion portion 323 is at least four times the capacitor height $H_c$ in order to make the aspect ratio 0.25 or less. Further, the width Lr of the protrusion portion 323 of the capacitor interlayer 281 is set to about 10 µm or less as a fine pattern in the CMP method.

In order to make the aspect ratio 0.25 or less, in the case of $H_d$=1.5 µm, Lr is secured to be 6 µm or more. Here, in order to obtain the shape that satisfies the aspect ratio of 0.25 or less, $H_d$ can be made thin instead of lengthening the Lr. However, if the $H_d$ is made thin, the remaining film $H_r$ of the capacitor interlayer 281 is formed to be thick during the step height reduction etching, and thus the polishing amount in the capacitor interlayer CMP process is increased. Further, since there is a problem in that the global step height is liable to occur from the capacitor array 265 to the non-capacitor region 129, it is applicable in the case where the problems cause no trouble.

From the foregoing description, if the planar shape of the capacitor interlayer projected portion is a rectangle having a short side and a long side, the width L2 of the capacitor interlayer projected portion mainly indicates the width of the short side. In the CMP method, since large stress is distributed on the end portions of the protrusion portion and the projected portion, the polishing is performed faster in the end portion (capacitor interlayer protrusion arc-shaped portion 281c) and the edge 341 rather than in the flat portions 281b of the protrusion portion and the projected portion. That is, since the protrusion portion and the projected portion are removed so that the polishing is performed in the direction of the short side, the easiness of polishing depends upon the length of the short side. Further, in the case of forming the opening 321, it is determined whether the opening 321 is formed on the basis of the width that faces the intermediate portion of the long side of the projected portion, that is, the width of the short side of the projected portion.

In the present invention, as the capacitor interlayer 281, the silicon oxide film was formed in the plasma CVD method. However, the manufacturing method is not limited thereto, and other methods such as low pressure CVD method that do not greatly affect the capacitor characteristics may be used. According to these methods, the capacitor interlayer 281 is formed on the capacitor array 265 with a thickness almost substantially equal to the thickness of the non-capacitor region 129, and thus the present invention is effectively applied.

EXPERIMENTAL EXAMPLE 2

In Experimental Example 2, a method of suppressing the dent defect with respect to the polishing condition of the capacitor interlayer CMP is given.

Up to the eleventh process of Example 1, the processes are performed in the same manner as Example 1.

In the capacitor interlayer CMP of the twelfth process of Example 1, the sequence of the CMP was changed, and the polishing was performed on three kinds of conditions.
(Condition 1)

Condition 1 is the same as the condition in Example 1, and the time sequence is shown in FIG. 29.
(Condition 2)

Figure 38:
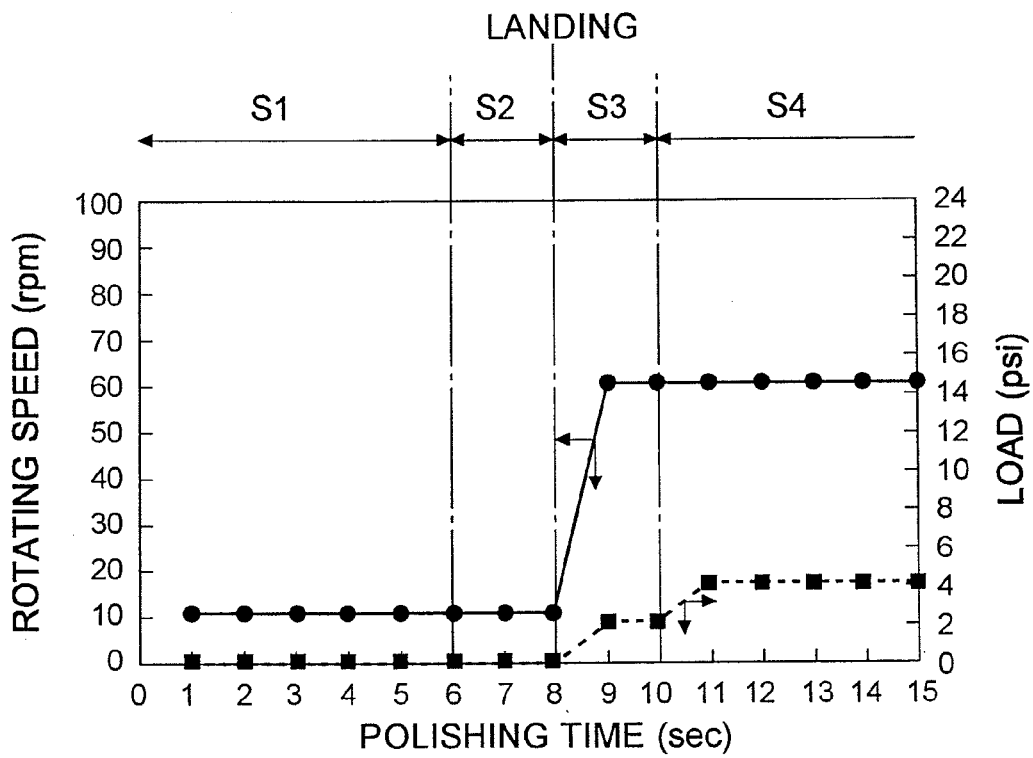
FIG. 38 is a view illustrating another example (condition 2) of the time sequence of the twelfth process of Example 1.

On condition 2, in the landing step S3, the landing is performed at low rotating speed of 10 rpm. The time sequence of condition 2 is shown in FIG. 38.

(S1): The head 363 on which the semiconductor wafer 101 is mounted and the platen 361 are rotated at low speed (In this stage, the semiconductor wafer 101 and the polishing pad 362 are not contacted). Regarding the rotating speeds, the rotating speed of the platen was set to 10 rpm, and the rotating speed of the head was set to 10 rpm. This rotating speed becomes 0.19 m/sec if the rotating speed is expressed in terms of the relative speed of the polishing pad and the semiconductor wafer.

(S2): The supply of slurry 365 from the slurry supply pipe 364 to the polishing pad 362 starts while the platen and the head are rotated at the above rotating speed.

(S3): The semiconductor wafer 101 is landed on the polishing pad 362 by lowering the head 363 while rotating the platen and the head at the above rotating speeds. The semiconductor wafer 101 is pressed to the polishing pad 362 with a load of 2 psi. During the landing, as the rotating speed of the semiconductor wafer 101 and the rotating speed of the polishing pad 362, a low rotating speed that is ⅙ of the speed on condition 1 is used.

This rotating speed 10 rpm is too low for the main polishing that performs the polishing of the semiconductor wafer, and may cause a problem in productivity. In the main polishing in step S4, the rotating speed of 40 to 100 rpm is preferable as described in Example 1. In this Experimental Example, 60 rpm is used in the same manner as Example 1, and thus the rotating speed is increased from 10 rpm to 60 rpm. The rotating speed is increased in a manner that the rotating speed of the platen and the head is increased from 10 rpm to 60 rpm for one second while pressing the semiconductor wafer 101 onto the polishing pad 362 with 2 psi. The rotating acceleration during the increase of the rotating speed is about 50 rpm/sec. This acceleration is about 0.94 m/sec² if the rotating acceleration is expressed in terms of the relative speed of the semiconductor wafer and the polishing pad.

(S4): Next, main polishing is performed. In the same manner as the step S4 of Example 1, the rotating speed of the platen was set to 60 rpm, the rotating speed of the head was set to 61 rpm, and the polishing load was increased from 2 psi to 4 psi. The speed of the platen and the head is about 1.13 m/sec if the speed is expressed in terms of the relative speed of the polishing pad and the semiconductor wafer.

(S5): The head 363 is lifted upward to separate the semiconductor wafer 101 from the polishing pad 362, and the polishing is finished.
(Condition 3)

Figure 39:
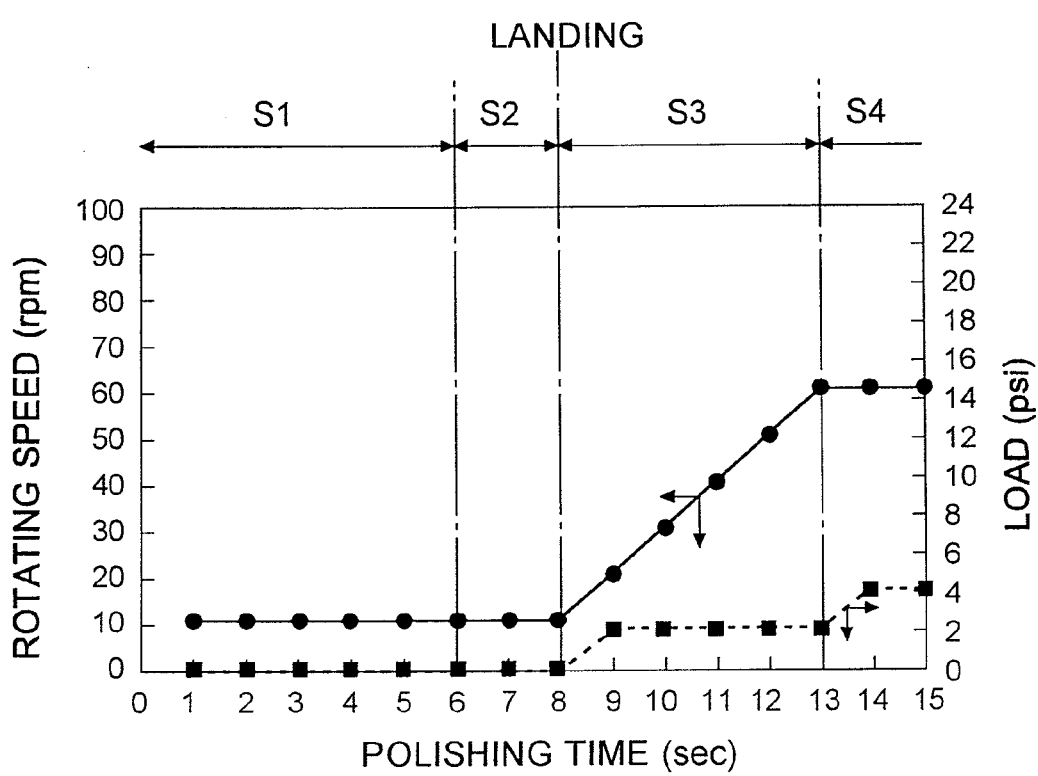
FIG. 39 is a view illustrating still another example (condition 3) of the time sequence of the twelfth process of Example 1.

On condition 3, in the step S3 on condition 2, after landing, the rotating acceleration when the rotating speed of the platen and the rotating speed of the head were increased was set to low acceleration. The time sequence of condition 3 is shown in FIG. 39.

(S1) and (S2) are the same as those on condition 2.

(S3): The semiconductor wafer 101 is landed on the polishing pad 362 by lowering the head 363, and the semiconductor wafer 101 is pressed to the polishing pad 362 with a load of 2 psi while rotating the platen and the head at the rotating speed of 10 rpm, respectively. Up to now, the condition is the same as condition 2.

Next, the rotating speed of the platen and the head is gradually increased from 10 rpm to 60 rpm for five seconds while pressing with a load of 2 psi. The rotating acceleration during the increase of the rotating speed is about 10 rpm/sec. This value is a small value that is ⅕ of the acceleration on condition 2. This acceleration is about 0.19 m/sec² if the speed is expressed in terms of the relative speed of the semiconductor wafer and the polishing pad.

(S4) and (S5) are the same as those on condition 2.

Polishing was performed while changing the condition of the capacitor interlayer CMP to the three conditions, respectively, to manufacture three kinds of wafers. The occurrence of dent defects was investigated with respect to the three conditions.

Figure 40:
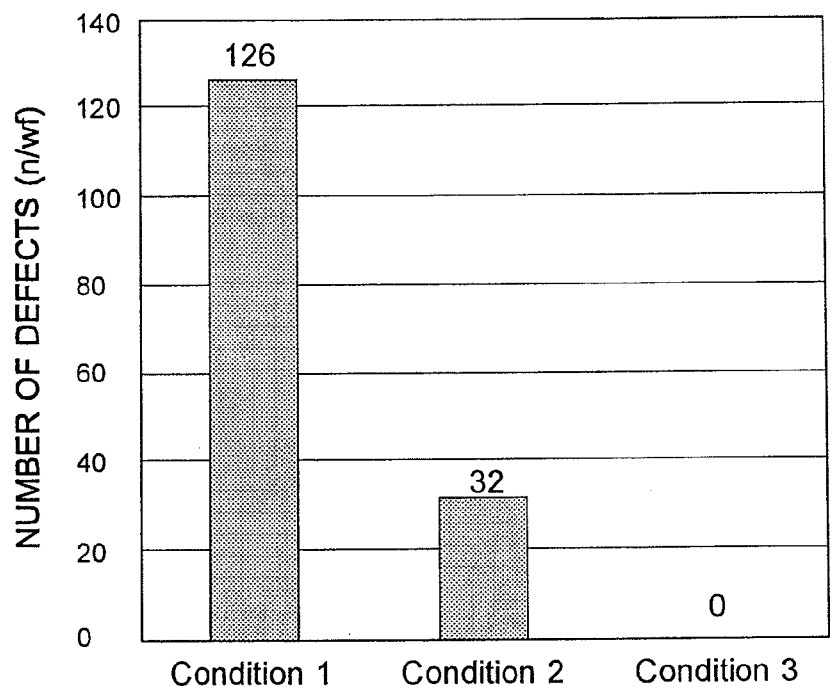
FIG. 40 is a view illustrating a change of the number of dent defects due to the difference in polishing conditions in the twelfth process of Example 1.

FIG. 40 is a view illustrating the result of investigation of the dent defects after performing the capacitor interlayer CMP on conditions 1, 2, and 3, with respect to the wafer on which the capacitor protrusion portion is formed.

According to condition 1, 2, and 3, the number of dent defects was reduced to 126, 32, and 0.

By comparing the results on condition 1 and condition 2, it can be known that through performing of the polishing at a low rotating speed of 10 rpm of the platen and the head when the semiconductor wafer and the polishing pad are landed, the number of dent defects is suppressed to about ¼ of the number of dent defects during polishing at the speed of 60 rpm. That is, by decreasing the rotating speed during the landing, an impact during the landing can be reduced, and the peel-off of the protrusion portion can be effectively suppressed. As the polishing conditions, it could be known that the rotating speed was set to 10 rpm or less (in terms of the relative speed of the semiconductor wafer and the polishing pad, 0.19 m/sec or less), the load during the landing was set to 2 psi or less.

According to condition 2 and condition 3, a low rotating speed of 10 rpm was used when the semiconductor wafer and the polishing pad are landed, but the accelerations when the rotating speed is increased to 60 rpm in the main polishing step were different from each other. By comparing the results on condition 2 and condition 3, the number of dent defects could be reduced through the decrease of the acceleration when the rotating speed of the semiconductor wafer and the polishing pad was increased, and on condition 3, the number of dent defects was suppressed to the extent that almost no dent defect occurred. In the case where the acceleration is increased during the increase of the rotating speed, an abrupt stress change occurs in the protrusion portion, and this causes the peel-off of the protrusion portion. The rotating acceleration when the rotating speed is increased after the landing of the semiconductor wafer on the polishing pad is set to 10 rpm or less (in terms of the relative speed of the semiconductor wafer and the polishing pad, 0.19 m/sec² or less), and the load during the landing is set to 2 psi or less.

In the present invention, it is preferable that the rotating speed when the semiconductor wafer and the polishing pad are contacted is about 10 rpm, and thus the occurrence of the dent defects is further suppressed. Further, by performing the main polishing through increasing of the rotating speed that is higher than the rotating speed during the landing, the polishing can be performed without lowering the productivity. Further, it is preferable to decrease the rotating acceleration when the rotating speed is increased from the rotating speed during the landing to the rotating speed during the main polishing, and thus the occurrence of the dent defects can be further suppressed.

EXPERIMENTAL EXAMPLE 3

On Experimental Example 3, the width Lr of the capacitor interlayer protrusion portion was changed to 3 μm, and the occurrence of the dent defects according to the conditional difference between condition 1 and condition 3, in comparison to the case of Experimental Example 2 (Lr is 6 μm, aspect ratio $H_d/Lr$ is 0.25), was investigated.

Figure 41:
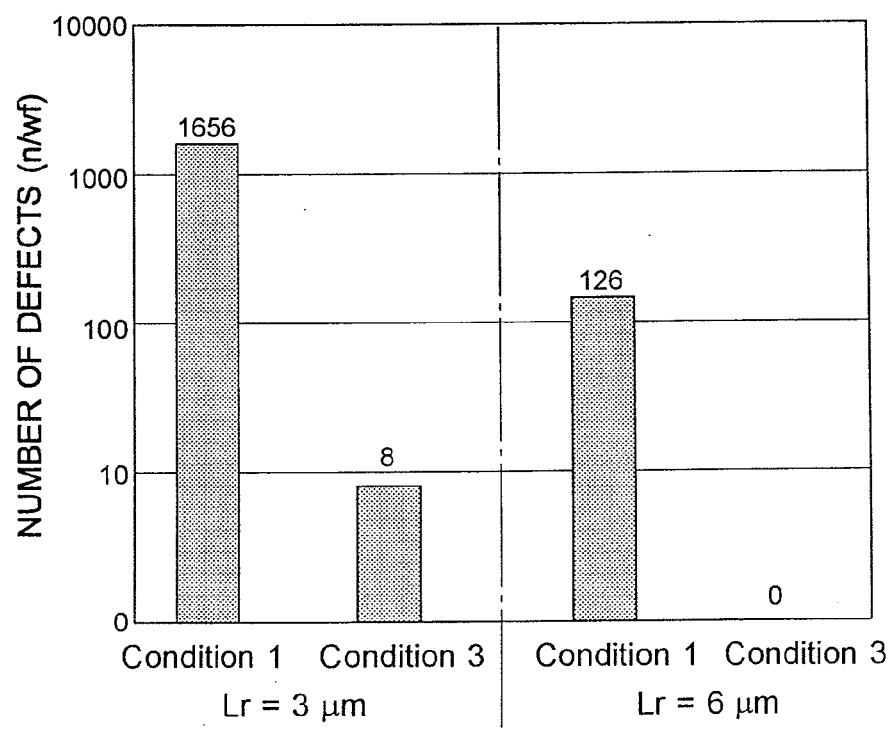
FIG. 41 is a view illustrating a change of the number of dent defects due to the difference in polishing conditions and the length Lr in the twelfth process of Example 1.

The result of defect investigation is shown in FIG. 41.

When Lr was 3 μm, on condition 1, 1,000 or more defects occurred, but on condition 3, the defects were reduced down to several levels.

That is, on condition 3, the defects could be reduced in comparison to the case where condition 1 was performed with Lr=6 μm.

From the foregoing, it appeared that decreasing of the rotating speed of the head and the platen when the semiconductor wafer and the polishing pad were contacted and decreasing of the acceleration when the rotating speeds of the platen and the head were increased after the semiconductor wafer and the polishing pad were contacted were effective even in the case where the width Lr of the protrusion portion is 3 μm and the aspect ratio $H_d/Lr$ is 0.5. Further, it could be known that by setting the width Lr to 6 μm and the aspect ratio $H_d/Lr$ to 0.25, the occurrence of the dent defects could be reduced down to 0 to several levels, which exert almost no influence on the yield of the product. As a result of the Experimental Examples 1 to 3, by making the aspect ratio 0.6 or less of the inflection point illustrated in FIG. 37(a), it is understood that it is feasible. More preferably, the aspect ratio is set to 0.25 or less.

MODIFIED EXAMPLE 1

In Example 1, a case of forming the capacitor support 221 is exemplified. However, if there is no problem in the mechanical strength of the capacitor lower electrode 201, the capacitor support 221 can be omitted. An example of a case where the capacitor support 221 is not formed is shown as Modified Example 1.

Figure 42A:
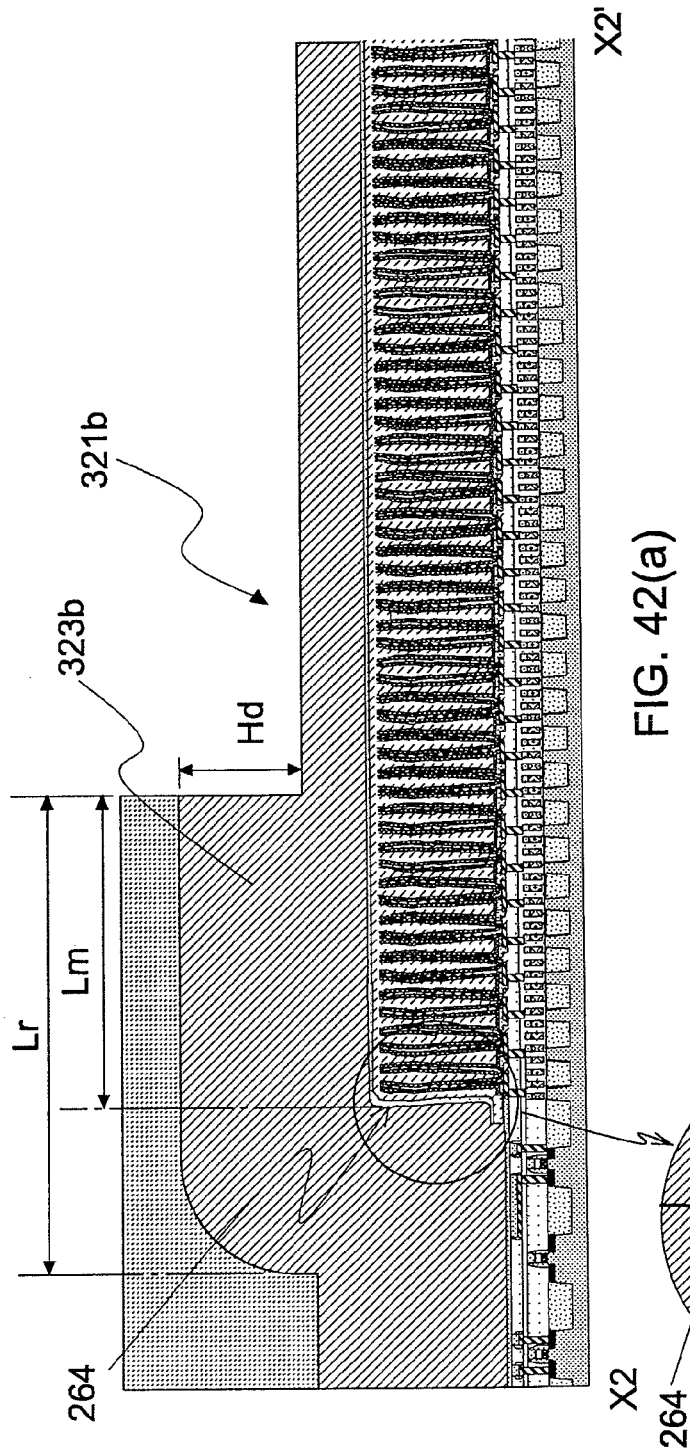
FIGS. 42(*a*) and 42(*b*) are views illustrating Modified Example 1, which corresponds to the tenth process of Example 1, in which FIG. 42(*a*) is a cross-sectional view taken along a line X1-X2' of FIG. 1(*c*), and FIG. 42(*b*) is a partial enlarged view thereof.
Figure 42B:
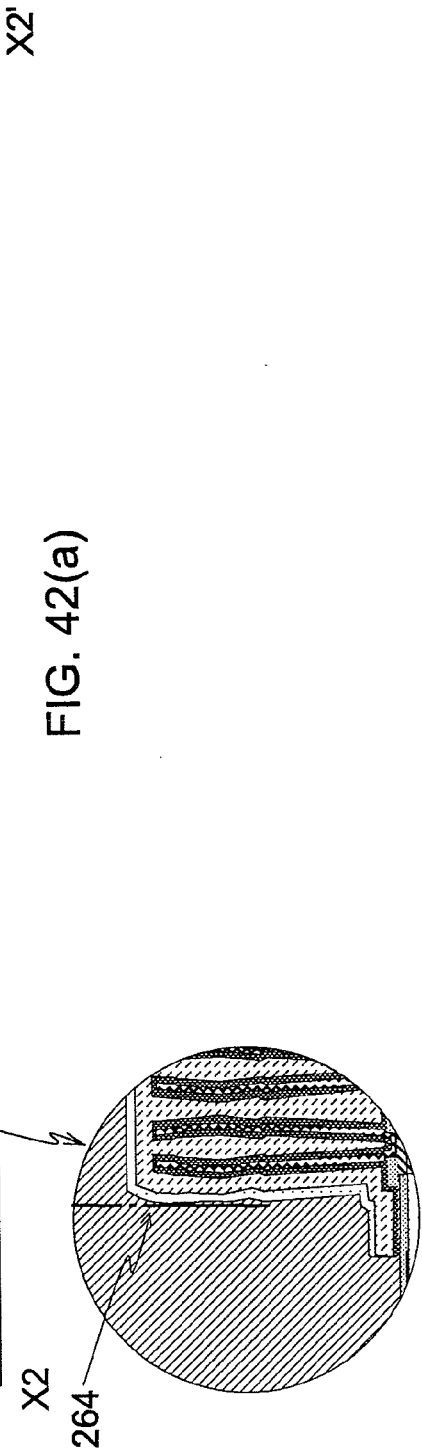

In the case where the capacitor support 221 is not formed, the forming of the capacitor support film 163 in the second process (FIG. 4) of Example 1 is omitted, and the patterning of the capacitor support 221 in the fifth process (FIG. 8) is not required. In this case, FIG. 42 is a view that corresponds to the tenth process of example 1 of the step height reduction etching process. FIG. 42(a) is a cross-sectional view taken along a line X1-X2' of FIG. 1(c), and FIG. 42(b) is a partial enlarged view thereof.

The capacitor array end 264 in Modified Example 1 is determined in a position of the capacitor lower electrode cap film 266 that is formed on the outer edge of the capacitor lower electrode 201, which is positioned at the outermost circumference of the capacitor lower electrodes 201 arranged in an array form.

Other manufacturing processed in Modified Example 1 can be performed using the same processes in Example 1.

MODIFIED EXAMPLE 2

In Example 1, the capacitor upper electrode cap film 266 is used. However, if there is no problem in the shoulder portion at the etching of the capacitor upper electrode conductive film 262, the capacitor upper electrode cap film 266 can be omitted. An example of a case where the capacitor upper electrode cap film 266 is not formed is shown as Modified Example 2.

Figure 43A:
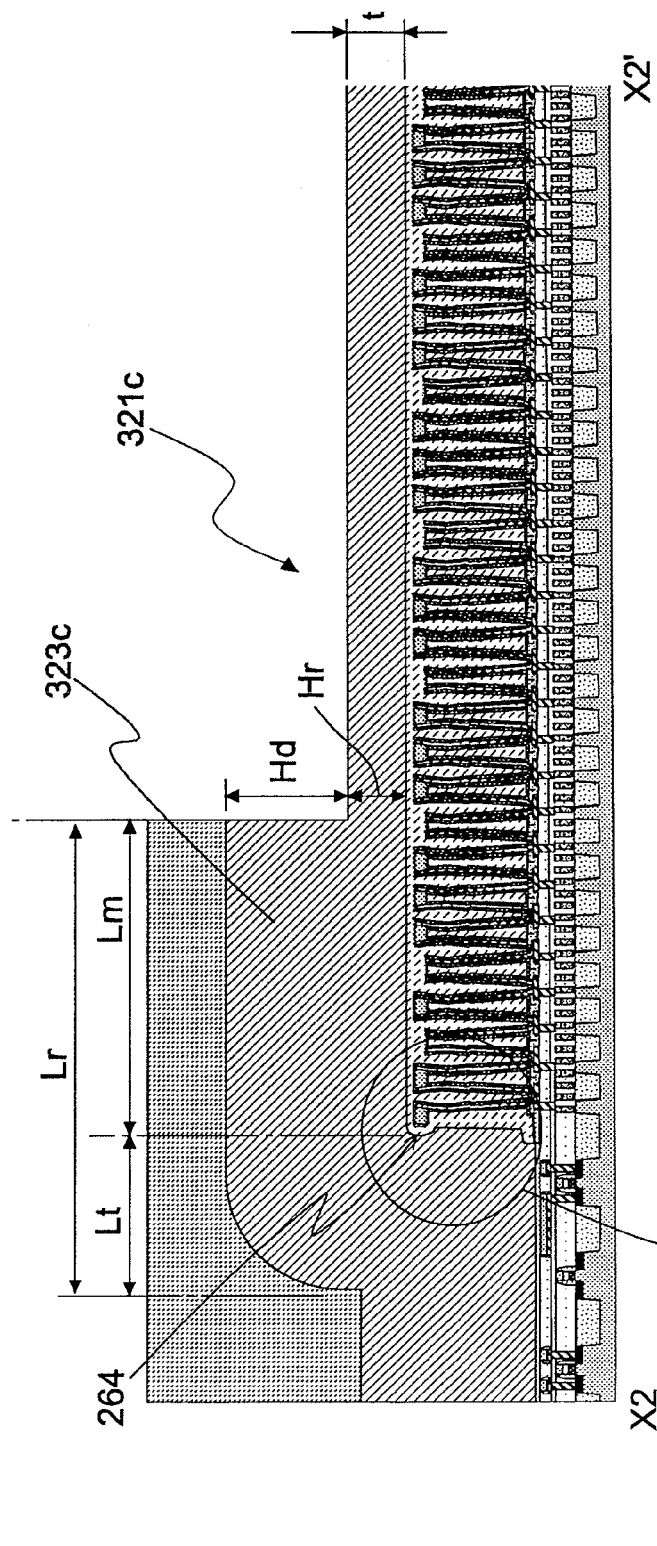
FIGS. 43(*a*) and 43(*b*) are views illustrating Modified Example 2, which corresponds to the tenth process of Example 1, in which FIG. 43(*a*) is a cross-sectional view taken along a line X1-X2' of FIG. 1(*c*), and FIG. 43(*b*) is a partial enlarged view thereof.
Figure 43B:
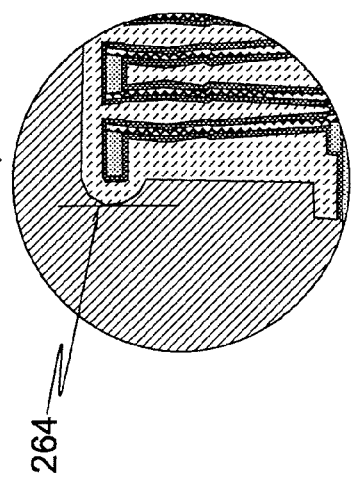

FIG. 43(a) is a cross-sectional view taken along a line X1-X2' of FIG. 1(c), and FIG. 43(b) is a partial enlarged view thereof. The capacitor array end 264 in Modified Example 2 is determined in a position of the outer edge of the capacitor upper electrode conductive film 262 that covers the capacitor support 221.

According to the manufacturing method in Modified Example 2, in the seventh process of Example 1, the capacitor upper electrode cap film 266 is omitted. Further, in the capacitor upper electrode patterning, the etching of the capacitor upper electrode cap film 266 is omitted, and the capacitor upper electrode conductive film 262 is etched using the resist mask.

Since the capacitor upper electrode cap film 266 is not formed, the thickness t of the insulating film formed on the capacitor upper electrode conductive film 262 becomes equal to the remaining film height $H_r$ of the capacitor interlayer 281. In the same manner, after the capacitor interlayer CMP of the twelfth process, the thickness t' of the insulating film formed on the capacitor upper electrode conductive film 262 becomes equal to the remaining film height $H_{r'}$ of the capacitor interlayer 281.

EXAMPLE 2

Another example of a method of forming a capacitor interlayer 281 is shown. In Example 2, the capacitor interlayer 281 is formed as a laminated structure of a first capacitor interlayer 541 and a second capacitor interlayer 542.

Figure 44:
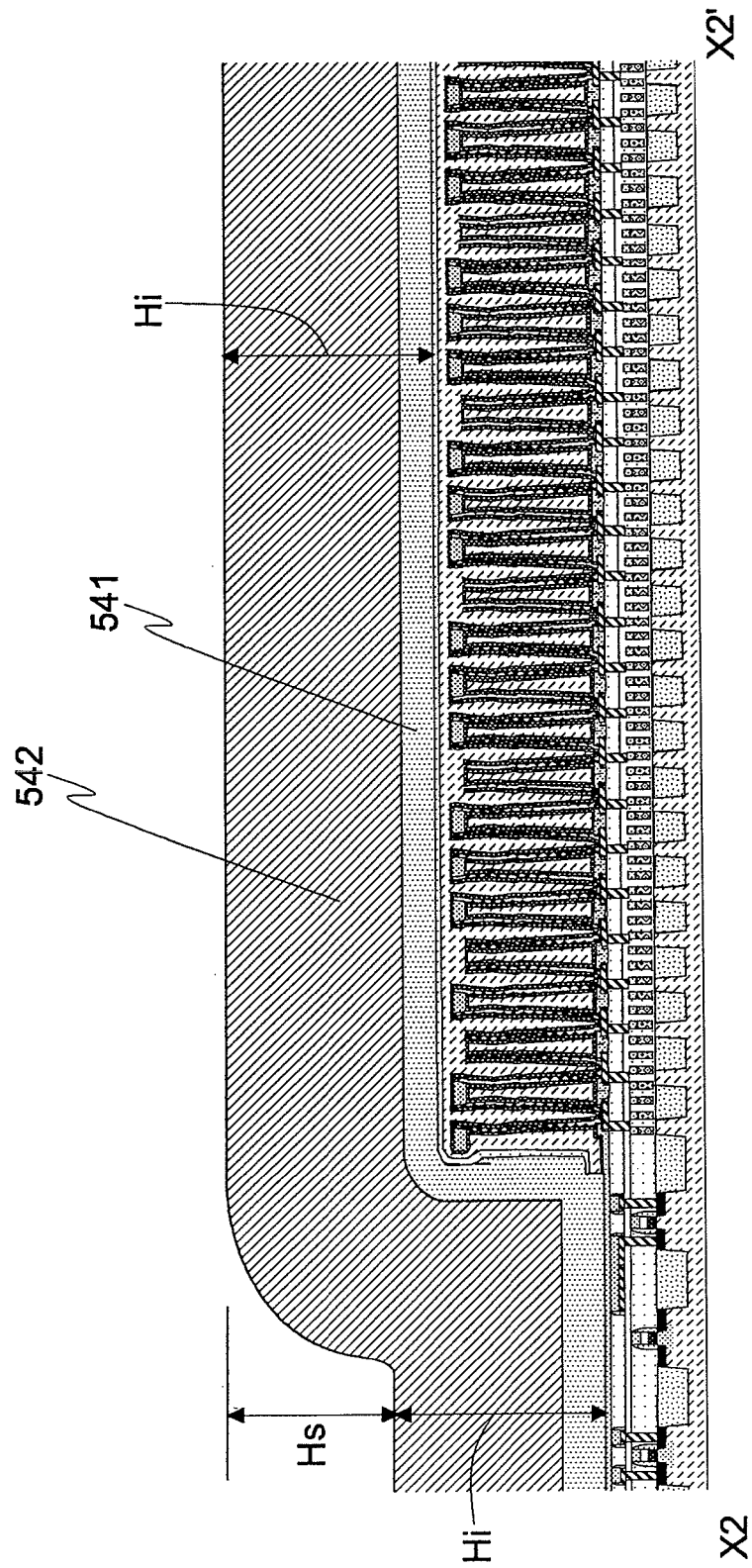
FIG. 44 is a cross-sectional view taken along a line X2-X2' of FIG. 1(*c*), illustrating Example 2 that corresponds to the eighth process of Example 1.
Figure 45:
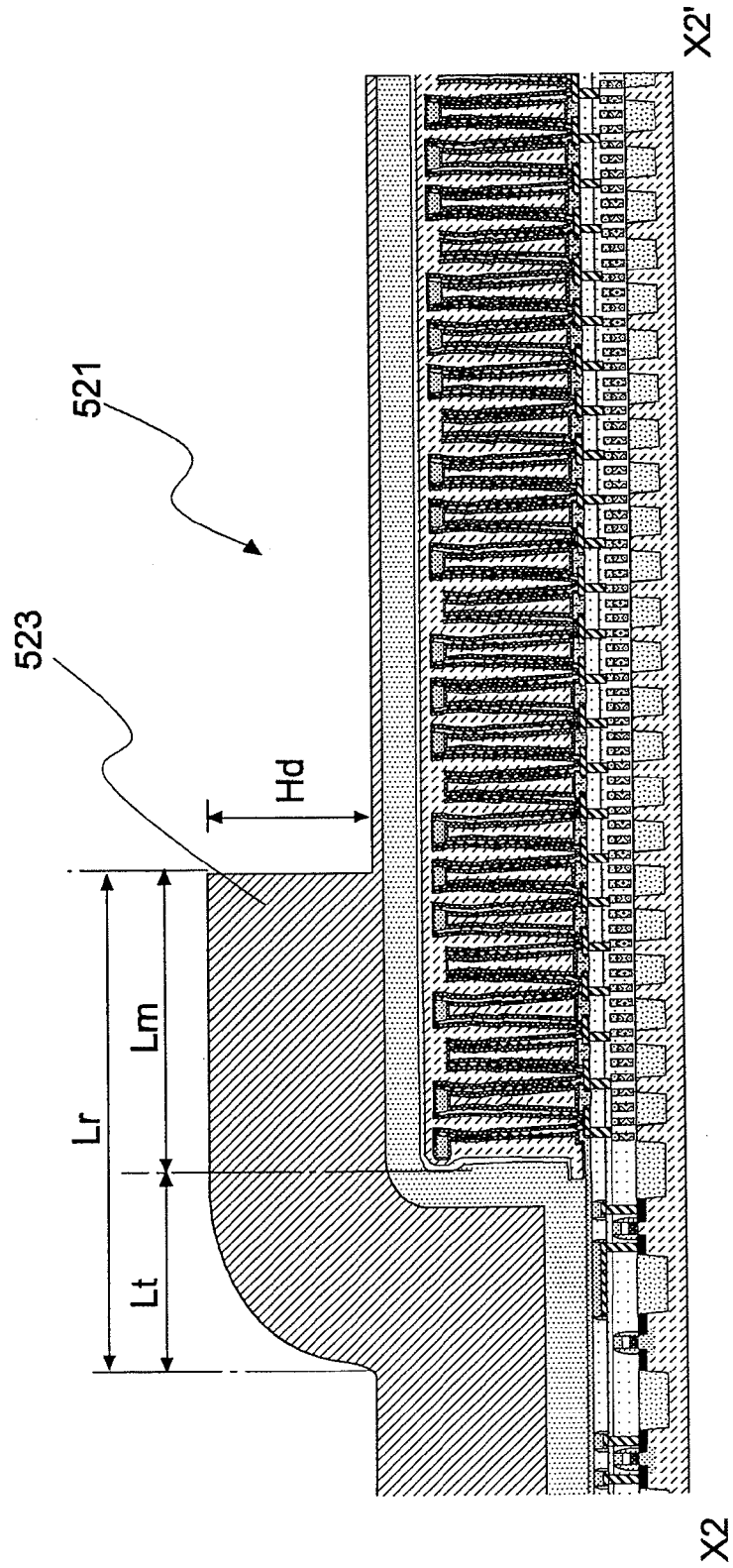
FIG. 45 is a cross-sectional view taken along a line X2-X2' of FIG. 1(*c*), illustrating Example 2 that corresponds to the tenth process of Example 1.
Figure 46:
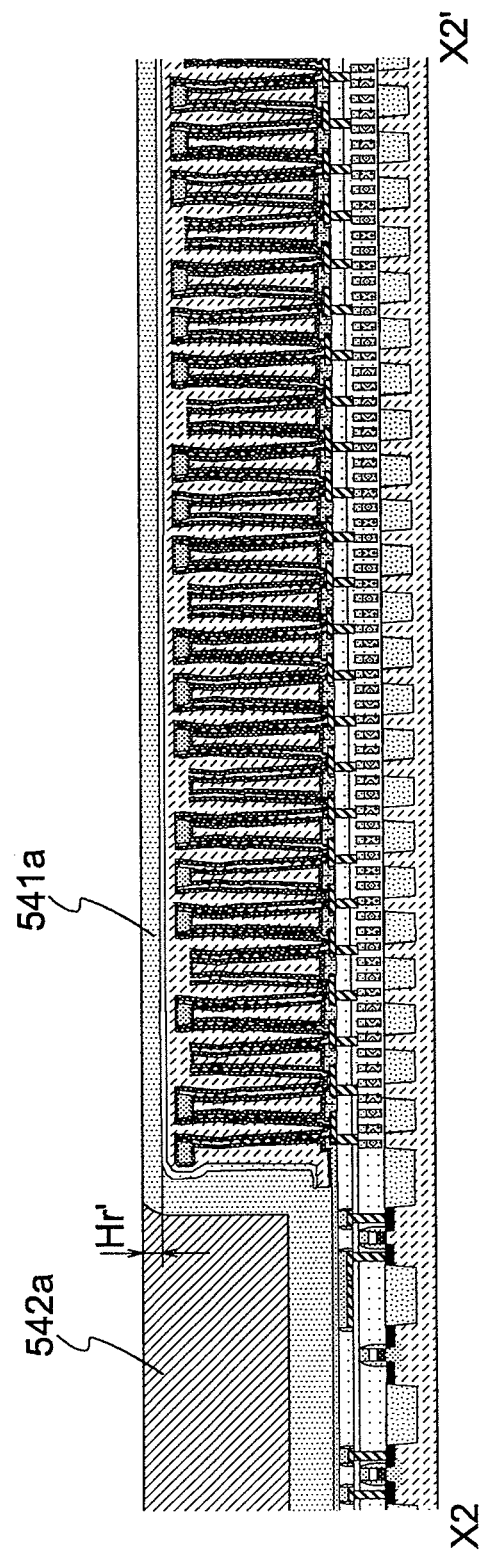
FIG. 46 is a cross-sectional view taken along a line X2-X2' of FIG. 1(*c*), illustrating Example 2 that corresponds to the twelfth process of Example 1.

FIGS. 44 to 46 are views explaining Example 2.

(FIG. 44)

In the eighth process of Example 1, the capacitor support 221 has a U-shape in cross-section, which projects from the upper portion of the capacitor array 265 in the horizontal direction. If the amount of projection of the capacitor support 221 is large, the coverage of the capacitor interlayer 281 in the portion below the capacitor support 221 is lowered in the case where the step height coverage of the capacitor interlayer 281 to be formed is not so good, and the upper portion of the capacitor interlayer 281 may be formed in an overhang shape that overhangs upper horizontally. If the overhang shape becomes larger, the width of the bottom portion of the capacitor interlayer protrusion portion 323 is narrowed, and the strength is weakened to cause the overhanging portion to easily peel off. If the amount of projection in the horizontal direction of the capacitor support 221 is large, in order to prevent the overhanging shape of the capacitor interlayer 281, it is preferable to use a film having good step height coverage as the capacitor interlayer. However, as a result of the inventors' study, the silicon oxide film that is formed by a plasma CVD method having high step height coverage has large film stress, and if the film having such large stress is formed, the wafer warpage increases to cause the exposure not to be performed by the following lithographic process.

To cope with this problem, the first capacitor interlayer 541 having an excellent step height coverage characteristic is formed with a thickness enough to embed the U-shaped portion in cross-section of the capacitor support 221 that projects in the horizontal direction, and then a second capacitor interlayer 542 that is a film having a small film stress, which is less than the first capacitor interlayer 541, is laminated. Accordingly, the capacitor interlayer which can cope with the overhang shape and release the stress can be formed.

(FIG. 45)

In the same manner as the tenth process of Example 1, the step height reduction etching is performed. Although it is exemplified that the etching does not reach the first capacitor interlayer 541, a part of the first capacitor interlayer 541 may be etched.

(FIG. 46)

In the same manner as the twelfth process of Example 1, the capacitor interlayer CMP process is performed. The capacitor interlayer CMP that performs the global flattening from the first capacitor interlayer 541 to the second capacitor interlayer 542 is performed on condition that the polishing speed for the first capacitor interlayer 541 and the polishing speed for the second capacitor interlayer 542 are substantially equal to each other. If there is a difference in polishing speed between two films, a step height occurs on the boundary between the first capacitor interlayer 541 and the second capacitor interlayer 542 after the CMP. Further, the CMP may be performed so that the CMP does not reach the first capacitor interlayer 541.

What is claimed is:

1. A method of manufacturing a semiconductor device comprising a capacitor region on which at least a capacitor is formed and a non-capacitor region on which no capacitor is formed, wherein the method comprises:
prescribing the capacitor region and the non-capacitor region by forming a capacitor at a first height on a semiconductor substrate of which the surface is substantially flat;
covering the non-capacitor region and the capacitor with an interlayer insulating film with a thickness that is greater than the height of the capacitor, the interlayer insulating film comprising first, second and third portions, the first portion being over the non-capacitor region and including a substantially even surface at a second height greater than the first height, a second portion being over the capacitor and including a substantially even surface at a third height greater than the second height, and the third portion intervening between the first and second portions and including a slant surface to interface the substantially even surface of the first portion with the substantially even surface of the second portion;
performing a selective etching on the second portion of the interlayer insulating film to leave first and second parts thereof, the first part being over a major part of the capacitor and including a substantially even surface at a fourth height greater than the first height and less than the third height, and the second part being over a remaining part of the capacitor to intervene between the first part and the third portion of the interlayer insulating film and including a substantially even surface at the third height and a side surface interfacing the substantially even surfaces of the first and second parts with each other; and
performing a chemical mechanical polishing to remove the third portion and the second part of the interlayer insulating film so that the interlayer insulating film is flattened to provide an insulating layer covering both the non-capacitor region and the capacitor in a substantially even height greater than the first height,
wherein the selective etching on the second portion of the interlayer insulating film is performed to make a difference $H_d$ between the third and fourth heights and a distance Lr of a sum of the third portion and the second part in a horizontal direction along the surface of the semiconductor substrate satisfy an aspect ratio ($H_d$/Lr) of the $H_d$ to the Lr being equal to or less than 0.6 so that the third portion and the second part are removed by the chemical mechanical polishing while preventing the third portion and the second part from peeling off from the interlayer insulating film.

2. The method of manufacturing a semiconductor device according to claim 1, wherein the aspect ratio ($H_d/Lr$) is equal to or less than 0.25.

3. The method of manufacturing a semiconductor device according to claim 1, wherein the fourth height is substantially the same as the second height.

4. The method of manufacturing a semiconductor device according to claim 1, wherein the Lr is equal to or more than four times the first height.

5. The method of manufacturing a semiconductor device according to claim 1, wherein the Lr is equal to or less than 10 μm.

6. The method of manufacturing a semiconductor device according to claim 1, wherein the chemical mechanical polishing method comprises pushing a surface of the semiconductor substrate against a polishing pad with a first pressure, and increasing the pressure to a second pressure that is higher than the first pressure.

7. The method of manufacturing a semiconductor device according to claim 6, wherein the first pressure is equal to or less than 2 psi.

8. The method of manufacturing a semiconductor device according to claim 1, wherein the chemical mechanical polishing method comprises making a surface of the semiconductor substrate and a polishing pad be in contact with each other with a first relative speed, and increasing the speed to a second relative speed that is higher than the first relative speed.

9. The method of manufacturing a semiconductor device according to claim 8, wherein the first relative speed is equal to or lower than 0.19 m/sec.

10. The method of manufacturing a semiconductor device according to claim 8, wherein acceleration when the speed is increased from the first relative speed to the second relative speed is equal to or lower than 0.19 m/sec².

11. The method of manufacturing a semiconductor device according to claim 10, wherein the making the surface of the semiconductor device and the polishing pad be in contact with each other with the first relative speed is performed with a rotating speed of the polishing pad of 10 rpm or less and with a rotating speed of the semiconductor substrate of 10 rpm or less.

12. The method of manufacturing a semiconductor device according to claim 11, wherein the increasing to the second relative speed is performed with rotating acceleration of 10 rpm/sec or less.

13. The method of manufacturing a semiconductor device according to claim 1, wherein the interlayer insulation film is a two-layer laminated film.

14. The method of manufacturing a semiconductor device according to claim 13, wherein in the laminated film, a step coverage of a lower-layer film is more superior to a step coverage of an upper-layer film.

15. The method of manufacturing a semiconductor device according to claim 1, wherein the capacitor comprises a capacitive dielectric film that covers inner and outer walls of a cup-shaped lower electrode and an upper electrode that covers the capacitive dielectric film, and an upper surface of the upper electrode forms a plate electrode that is substantially flat in the horizontal direction.

16. The method of manufacturing a semiconductor device according to claim 15, wherein the capacitor comprises a support film that supports the lower electrode near an upper end of the lower electrode, and the capacitive dielectric film and the upper electrode cover the support film.

17. The method of manufacturing a semiconductor device according to claim 16, wherein the upper electrode of the capacitor region has an outer edge that is substantially rectangular as seen from a plane, and an outer edge of the projected portion that is prescribed as the rising point of the interlayer insulating film has a substantially rectangular outer circumference that follows the outer edge of the upper electrode of the capacitor region.

* * * * *